US007310347B2

(12) United States Patent
Lasser

(10) Patent No.: US 7,310,347 B2
(45) Date of Patent: Dec. 18, 2007

(54) STATES ENCODING IN MULTI-BIT FLASH CELLS

(75) Inventor: Menahem Lasser, Kohav Yair (IL)

(73) Assignee: Sandisk, IL Ltd., Kfar Saba (IL)

( * ) Notice: Subject to any disclaimer, the term of this patent is extended or adjusted under 35 U.S.C. 154(b) by 505 days.

(21) Appl. No.: 11/035,807

(22) Filed: Jan. 18, 2005

(65) Prior Publication Data

US 2005/0201401 A1 Sep. 15, 2005

Related U.S. Application Data

(60) Provisional application No. 60/553,798, filed on Mar. 14, 2004.

(51) Int. Cl.
*H04L 12/28* (2006.01)

(52) U.S. Cl. .................................. 370/412; 365/185.24

(58) Field of Classification Search ..................... None
See application file for complete search history.

(56) References Cited

U.S. PATENT DOCUMENTS 5,404,485 A 4/1995 Ban
5,434,825 A 7/1995 Harari
6,046,935 A 4/2000 Takeuchi
6,522,580 B2 2/2003 Chen
6,643,188 B2 11/2003 Tanaka
2003/0021149 A1 1/2003 So et al.
2003/0021155 A1* 1/2003 Yachareni et al. ..... 365/185.22
2004/0022249 A1* 2/2004 Katayama et al. ....... 370/395.7
2004/0080979 A1* 4/2004 Park ...................... 365/185.03

* cited by examiner

*Primary Examiner*—Duc Ho
(74) *Attorney, Agent, or Firm*—Mark M. Friedman

(57) ABSTRACT

N data bits are stored in ⌈N/M⌉ cells by programming each cell with up to M of the bits according to a valid, nonserial bit ordering that satisfies one of the following criteria: Either the number of threshold voltage comparisons needed to read all M bits sequentially is at most 1 more than the smallest such number, or the largest number of threshold voltage comparisons needed to read any bit is minimized, or the smallest number of threshold voltage comparisons needed to read any bit is minimized, or the difference between the largest and smallest number of threshold voltage comparisons needed to read any bit statically is at most 1 more than the smallest such difference, or the difference between the largest and smallest number of threshold voltage comparisons needed to read any bit dynamically is minimized.

78 Claims, 6 Drawing Sheets

STATES ENCODING IN MULTI-BIT FLASH CELLS

This patent application claims the benefit of U.S. Provisional Patent Application No. 60/553,798, filed Mar. 14, 2004

FIELD AND BACKGROUND OF THE INVENTION

The present invention relates to flash memories and, more particularly, to a method of storing data in multi-bit flash cells.

Flash memory devices have been known for many years. Typically, each cell within a flash memory stores one bit of information. Traditionally, the way to store a bit has been by supporting two states of the cell—one state represents a logical "0" and the other state represents a logical "1". In a flash memory cell the two states are implemented by having a floating gate above the cell's channel (the area connecting the source and drain elements of the cell's transistor), and having two valid states for the amount of charge stored within this floating gate. Typically, one state is with zero charge in the floating gate and is the initial unwritten state of the cell after being erased (commonly defined to represent the "1" state) and another state is with some amount of negative charge in the floating gate (commonly defined to represent the "0" state). Having negative charge in the gate causes the threshold voltage of the cell's transistor (i.e. the voltage that has to be applied to the transistor's control gate in order to cause the transistor to conduct) to increase. Now it is possible to read the stored bit by checking the threshold voltage of the cell: if the threshold voltage is in the higher state then the bit value is "0" and if the threshold voltage is in the lower state then the bit value is "1". Actually there is no need to accurately read the cell's threshold voltage. All that is needed is to correctly identify in which of the two states the cell is currently located. For that purpose it is enough to make a comparison against a reference voltage value that is in the middle between the two states, and thus to determine if the cell's threshold voltage is below or above this reference value.

FIG. 1A shows graphically how this works. Specifically, FIG. 1A shows the distribution of the threshold voltages of a large population of cells. Because the cells in a flash device are not exactly identical in their characteristics and behavior (due, for example, to small variations in impurities concentrations or to defects in the silicon structure), applying the same programming operation to all the cells does not cause all of the cells to have exactly the same threshold voltage. (Note that, for historical reasons, writing data to a flash memory is commonly referred to as "programming" the flash memory.) Instead, the threshold voltage is distributed similar to the way shown in FIG. 1A. Cells storing a value of "1" typically have a negative threshold voltage, such that most of the cells have a threshold voltage close to the value shown by the left peak of FIG. 1A, with some smaller numbers of cells having lower or higher threshold voltages. Similarly, cells storing a value of "0" typically have a positive threshold voltage, such that most of the cells have a threshold voltage close to the value shown by the right peak of FIG. 1A, with some smaller numbers of cells having lower or higher threshold voltages.

In recent years a new kind of flash device has appeared on the market, using a technique conventionally called "Multi Level Cells" or MLC for short. (This nomenclature is misleading, because the previous type of flash cells also have more than one level: they have two levels, as described above. Therefore, the two kinds of flash cells are referred to herein as "Single Bit Cells" (SBC) and "Multi-Bit Cells" (MBC).) The improvement brought by the MBC flash is the storing of two or more bits in each cell. In order for a single cell to store two bits of information the cell must be able to be in one of four different states. As the cell's "state" is represented by its threshold voltage, it is clear that a 2-bit MBC cell should support four different valid ranges for its threshold voltage. FIG. 1B shows the threshold voltage distribution for a typical 2-bit MBC cell. As expected, FIG. 1B has four peaks, each corresponding to one state. As for the SBC case, each state is actually a range and not a single number. When reading the cell's contents, all that must be guaranteed is that the range that the cell's threshold voltage is in is correctly identified. For a prior art example of an MBC flash device see U.S. Pat. No. 5,434,825 to Harari.

Similarly, in order for a single cell to store three bits of information the cell must be able to be in one of eight different states. So a 3-bit MBC cell should support eight different valid ranges for its threshold voltage. FIG. 1C shows the threshold voltage distribution for a typical 3-bit MBC cell. As expected, FIG. 1C has eight peaks, each corresponding to one state. FIG. 1D shows the threshold voltage distribution for a 4-bit MBC cell, for which sixteen states, represented by sixteen threshold voltage ranges, are required.

When encoding two bits in an MBC cell via the four states, it is common to have the left-most state in FIG. 1B (typically having a negative threshold voltage) represent the case of both bits having a value of "1". (In the discussion below the following notation is used—the two bits of a cell are called the "lower bit" and the "upper bit". An explicit value of the bits is written in the form ["upper bit" "lower bit"], with the lower bit value on the right. So the case of the lower bit being "0" and the upper bit being "1" is written as "10". One must understand that the selection of this terminology and notation is arbitrary, and other names and encodings are possible). Using this notation, the left-most state represents the case of "11". The other three states are typically assigned by the following order from left to right: "10", "00", "01". One can see an example of an implementation of an MBC NAND flash device using this encoding in U.S. Pat. No. 6,522,580 to Chen, which patent is incorporated by reference for all purposes as if fully set forth herein. See in particular FIG. 8 of the Chen patent. U.S. Pat. No. 6,643,188 to Tanaka also shows a similar implementation of an MBC NAND flash device, but see FIG. 7 there for a different assignment of the states to bit encodings: "11", "10", "01", "00". The Chen encoding is the one illustrated in FIG. 1B.

We extend the above terminology and notation to the cases of more than two bits per cell, as follows. The left-most unwritten state represents "all ones" ("1 . . . 1"), the string "1 . . . 10" represents the case of only the lowest bit of the cell being written to "0", and the string "01 . . . 1" represents the case of only the most upper bit of the cell being written to "0".

When reading an MBC cell's content, the range that the cell's threshold voltage is in must be identified correctly; only in this case this cannot always be achieved by comparing to only one reference voltage. Instead, several comparisons may be necessary. For example, in the case illustrated in FIG. 1B, to read the lower bit, the cell's threshold voltage first is compared to a reference comparison voltage $V_1$ and then, depending on the outcome of the comparison, to either a zero reference comparison voltage or a reference comparison voltage $V_2$. Alternatively, the lower bit is read by unconditionally comparing the threshold voltage to both a zero reference voltage and a reference comparison voltage $V_2$, again requiring two comparisons. For more than two bits per cell, even more comparisons might be required.

The bits of a single MBC cell may all belong to the same flash page, or they may be assigned to different pages so that, for example in a 4-bit cell, the lowest bit is in page 0, the next bit is in page 1, the next bit in page 2, and the highest bit is in page 3. (A page is the smallest portion of data that can be separately written in a flash device). Both methods are in use. While the methods of the present invention are explained here in the context of the “each bit in its own page” approach, these methods also can be applied to the case of all bits residing in the same page.

As was shown above for the 2-bit MBC cell, there is more than one option in how to define the correspondence between the cell's threshold voltage states and the bit encodings they represent. Each such correspondence is equivalent to a specific ordering of the encoded bit patterns along the threshold voltage axis. We saw above that Chen and Tanaka, while disclosing very similar cell designs, used different assignments (and hence different orderings), both equally usable. The object of the current invention is to provide good orderings that are better than other orderings in some sense.

At first glance, one might think that every permutation of ordering all n-bit patterns should be considered for the n-bit MBC cell. The number of permutations of N elements is equal to N! (“N Factorial”). A cell with n bits has $2^n$ different bit patterns, and therefore has $2^n!$ permutations. So this would lead to the 2-bit cell having 4!=24 possible orderings, the 3-bit cell having 8!=40,320 possible orderings, and so on. However, there are restrictions put on the ordering because of the way the flash cells are programmed, and these restrictions reduce the number of orderings that can actually be used.

First, according to the conventions we defined above, the left-most state always corresponds to the “all ones” bit pattern. Second, assuming a design in which each bit resides in a different page, there are restrictions caused by the bits of a cell being written sequentially rather than all at once. One must remember that programming can only increase the threshold voltage of a cell, not reduce it. Reduction of the threshold voltage can only be done when erasing, but erasing can be applied only to large groups of cells (“blocks” in common terminology). Therefore, any ordering of the bit patterns that requires the threshold voltage to decrease when writing a bit to “0” cannot be used. Consider for example a 2-bit MBC cell. Suppose we selected the following order from left to right—“11”, “00”, “10”, “01”. Assume we first wrote the lower bit to “0”, so the cell was brought to the “10” state. Now we want to write the upper bit to “0”. This requires changing the threshold downward, from the state representing “10” to the state representing “00”, but as we noted above, this is impossible to do in typical flash devices. Therefore we should select our ordering of bit patterns in a way that for every legal sequence of bit programming operations, it will never be required to reduce the threshold voltage. An ordering that satisfies these two restrictions is called herein a “valid” ordering. Similarly, an assignment of bit patterns to cell's states that results in a valid ordering is called herein a “valid” assignment.

It is common, in MBC flash devices that assign a cell's bits to different pages, to have a lower bit in a lower-numbered page and to require the user to write the pages in sequential order so that a lower-numbered page is written before a higher-numbered page. We use this practice in the explanations here, but one must understand that the methods of the present invention are equally applicable to other practices of assigning bits to pages and of ordering the writing of pages.

FIG. 2 shows a graphical representation of the restrictions applicable to the ordering of bit patterns in a 2-bit MBC cell. Each bit pattern is shown by its binary representation within a circle, and by its decimal representation outside the circle. Both numerical representations are equivalent, but it is more convenient to use the binary representation for understanding the ordering restrictions, and to use the decimal representation for talking about a certain pattern. An arrow connecting two circles in FIG. 2 means that the state from which the arrow originates must precede the state to which the arrow points.

One can see in FIG. 2 that, as expected, “11” must be the first state. This is seen from the fact this state must precede all other states. Also, “10” must preceded “00”, as shown above. Because of the simplicity of the 2-bit case, it is easy to realize there are only three orderings that satisfy all restrictions:

a. 11, 10, 00, 01 (this is what Chen used)

b. 11, 10, 01, 00 (this is what Tanaka used)

c. 11, 01, 10, 00

FIG. 3 shows the corresponding graphical representation for the case of 3-bit MBC cells, and FIG. 4 shows the corresponding graphical representation for the case of 4-bit MBC cells. Both cases are much more complex than the 2-bit case and allow many more valid orderings.

Let us find out how many legal orderings we have in each case. Consider first the 2-bit case (FIG. 2). As “11” always comes first, we ignore it and consider the equivalent question of how many options we have to put the other three patterns in the right-most three states, while satisfying the restrictions shown in FIG. 2. As “10” and “00” have a strict mandatory order between them, we start by selecting two positions out of the three for putting those two pattern. We designate the number of combinations of n elements taken k at a time as C(n,k), which is equal to (n!)/((n−k)!)/(k!). In this case, k=2 and n=3, and the number of ways to put “10” and “00” in place is 3!/1!/2!=3. The last pattern (“01”) must now be put in the only position left, so we are left with three legal orderings, as we already saw above.

Now let us move to the less trivial 3-bit cell (FIG. 3). We notice that after writing the lowest bit of a 3-bit cell, the other 2 bits (still unwritten) represent the same problem of ordering as a 2-bit cell. This can be seen in FIG. 3 by noticing that the “branch” containing {6,4,0,2} has exactly the same structure as the whole of FIG. 2. But we already know this problem has exactly three different solutions. So let us start the construction of an ordering by selecting positions for the four members of the {6,4,0,2} branch out of the seven available positions (recall that the all-ones pattern always has its left-most reserved position). There are C(7,4) ways of doing this. Each such way has three valid internal orderings of the branch members, so in total we have C(7,4)×3 ways of assigning these four patterns. Now for each such selection, we choose two of the three still unassigned positions for representing the {5,1} branch members. This can be done in C(3,2)=3 ways. The last pattern (3) must go into the only position left. The total product is C(7,4)×3×3=315 valid orderings for a 3-bit MBC cell.

We can make the calculation similarly for a 4-bit MBC cell (FIG. 4). The positions for the eight members of the {14,12,10,6,8,4,2,0} branch can be selected in C(15,8)

ways, each one to be multiplied by the 315 possible internal orderings we found above for the 3-bit case. Then we multiply again by 315, which is the number of arrangements we have for putting the remaining seven states into the remaining seven positions. The end result is C(15,8)×315×315=638,512,875. The number of valid orderings of yet larger numbers of bits is enormous.

The Appendices list 3-bit and 4-bit orderings along with analyses of these orderings, as described below. Appendix A lists all 315 3-bit orderings. Appendices B, C, D and E are partial lists of the 4-bit orderings.

The large number of possible bit orderings for MBC cells of more than 2 bits brings up the question which is the best one to use. U.S. Pat. No. 6,046,935 to Takeuchi proposes one method of constructing a bit patterns ordering for MBC cells. FIGS. 86A to 86C of Takeuchi apply the method to 3-bit cells. FIGS. 88A to 88D of Takeuchi apply the method to 4-bit cells. FIGS. 90A to 90E of Takeuchi show how to apply the method to the general M-bit case. However, as will be explained below, the method proposed by Takeuchi results in an ordering that is not optimal.

There is thus a widely recognized need for, and it would be highly advantageous to have, an optimal method of ordering the bits in an MBC cell.

SUMMARY OF THE INVENTION

According to the present invention there is provided a method of storing N bits of data, including the steps of: (a) providing ⌈N/M⌉ cells; and (b) programming each cell with up to M of the bits according to a valid, nonserial bit ordering that satisfies a criterion selected from the group consisting of: (i) a number of threshold voltage comparisons for sequentially and statically reading the M bits exceeds a minimum number of threshold voltage comparisons by at most 1, (ii) a maximum number of threshold voltage comparisons for statically reading any one of the M bits is minimized, (iii) a minimum number of threshold voltage comparisons for statically reading any one of the M bits is minimized, (iv) a maximum number of threshold voltage comparisons for statically reading any one of the M bits exceeds a minimum number of threshold voltage comparisons for statically reading any one of the M bits by at most 1, (v) a number of threshold voltage comparisons for sequentially and dynamically reading the M bits exceeds a minimum number of threshold voltage comparisons by at most 1, (vi) a maximum number of threshold voltage comparisons for dynamically reading any one of the M bits is minimized, (vii) a minimum number of threshold voltage comparisons for dynamically reading any one of the M bits is minimized, and (viii) a maximum number of threshold voltage comparisons for dynamically reading any one of the M bits exceeds a minimum number of threshold voltage comparisons for dynamically reading any one of the M bits by at most 1; wherein M is at least 3.

According to the present invention there is provided a memory device including: (a) a memory that includes K cells; and (b) a controller operative to store N bits of data in the cells by programming each cell with up to M=⌈N/K⌉ of the bits according to a valid, nonserial bit ordering that satisfies a criterion selected from the group consisting of: (i) a number of threshold voltage comparisons for sequentially and statically reading the M bits exceeds a minimum number of threshold voltage comparisons by at most 1, (ii) a maximum number of threshold voltage comparisons for statically reading any one of the M bits is minimized, (iii) a minimum number of threshold voltage comparisons for statically reading any one of the M bits is minimized, (iv) a maximum number of threshold voltage comparisons for statically reading any one of the M bits exceeds a minimum number of threshold voltage comparisons for statically reading any one of the M bits by at most 1, (v) a number of threshold voltage comparisons for sequentially and dynamically reading the M bits exceeds a minimum number of threshold voltage comparisons by at most 1, (vi) a maximum number of threshold voltage comparisons for dynamically reading any one of the M bits is minimized, (vii) a minimum number of threshold voltage comparisons for dynamically reading any one of the M bits is minimized, and (viii) a maximum number of threshold voltage comparisons for dynamically reading any one of the M bits exceeds a minimum number of threshold voltage comparisons for dynamically reading any one of the M bits by at most 1; wherein M is at least 3.

According to the present invention there is provided a method of storing N bits of data, including the steps of: (a) providing ⌈N/M⌉ cells; and (b) programming each cell with up to M of the bits according to a valid, nonserial bit ordering that satisfies a criterion selected from the group consisting of: (i) a total number of transitions in the bit ordering is a minimum number of transitions, (ii) the total number of transitions in the bit ordering exceeds a minimum number of transitions by 1, (iii) a maximum number of transitions in the bit ordering is a minimum such maximum number of transitions, (iv) a minimum number of transitions in the bit ordering is a minimum such minimum number of transitions, (v) the bit ordering is such that all M bits have a common number of transitions, and (vi) the bit ordering is such that a number of transitions of any bit differs from a number of transitions of any other bit by at most 1; wherein M is at least 3.

According to the present invention there is provided a memory device including: (a) a memory that includes K cells; and (b) a controller operative to store N bits of data in the cells by programming each cell with up to M=⌈N/K⌉ of the bits according to a valid, nonserial bit ordering that satisfies a criterion selected from the group consisting of: (i) a total number of transitions in the bit ordering is a minimum number of transitions, (ii) the total number of transitions in the bit ordering exceeds a minimum number of transitions by 1, (iii) a maximum number of transitions in the bit ordering is a minimum such maximum number of transitions, (iv) a minimum number of transitions in the bit ordering is a minimum such minimum number of transitions, (v) the bit ordering is such that all M bits have a common number of transitions, and (vi) the bit ordering is such that a number of transitions of any bit differs from a number of transitions of any other bit by at most 1; wherein M is at least 3.

The method of the present invention is a method of storing N bits of data in K=⌈N/M⌉ cells. (The notation "⌈x⌉" means the smallest integer that is at least as large as the real number x. For example, ⌈3⌉=3 and ⌈3.5⌉=4.) Each cell is programmed with up to M of the data bits according to a valid, nonserial bit ordering that satisfies one of the following eight criteria:

A. The number of threshold voltage comparisons needed to read all M bits statically and sequentially is either the smallest such number or the smallest such number plus 1. In other words, the bit ordering is such that the number of threshold voltage comparisons need to read all M bits statically and sequentially is less than, equal to, or greater by 1 than the number of threshold voltage comparisons that would be needed to read all M bits statically and sequentially if some other valid bit ordering were used.

B. The largest number of threshold voltage comparisons needed to read any of the bits statically is minimized. In other words, the bit ordering is such that the largest number of threshold voltage comparisons needed to read any bit statically is less than or equal to the largest number of threshold voltage comparisons that would be needed to read any bit statically if some other valid bit ordering were used.

C. The smallest number of threshold voltage comparisons needed to read any of the bits statically is minimized. In other words, the bit ordering is such that the smallest number of threshold voltage comparisons needed to read any bit statically is less than or equal to the smallest number of threshold voltage comparisons that would be needed to read any bit statically if some other valid bit ordering were used.

D. The largest number of threshold voltage comparisons needed to read any of the bits statically either equals the smallest number of threshold voltage comparisons needed to read any of the bits statically or exceeds the smallest number of threshold voltage comparisons needed to read any of the bits statically by 1. In other words, the number of threshold voltage comparisons needed to read any bit statically differs from the number of threshold voltage comparisons needed to read any other bit statically by at most 1.

E. The number of threshold voltage comparisons needed to read all M bits dynamically and sequentially is either the smallest such number or the smallest such number plus 1. In other words, the bit ordering is such that the number of threshold voltage comparisons need to read all M bits dynamically and sequentially is less than, equal to, or greater by 1 than the number of threshold voltage comparisons that would be needed to read all M bits dynamically and sequentially if some other valid bit ordering were used.

F. The largest number of threshold voltage comparisons needed to read any of the bits dynamically is minimized. In other words, the bit ordering is such that the largest number of threshold voltage comparisons needed to read any bit dynamically is less than or equal to the largest number of threshold voltage comparisons that would be needed to read any bit dynamically if some other valid bit ordering were used.

G. The smallest number of threshold voltage comparisons needed to read any of the bits dynamically is minimized. In other words, the bit ordering is such that the smallest number of threshold voltage comparisons needed to read any bit dynamically is less than or equal to the smallest number of threshold voltage comparisons that would be needed to read any bit dynamically if some other valid bit ordering were used.

H. The largest number of threshold voltage comparisons needed to read any of the bits dynamically either equals the smallest number of threshold voltage comparisons needed to read any of the bits dynamically or exceeds the smallest number of threshold voltage comparisons needed to read any of the bits dynamically by 1. In other words, the number of threshold voltage comparisons needed to read any bit dynamically differs from the number of threshold voltage comparisons needed to read any other bit dynamically by at most 1.

There are two special cases of criterion A:

A1. The number of threshold voltage comparisons needed to read all M bits statically and sequentially is the smallest such number. In other words, the bit ordering is such that the number of threshold voltage comparisons needed to read all M bits statically and sequentially is less than or equal to the number of threshold voltage comparisons that would be needed to read all the bits statically and sequentially if some other valid bit ordering were used.

A2. The number of threshold voltage comparisons needed to read all M bits statically is the smallest such number plus 1. In other words, the bit ordering satisfies criterion A but not criterion A1.

Under criterion A1, the smallest such number is 7 for M=3 and 15 for M=4. For M=3, there are two such valid bit orderings, as listed in Appendix A. For M=4, there are 36 such valid bit orderings, as listed in Appendix B. Also as listed in Appendix A, there are 15 M=3 valid bit orderings that satisfy criterion A2 by requiring 8 threshold voltage comparisons to read the three bits statically and sequentially.

Under criterion B, the smallest such number is 3 for M=3 and 5 for M=4. For M=3, there are 10 such valid bit orderings, as listed in Appendix A. For M=4, there are many such valid bit orderings, 7 of which are listed in Appendix B.

Under criterion C, the smallest such number is 1 for both M=3 and M=4. For M=3, there are 98 such valid bit orderings, as listed in Appendix A. For M=4, there are such valid bit orderings, 36 of which are listed in Appendix B.

There are two special cases of criterion D:

D1. The largest number of threshold voltage comparisons needed to read any of the bits statically equals the smallest number of threshold voltage comparisons needed to read any of the bits statically. In other words, reading each bit statically requires the same number of threshold voltage comparisons.

D2. The largest number of threshold voltage comparisons needed to read any of the bits statically exceeds the smallest number of threshold voltage comparisons needed to read any of the bits statically by 1. In other words, the bit that needs the most threshold voltage comparisons to be read statically needs only one more threshold voltage comparison than the bit that needs the fewest threshold voltage comparisons to be read statically.

Under criterion D1, when M=3, there are 4 such valid bit orderings that require 3 threshold voltage comparisons per bit, as listed in Appendix A.

Under criterion D2, when M=3, there are 40 valid bit orderings whose bits need either 3 or 4 threshold voltage comparisons to be read statically, as listed in Appendix A. When M=4 there are many valid bit orderings whose bits need either 4 or 5 threshold voltage comparisons to be read statically. 14 of these valid bit orderings are listed in Appendix D.

There are two special cases of criterion E:

E1. The number of threshold voltage comparisons needed to read all M bits dynamically and sequentially is the smallest such number. In other words, the bit ordering is such that the number of threshold voltage comparisons needed to read all M bits dynamically and sequentially is less than or equal to the number of threshold voltage comparisons that would be needed to read all the bits dynamically and sequentially if some other valid bit ordering were used.

E2. The number of threshold voltage comparisons needed to read all M bits dynamically is the smallest such number plus 1. In other words, the bit ordering satisfies criterion E but not criterion E1.

Under criterion E1, the smallest such number is 5 for M=3 and 9 for M=4. For M=3, there is one such valid bit ordering, as listed in Appendix A. For M=4 there are many such valid bit orderings, 22 of which are listed in Appendix B. Also as listed in Appendix A, there are 64 M=3 valid bit orderings that satisfy criterion E2 by requiring 6 threshold voltage comparisons to read the three bits dynamically and sequentially.

Under criterion F, the smallest such number is 2 for M=3 and 3 for M=4. For M=3, there are 10 such valid bit orderings, as listed in Appendix A. For M=4, there are many such valid bit orderings, 34 of which are listed in Appendix B.

Under criterion G, the smallest such number is 1 for both M=3 and M=4. For M=3, there are 98 such valid bit orderings, as listed in Appendix A. For M=4, there are many such valid bit orderings, 36 of which are listed in Appendix B.

There are two special cases of criterion H:

H1. The largest number of threshold voltage comparisons needed to read any of the bits dynamically equals the smallest number of threshold voltage comparisons needed to read any of the bits dynamically. In other words, reading each bit dynamically requires the same number of threshold voltage comparisons.

H2. The largest number of threshold voltage comparisons needed to read any of the bits dynamically exceeds the smallest number of threshold voltage comparisons needed to read any of the bits dynamically by 1. In other words, the bit that needs the most threshold voltage comparisons to be read dynamically needs only one more threshold voltage comparison than the bit that needs the fewest threshold voltage comparisons to be read dynamically.

Under criterion H1, when M=3, there are 9 such valid bit orderings that require 2 threshold voltage comparisons per bit, as listed in Appendix A; and when M=4 there are 14 such valid bit orderings that require 3 threshold voltage comparisons per bit, as listed in Appendix E. Under criterion H2, when M=3, there are 209 valid bit orderings whose bits need either 2 or 3 threshold voltage comparisons to be read dynamically, as listed in Appendix A; and when M=4, there are many valid bit orderings whose bits need either 4 or 5 threshold voltage comparisons to be read dynamically, 9 of which valid bit orderings are listed in Appendix E.

From another point of view, the first four criteria are as follows:

A1. The total number of transitions in the bit ordering is as the minimum such number for the selected value of M. In other words, when going from the cell's lowest voltage state to the cell's highest voltage state, the number of transitions (from 1 to 0 or from 0 to 1) of M bits stored according to the bit ordering is less than or equal to the number of transitions of M bits stored according to any other valid bit ordering. When M=3, the minimum total number of transitions is 7. When M=4, the minimum total number of transitions is 15.

A2. The total number of transitions in the bit ordering exceeds the minimum such number, for the selected value of M, by 1. In other words, when going from the cell's lowest voltage state to the cell's highest voltage state, the number of transitions (from 1 to 0 or from 0 to 1) of M bits stored according to the bit ordering is less than, equal to or greater by 1 than the number of transitions of M bits stored according to any other valid bit ordering. When M=3, the total number of transitions under criterion A2 is 8. When M=4, the total number of transitions under criterion A2 is 16.

B. The maximum number of transitions in the bit ordering is the minimum such maximum number of transitions. In other words, when going from the cell's lowest voltage state to the cell's highest voltage state, the largest number of transitions (from 1 to 0 or from 0 to 1) of any bit stored according to the bit ordering is less than or equal to the largest such number of transitions of any bit stored according to any other valid bit ordering. When M=3, that maximum number of transitions is 3. When M=4, that maximum number of transitions is 5.

C. The minimum number of transitions in the bit ordering is the minimum such minimum number of transitions. In other words, when going from the cell's lowest voltage state to the cell's highest voltage state, the smallest number of transitions (from 1 to 0 or from 0 to 1) of any bit stored according to the bit ordering is less than or equal to the smallest such number of transitions of any bit stored according to any other valid bit ordering. When M=3 or M=4 that minimum number of transitions is 1. Applicant speculates that the minimum number of transitions is 1 for any value of M.

D1. The bit ordering is such that all M bits have a common number of transitions. In other words, all the bits have the same number of transitions (from 1 to 0 or from 0 to 1) when going from the cell's lowest voltage state to the cell's highest voltage state. When M=3, this common number of transitions is 3.

D2. The bit ordering is such that the number of transitions of any bit differs from the number of transitions of any other bit by at most 1. In other words, when going from the cell's lowest voltage state to the cell's highest voltage state, no bit has more than one more transition (from 1 to 0 or from 0 to 1) than any other bit. When M=3, the bits of these bit orderings have either 4 transitions or 3 transitions. When M=4, the bits of these bit orderings have either 5 transitions or 4 transitions.

A memory device of the present invention includes K memory cells and a controller that stores N bits of data in the cells by programming each cell with up to $M=\lceil N/K \rceil$ of the bits according to a valid, nonserial bit ordering that satisfies one of the eight criteria A-H.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a method of programming multi-bit flash cells.

The principles and operation of a multi-bit-cell flash memory device according to the present invention may be better understood with reference to the drawings and the accompanying description.

We now consider the question of what is a good ordering of the bit patterns in an n-bit MBC cell. There is no one clear-cut criterion to use for deciding what is "best". Instead we present several different criteria to choose from. The best criterion to use in an actual design depends upon the requirements of the overall storage system, as is made clear in the discussion below.

We base our evaluation of orderings on the number of comparison operations required for reading the bits contained in an MBC cell. As already explained above, an SBC cell requires just one comparison of its threshold voltage value against a reference in order to determine the cell's data contents. A 2-bit MBC cell may require two comparisons. Cells with more bits generally require more than two comparisons.

We distinguish between two methods of using comparisons in the reading process: static reading and dynamic reading.

Figure 1A:
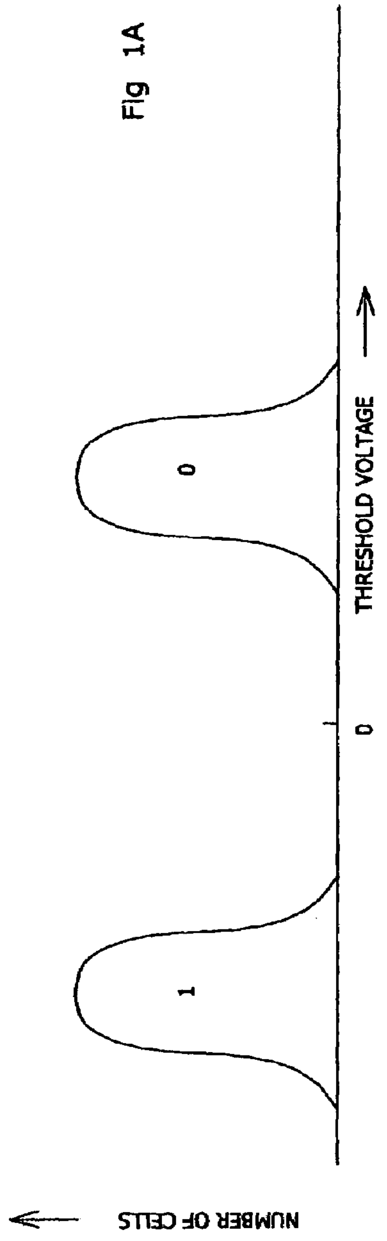
FIGS. 1A-1D show threshold voltage distributions in a one-bit flash cell, a two-bit flash cell, a three-bit flash cell and a four-bit flash cell.
Figure 1B:
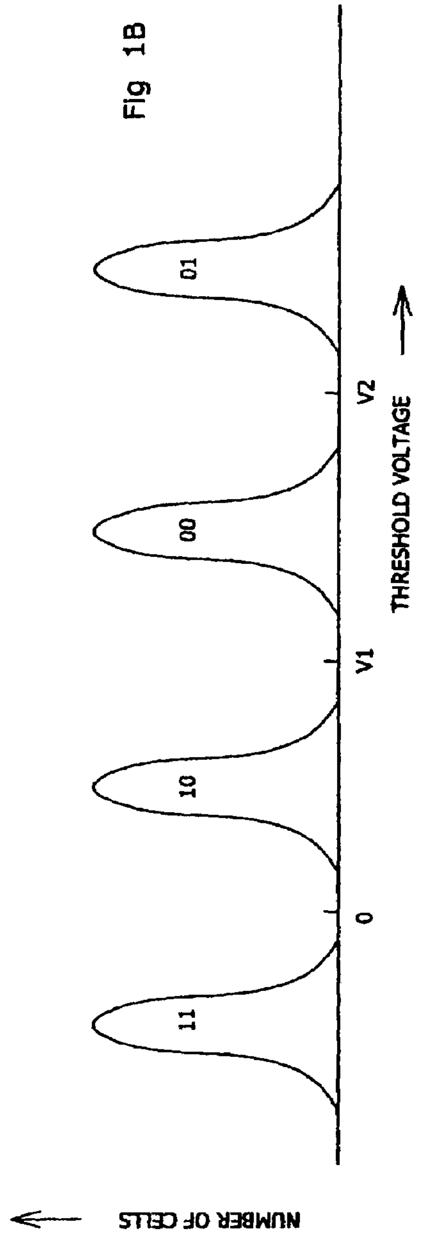

In sStatic reading, all reference voltage values used during the reading process are fully determined prior to starting the reading. Such reading can be implemented either by using one comparator that does all comparisons one by one by changing the reference voltage value to which it compares a cell's threshold voltage, or by using a number of comparators equal to the number of comparisons (in which case all comparators may operate in parallel). It is also possible to use an intermediate scheme in which the number of comparators is less than the number of comparisons but greater than one, thereby providing be some parallelism in the process. All such implementations are considered static methods for the purpose of this invention, as long as all reference values are fully determined prior to reading. For example, reading the lower bit of the 2-bit MBC cell whose encoding is as shown in FIG. 1B by always comparing to both 0 and $V_2$ is a static reading method that uses two comparisons.

In dynamic reading, at least one reference voltage value used during the reading process is determined based on the result of a previous comparison done during the same reading operation. For example, reading the lower bit of the 2-bit MBC cell whose encoding is as shown in FIG. 1B by first comparing to $V_1$, and then depending on the outcome of that comparison, comparing to either 0 or $V_2$, is a dynamic reading method that uses two comparisons.

The number of comparisons required for reading a single bit using static reading depends on the way the value of the bit changes when moving from state to state along the threshold voltage axis. As a first example let us consider the 2-bit MBC case with the ordering of {3,2,0,1}. In binary notation, that ordering is {11,10,00,01}. (Note that in the appended claims, decimal notation is used for bit orderings.) Now we separate the bits, each into its own sequence. When we move along the states from left to right the lower bit passes through the values { 1,0,0,1} while the upper bits passes through {1,1,0,0}. It is easy to see that we can determine the value of the upper bit by just a single comparison, with the reference value positioned to separate between the two left states and the two right states. The lower bit, however, cannot be determined by any single comparison; the best we can do is to use two comparisons (one separating the left-most state from all other states, and one separating the right-most state from all other states).

If, however, the ordering of states is {3,2,1,0}={11,10,01,00}, then the lower bit sequence is now { 1,0,1,0} and the upper bit sequence is again { 1,1,0,0}. So using this ordering the lower bit requires three comparisons and the upper bit requires one comparison.

The third and last valid 2-bit ordering is {3,1,2,0}={11,01,10,00}, giving {1,1,0,0} for the lower bit and {1,0,1,0} for the upper bit. This translates to one comparison for the lower bit and three comparisons for the upper bit.

It is easy to realize that the number of comparisons required for reading a single bit using static reading is equal to the number of transitions the bit incurs when traversing all states along the threshold voltage axis from left to right. {1,1,0,0} has just one transition and requires one comparison, while {1,0,1,0} has three transitions and requires three comparisons.

The same rules also apply to reading a cell with more than two bits. For example, a 3-bit cell with the ordering {7,6,2,4,0,5,3,1}={111,110,010,100,000,101,011,001} produces the sequence { 1,0,0,0,0,1,1,1} for the lower bit, {1,1,1,0,0,0,1,0} for the middle bit, and {1,1,0,1,0,1,0,0} for the upper bit. The numbers of transitions (and therefore the number of comparisons) are 2 for the lower bit, 3 for the middle bit and 5 for the upper bit.

The number of comparisons required for reading a single bit using dynamic reading also depends on the number of transitions the bit incurs when traversing all states along the threshold voltage axis from left to right, but in a different way than for static reading. For dynamic reading, the number of comparisons is the logarithm to base two of the number of transitions plus one, rounded up. For example, for a 2-bit MBC cell with the ordering of {3,2,0,1}={11,10,00,01} and bit sequences of { 1,0,0,1} (two transitions) and { 1,1,0,0} (one transition), the numbers of comparisons are two and one, respectively. Note that the ordering of {3,2,1,0}={11,10,01,00} with the bit sequences of {1,0,1,0} (three transitions) and {1,1,0,0} (one transition) also results in two and one comparisons, respectively, even though its number of transitions is different.

Again, the same rules also apply for cells with more than two bits each. For example, reading a 3-bit cell with the ordering {7,6,2,4,0,5,3,1}={111,110,010,100,000,101,011,001} that produces the bit sequences { 1,0,0,0,0,1,1,1} (two transitions), {1,1,1,0,0,0,1,0} (three transitions), and {1,1,0,1,0,1,0,0} (five transitions), requires two, two and three comparisons, respectively.

Appendix A lists all the valid orderings for the 3-bit case. Each of the 315 orderings has one line in the table, showing the sequences for each of the three bits, the number of static reading comparisons for each bit (the three columns under the heading "static comp"), and the number of dynamic reading comparisons for each bit (the three columns under the heading "dynamic comp"). Also shown are the total, minimum and maximum numbers for each of the two reading methods, statistics that are referenced in the discussion below.

We now investigate several criteria for selecting the ordering of bit patterns in an MBC cell. These criteria all relate to the number of comparisons required for reading. Generally speaking, the fewer comparisons to be done the better. A higher number of comparisons implies either a longer time for completing the operation (if using a single comparator) or a larger number of comparators (or both).

Criterion A. Minimize the Number of Comparisons for Sequentially Reading All the Bits in a Cell (That is, Reading the Bits One by One and Not in One Operation), Using Static Reading In a cell that uses static reading with a single comparator, the time required for sequentially reading all the bits of a cell increases as the sum of the number of comparisons of all bits. Therefore a good criterion for selecting an ordering is to minimize the sum of comparisons of all bits.

Looking at the results above, we see that for the 2-bit case we get a total of three comparisons for {3,2,0,1} and four comparisons for the other two alternatives. Therefore {3,2,0,1} provides the fastest sequential reading of all bits of a cell, and is thus optimal according to this criterion.

Figure 1C:
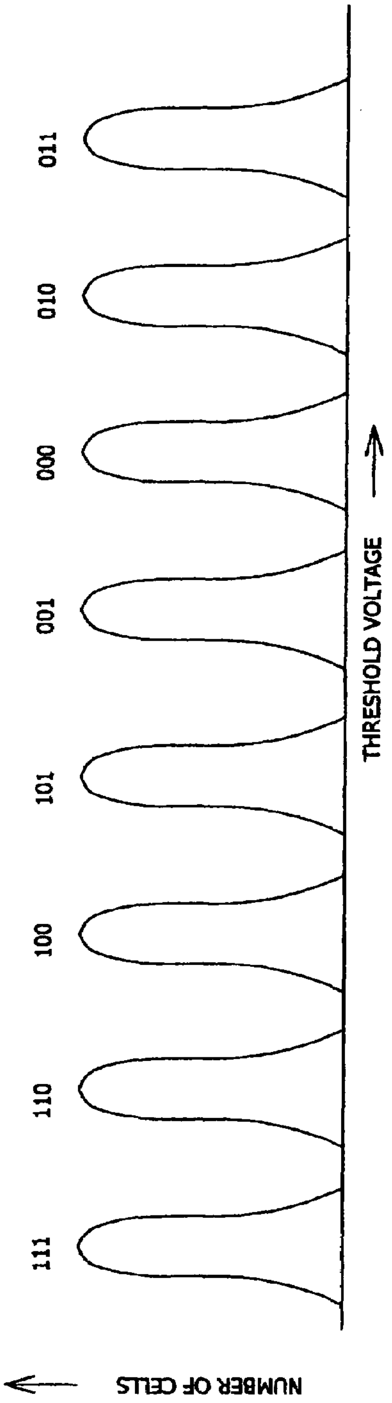

For the 3-bit case, we see in Appendix A that there are two optimal orderings with a total of seven comparisons ({7,6,4,5,1,0,2,3} and {7,6,4,5,1,3,2,0}). The encoding illustrated in FIG. 1C corresponds to the {7,6,4,5,1,0,2,3} ordering. There also are 15 orderings that have a total of eight comparisons, which is close to optimal.

Figure 1D:
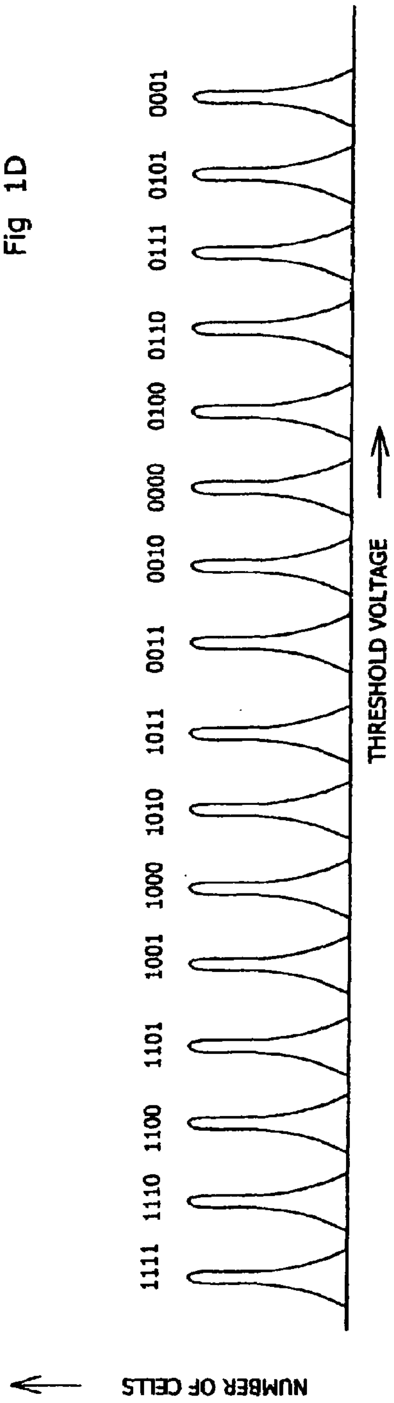

For the 4-bit case, the 36 orderings listed in Appendix B are optimal according to this criterion. Each such ordering has a total of 15 comparisons. The encoding illustrated in FIG. 1D corresponds to the first of these orderings, {15,14,12,13,9,8,10,11,3,2,0,4,6,7,5,1}.

Criterion B. Minimize the Maximum Number of Comparisons for Reading a Single Bit of a Cell, Using Static Reading In a cell that uses static reading with a single comparator, the maximum time required for reading any bit of a cell increases with the maximum number of comparisons of any bit. Therefore a good criterion for selecting an ordering is to minimize the maximum number of comparisons for any bit.

For the 2-bit case this maximum number is two for {3,2,0,1} and three for the other two alternatives. Therefore {3,2,0,1} is optimal according to this criterion too.

For the 3-bit case, Appendix A lists ten optimal orderings under this criterion, with a maximum number of comparisons of three: {7,6,2,4,5,1,3,0}, {7,6,2,4,5,3,1,0}, {7,6,4,2,3,5,1,0}, {7,6,4,0,2,3,5,1}, {7,6,4,0,5,1,3,2}, {7,6,4,5,1,3,2,0}, {7,6,5,1,3,2,4,0}, {7,5,6,2,3,1,4,0}, {7,3,6,4,5,1,2,0} and {7,3,6,4,5,1,0,2}.

A complete enumeration of all valid 4-bit orderings shows that the minimum for this criterion is five comparisons. Some of these orderings are listed in Appendix B.

Criterion C. Minimize the Minimum Number of Comparisons for Reading a Single Bit of a Cell, Using Static Reading In a cell that uses static reading with a single comparator, the minimum time required for reading any bit of a cell increases with the minimum number of comparisons of any bit. Therefore a good criterion for selecting an ordering is to minimize the minimum number of comparisons for any bit.

For the 2-bit case this minimum number is one, and is the same for all three valid orderings. For the 3-bit case Appendix A shows that the best minimum number is again one, but there are many orderings that result in a higher minimum number, meaning a slower reading operation.

A complete enumeration of all valid 4-bit orderings shows that the minimum for this criterion for the 4-bit case also is one comparison. Some of these orderings are listed in Appendix B.

The method of Takeuchi mentioned above results in an ordering that gives the upper bit only one comparison (note that Takeuchi uses a terminology that is the opposite of the one we use: he calls the first bit that is written into the cell "the upper bit" and not "the lower bit". We continue to use our terminology when discussing Takeuchi method). This implies that the Takeuchi method may be considered optimal in this sense. However, the Takeuchi method is based on assigning the states in a very simple and straight-forward manner—writing the first bit brings the threshold to one of the two left-most states, writing the second bit brings the threshold to one of the four left-most states, writing the third bit brings the threshold to one of the eight left-most states, and writing the M-th bit brings the threshold to one of the $2^M$ left-most bits. The way this is done (see FIGS. 90A to 90E in Takeuchi) always results in the trivial serial ordering in which we start with the highest value for the left-most state and go down by one on each move to the right. For example, the Takeuchi ordering for the 3-bit case is {7,6,5,4,3,2,1,0}, and the Takeuchi ordering for the 4-bit case is {15,14,13,12,11,10,9,8,7,6,5,4,3,2,1,0}.

Such an ordering requires one comparison for the last bit to be written into the cell, three comparisons for the next-to-last bit, seven comparisons for the third bit from the end, and $2^M-1$ comparisons for the M-th bit from the end. While it is true the Takeuchi ordering provides one bit with only one comparison, the first bit to be written into the cell has the highest number of comparisons possible (seven for the 3-bit case, 15 for the 4-bit case). This creates a large difference in the reading time of different bits of the cell and is not desirable, and therefore such ordering is not considered optimal in spite of having one bit with the minimal number of comparisons.

We use herein the term "serial assignment" for referring to an assignment that results in an ordering such as Takeuchi, having the form $\{2^M-1, 2^M-2, \ldots, 4,3,2,1,0\}$. The corresponding bit ordering is called herein a "serial" bit ordering. All other orderings are called "nonserial" herein.

Criterion D. Achieve Equal Number of Comparisons for Reading a Single Bit of a Cell (Regardless Which Bit is Read), Using Static Reading In a cell that uses static reading with a single comparator, it might be beneficial to have all bits being read using the same number of comparisons, so as to provide the same response time regardless of which bit is being read. Therefore a good criterion for selecting an ordering is to achieve the same number of comparisons for all bits.

For the 2-bit case no ordering satisfies this criterion. For the 3-bit case Appendix A shows that there are four orderings in which all bits require three comparisons: {7,6,2,4,5,1,3,0}, {7,6,2,4,5,3,1,0}, {7,6,4,2,3,5,1,0} and {7,6,5,1,3,2,4,0}.

Obviously, there can be no 4-bit ordering with a total of 15 comparisons in which all bits have the same number of comparisons, because 15 is not divisible by 4. Appendix C lists all 4-bit valid orderings with a total of 16 comparisons in which the difference between the lowest and highest bit is not more than two comparisons, and we see that even in this case there is no valid ordering which satisfies this optimization criterion. The best that can be achieved is a difference of two comparisons between the bit with the lowest number of comparisons and the bit with the highest number of comparisons. Actually, if there is a strong desire to get as close as possible to an equal spread of comparisons over all bits, one would do better to choose a 17-comparison 4-bit ordering. Appendix D lists all valid orderings with a total of 17 comparisons in which the difference between the lowest and highest bit is not more than one comparison, and one can see that there are really orderings in which the difference between lowest and highest is only one comparison, resulting in more constant reading response time than can be achieved with either a 15-comparison ordering or a 16-comparison ordering.

Criterion E. Minimize the Number of Comparisons for Sequentially Reading All Bits in a Cell, Using Dynamic Reading This is the equivalent of criterion A, but for dynamic reading.

For the 2-bit case, all valid orderings result in the same number of comparisons and therefore there is no one optimal ordering.

For the 3-bit case, Appendix A shows that there is one optimal ordering ({7,6,4,5,1,3,2,0}), with a total of five comparisons. There also are many orderings with a total of six comparisons.

A complete enumeration of all valid 4-bit orderings shows that the minimum for this criterion for the 4-bit case is nine comparisons. Some of these orderings are listed in Appendix B.

Criterion F. Minimize the Maximum Number of Comparisons for Reading a Single Bit of a Cell, Using Dynamic Reading This is the equivalent of criterion B, but for dynamic reading.

For the 2-bit case, all valid orderings result in the same number of comparisons (two) and therefore there is no one optimal ordering.

For the 3-bit case, Appendix A shows that there are ten optimal orderings with a maximum number of comparisons of two: {7,6,2,4,5,1,3,0}, {7,6,2,4,5,3,1,0}, {7,6,4,2,3,5,1, 0}, {7,6,4,0,2,3,5,1}, {7,6,4,0,5,1,3,2}, {7,6,4,5,1,3,2,0}, {7,6,5,1,3,2,4,0}, {7,5,6,2,3,1,4,0}, {7,3,6,4,5,1,2,0} and {7,3,6,4,5,1,0,2}.

A complete enumeration of all valid 4-bit orderings shows that the minimum for this criterion for the 4-bit case is three comparisons. Some of these orderings are listed in Appendix B.

Criterion G. Minimize the Minimum Number of Comparisons for Reading a Single Bit of a Cell, Using Dynamic Reading This is the equivalent of criterion C, but for dynamic reading.

For the 2-bit case, all valid orderings result in the same minimum number of comparisons (one) and therefore there is no one optimal ordering.

For the 3-bit case, Appendix A shows that the best minimum number is again one, but there are many orderings that result in a higher minimum number, meaning a slower reading operation.

A complete enumeration of all valid 4-bit orderings shows that the minimum for this criterion for the 4-bit case is one comparison. Some of these orderings are listed in Appendix B.

Criterion H. Achieve Equal Number of Comparisons for Reading a Single Bit of a Cell (Regardless Which Bit is Read), Using Dynamic Reading This is the equivalent of criterion D, but for dynamic reading.

For the 2-bit case no ordering satisfies this criterion. For the 3-bit case, Appendix A shows that there are nine orderings in which all bits require two comparisons: {7,6,2,4,5, 1,3,0}, {7,6,2,4,5,3,1,0}, {7,6,4,2,3,5,1,0}, {7,6,4,0,2,3,5, 1}, {7,6,4,0,5,1,3,2}, {7,6,5,1,3,2,4,0}, {7,5,6,2,3,1,4,0}, {7,3,6,4,5,1,2,0} and {7,3,6,4,5,1,0,2}.

Appendix E lists some valid 4-bit orderings for which the difference between the largest number of comparisons and the smallest number of comparisons is 1.

One point of clarification should be added to the definition of the concept of valid allocations and valid orderings. It is assumed above that any intermediate step resulting from programming only some of the bits of a cell (but not all) is identical to the state that would be created if the still not written bits will be written as “1”. In other words, programming the last bits of a cell to “1” is actually “doing nothing” but keeping the cell’s state unchanged. This is really a convenient way to implement the cell, and this is how typical MBC cells are currently built. However, it is possible to design an MBC cell a bit differently. If we assume the cell is always programmed with the full number of bits it can store, we can rely on the last programming operations to shift the state (the threshold voltage) even if a “1” is to be programmed. This means, for example, that a 4-bit MBC that was programmed with three “0” bits and is waiting to be programmed with the fourth bit will have a different state than the same cell after being programmed with “0001”. In such a design either we do not allow not programming all bits, or we devise a different reading scheme for reading cells that were not “filled” with all bits.

Figure 2:
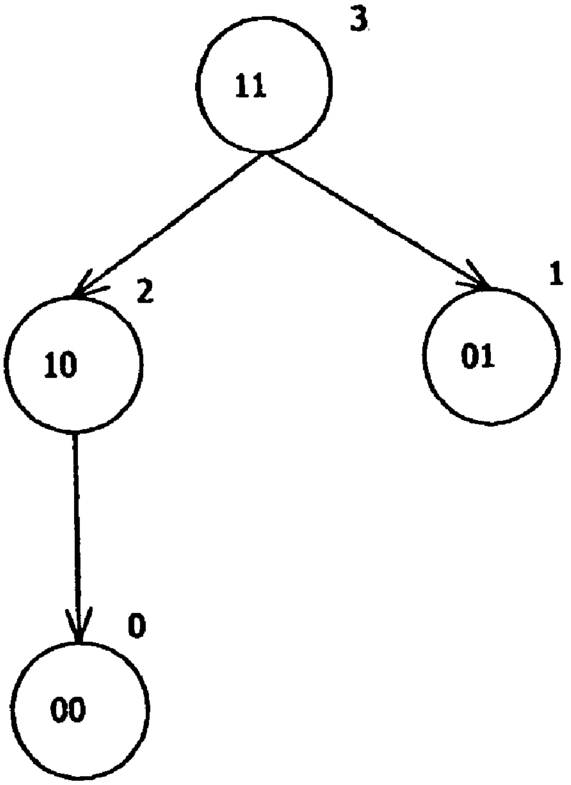
FIG. 2 is a precedence tree for programming a two-bit cell.
Figure 3:
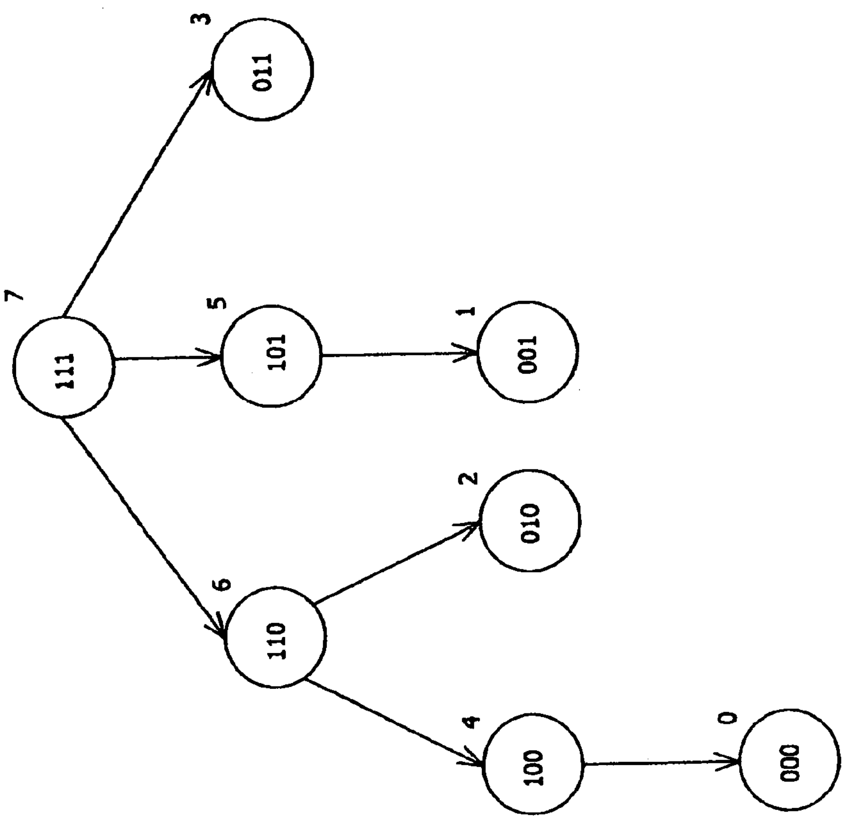
FIG. 3 is a precedence tree for programming a three-bit cell.
Figure 4:
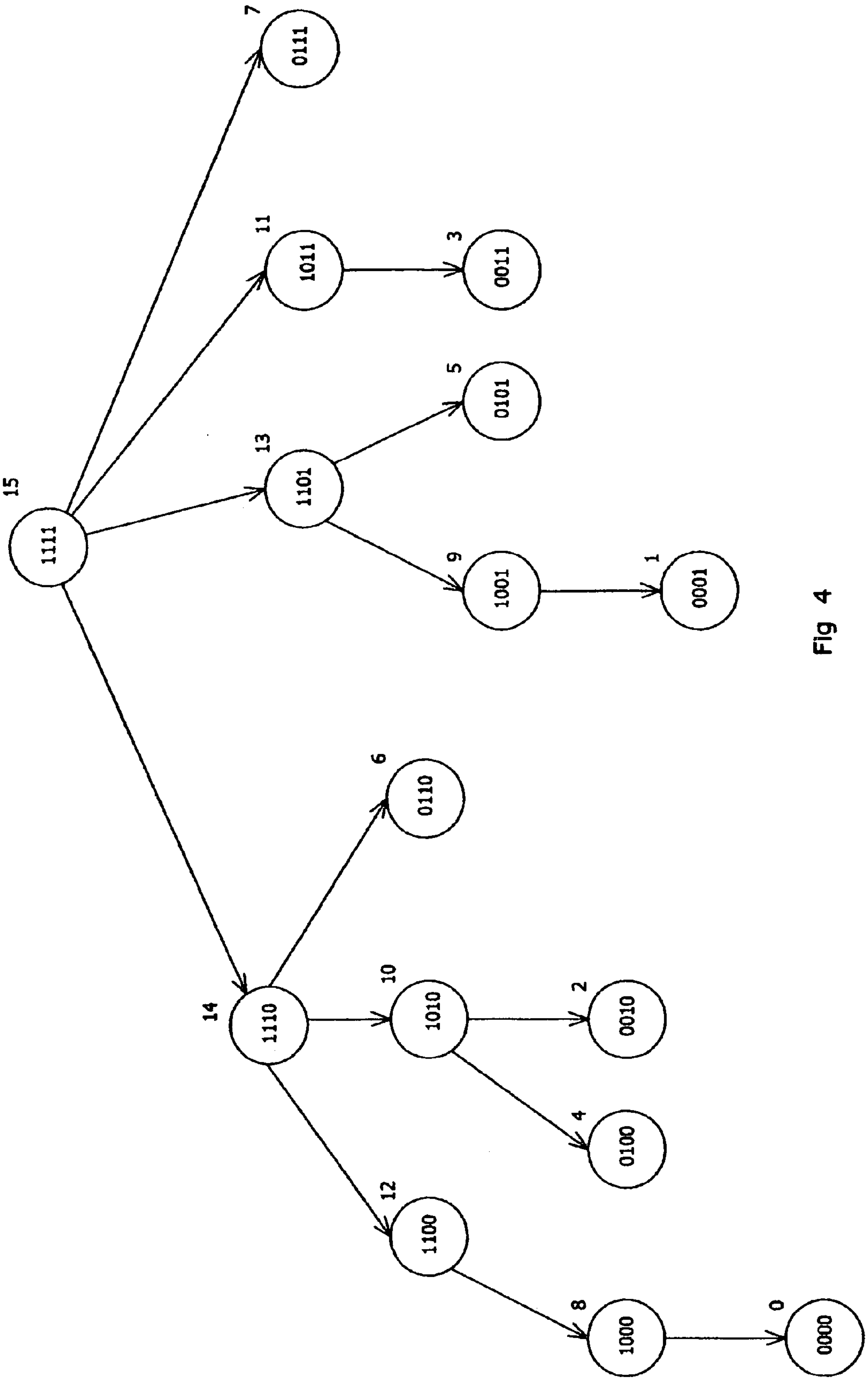
FIG. 4 is a precedence tree for programming a four-bit cell.

FIGS. 2-4, as well as the examples and explanations above, all assume the first implementation. For the second implementation it is still not allowed to decrease the threshold voltage (that is—to move left on the voltage axis) when programming each bit, but there may be more flexibility in the sense that transitions that are impossible in the first implementation are possible in the second one. Therefore the concept of “validity” still is applicable, but the exact rules of which ordering or allocation is valid and which is not may be different. Unlike the first implementation, to which the precedence trees of FIGS. 2-4 apply, it is not possible here to draw similar generic diagrams, as the rules depend on the exact way the intermediate states are defined. The more to the right an intermediate state is, the fewer transitions from it remain valid.

It should be understood that all the methods of the first implementation of the present invention are equally applicable to the second implementation, except that the validity of an allocation or ordering must be checked against its specific transition rules and not against FIGS. 2-4.

Figure 5:
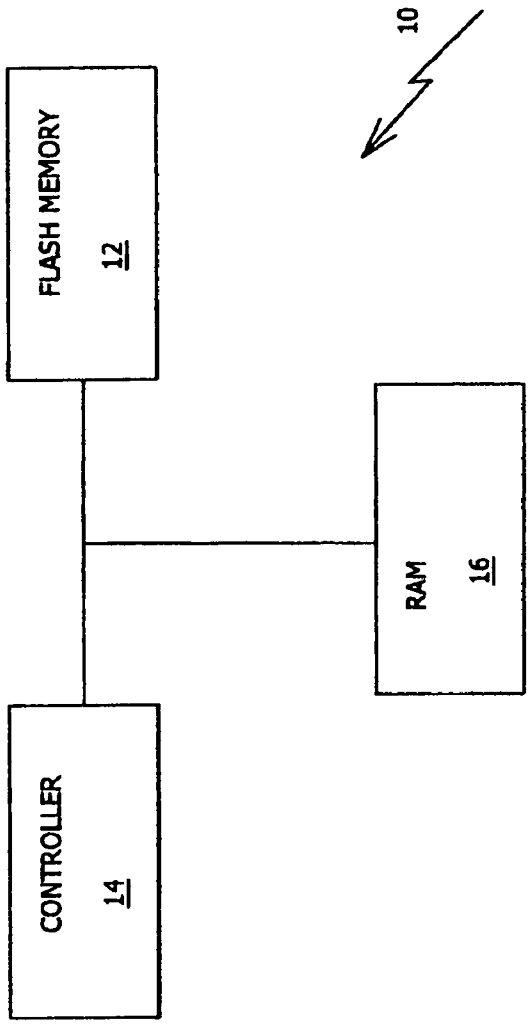
FIG. 5 is a high-level block diagram of a flash memory device of the present invention.

Returning now to the drawings, FIG. 5 is a high-level block diagram of a flash memory device 10 of the present invention. FIG. 5 is adapted from FIG. 1 of U.S. Pat. No. 5,404,485 to Ban, which patent is incorporated by reference for all purposes as if fully set forth herein. Memory device 10 includes a flash memory 12 that is managed by a controller 14 with the help of a random access memory 16 as described in the Ban patent. Controller 14 stores multiple bits of data in each cell of flash memory 12 in accordance with the principles of the present invention.

While the invention has been described with respect to a limited number of embodiments, it will be appreciated that many variations, modifications and other applications of the invention may be made.

What is claimed is:

1. A method of storing N bits of data, comprising the steps of:

(a) providing ⌈N/M⌉ cells; and (b) programming each cell with up to M of the bits according to a valid, nonserial bit ordering that satisfies a criterion selected from the group consisting of:

(i) a number of threshold voltage comparisons for sequentially and statically reading said M bits exceeds a minimum said number of threshold voltage comparisons by at most 1, (ii) a maximum number of threshold voltage comparisons for statically reading any one of said M bits is minimized, (iii) a minimum number of threshold voltage comparisons for statically reading any one of said M bits is minimized, (iv) a maximum number of threshold voltage comparisons for statically reading any one of said M bits exceeds a minimum number of threshold voltage comparisons for statically reading any one of said M bits by at most 1, (v) a number of threshold voltage comparisons for sequentially and dynamically reading said M bits exceeds a minimum said number of threshold voltage comparisons by at most 1, (vi) a maximum number of threshold voltage comparisons for dynamically reading any one of said M bits is minimized, (vii) a minimum number of threshold voltage comparisons for dynamically reading any one of said M bits is minimized, and (viii) a maximum number of threshold voltage comparisons for dynamically reading any one of said M bits exceeds a minimum number of threshold voltage comparisons for dynamically reading any one of said M bits by at most 1;

wherein M is at least 3.

2. The method of claim 1, wherein said criterion is that said number of threshold voltage comparisons for sequentially and statically reading said M bits exceeds said minimum number of threshold voltage comparisons by at most 1.

3. The method of claim 2, wherein M=3, and wherein said number of threshold voltage comparisons for sequentially and statically reading said M bits is 7.

4. The method of claim 2, wherein M=4, and wherein said number of threshold voltage comparisons for sequentially and statically reading said M bits is 15.

5. The method of claim 2, wherein said number of threshold voltage comparisons for sequentially and statically reading said M bits is equal to said minimum number of threshold voltage comparisons.

6. The method of claim 5, wherein M=3 and wherein said bit ordering is one of:

{7, 6, 4, 5, 1, 0, 2, 3} and
{7, 6, 4, 5, 1, 3, 2, 0}.

7. The method of claim 5, wherein M=4 and wherein said bit ordering is one of:

{15, 14, 12, 13, 9, 8, 10, 11, 3, 2, 0, 4, 6, 7, 5, 1},
{15, 14, 12, 13, 9, 8, 10, 11, 3, 2, 0, 1, 5, 4, 6, 7},
{15, 14, 12, 13, 9, 8, 10, 11, 3, 2, 0, 1, 5, 7, 6, 4},
{15, 14, 12, 13, 9, 8, 10, 11, 3, 2, 6, 4, 0, 1, 5, 7},
{15, 14, 12, 13, 9, 8, 10, 11, 3, 2, 6, 7, 5, 4, 0, 1},
{15, 14, 12, 13, 9, 8, 10, 11, 3, 2, 6, 7, 5, 1, 0, 4},
{15, 14, 12, 13, 9, 8, 10, 11, 3, 1, 0, 4, 5, 7, 6, 2},
{15, 14, 12, 13, 9, 8, 10, 11, 3, 1, 0, 2, 6, 4, 5, 7},
{15, 14, 12, 13, 9, 8, 10, 11, 3, 1, 0, 2, 6, 7, 5, 4},
{15, 14, 12, 13, 9, 8, 10, 11, 3, 1, 5, 4, 0, 2, 6, 7},
{15, 14, 12, 13, 9, 8, 10, 11, 3, 1, 5, 7, 6, 4, 0, 2},
{15, 14, 12, 13, 9, 8, 10, 11, 3, 1, 5, 7, 6, 2, 0, 4},
{15, 14, 12, 13, 9, 8, 10, 11, 3, 7, 6, 4, 5, 1, 0, 2},
{15, 14, 12, 13, 9, 8, 10, 11, 3, 7, 6, 2, 0, 4, 5, 1},
{15, 14, 12, 13, 9, 8, 10, 11, 3, 7, 6, 2, 0, 1, 5, 4},
{15, 14, 12, 13, 9, 8, 10, 11, 3, 7, 5, 4, 6, 2, 0, 1},
{15, 14, 12, 13, 9, 8, 10, 11, 3, 7, 5, 1, 0, 4, 6, 2},
{15, 14, 12, 13, 9, 8, 10, 11, 3, 7, 5, 1, 0, 2, 6, 4},
{15, 14, 12, 13, 9, 11, 10, 8, 0, 4, 6, 2, 3, 1, 5, 7},
{15, 14, 12, 13, 9, 11, 10, 8, 0, 4, 6, 2, 3, 7, 5, 1},
{15, 14, 12, 13, 9, 11, 10, 8, 0, 4, 6, 7, 5, 1, 3, 2},
{15, 14, 12, 13, 9, 11, 10, 8, 0, 4, 5, 1, 3, 2, 6, 7},
{15, 14, 12, 13, 9, 11, 10, 8, 0, 4, 5, 1, 3, 7, 6, 2},
{15, 14, 12, 13, 9, 11, 10, 8, 0, 4, 5, 7, 6, 2, 3, 1},
{15, 14, 12, 13, 9, 11, 10, 8, 0, 2, 6, 4, 5, 1, 3, 7},
{15, 14, 12, 13, 9, 11, 10, 8, 0, 2, 6, 4, 5, 7, 3, 1},
{15, 14, 12, 13, 9, 11, 10, 8, 0, 2, 6, 7, 3, 1, 5, 4},
{15, 14, 12, 13, 9, 11, 10, 8, 0, 2, 3, 1, 5, 4, 6, 7},
{15, 14, 12, 13, 9, 11, 10, 8, 0, 2, 3, 1, 5, 7, 6, 4},
{15, 14, 12, 13, 9, 11, 10, 8, 0, 2, 3, 7, 6, 4, 5, 1},
{15, 14, 12, 13, 9, 11, 10, 8, 0, 1, 5, 4, 6, 2, 3, 7},
{15, 14, 12, 13, 9, 11, 10, 8, 0, 1, 5, 4, 6, 7, 3, 2},
{15, 14, 12, 13, 9, 11, 10, 8, 0, 1, 5, 7, 3, 2, 6, 4},
{15, 14, 12, 13, 9, 11, 10, 8, 0, 1, 3, 2, 6, 4, 5, 7},
{15, 14, 12, 13, 9, 11, 10, 8, 0, 1, 3, 2, 6, 7, 5, 4} and
{15, 14, 12, 13, 9, 11, 10, 8, 0, 1, 3, 7, 5, 4, 6, 2}.

8. The method of claim 2, wherein said number of threshold voltage comparisons for sequentially and statically reading said M bits exceeds said minimum number of threshold voltage comparisons by 1.

9. The method of claim 8, wherein M=3, and wherein said number of threshold voltage comparisons for sequentially and statically reading said M bits is 8.

10. The method of claim 8, wherein M=3 and wherein said bit ordering is one of:

{7, 6, 2, 3, 5, 4, 0, 1},
{7, 6, 4, 0, 2, 3, 5, 1},
{7, 6, 4, 0, 5, 1, 3, 2},
{7, 6, 4, 5, 0, 2, 3, 1},
{7, 6, 4, 5, 0, 1, 3, 2},
{7, 6, 4, 5, 1, 0, 3, 2},
{7, 6, 4, 5, 1, 3, 0, 2},
{7, 6, 4, 5, 3, 2, 0, 1},
{7, 6, 4, 5, 3, 1, 0, 2},
{7, 6, 5, 4, 0, 2, 3, 1},
{7, 6, 5, 4, 0, 1, 3, 2},
{7, 5, 6, 4, 0, 2, 3, 1},
{7, 5, 6, 4, 0, 1, 3, 2},
{7, 5, 1, 3, 6, 4, 0, 2} and
{7, 3, 6, 4, 5, 1, 0, 2}.

11. The method of claim 1, wherein said criterion is that said maximum number of threshold voltage comparisons for statically reading any one of said M bits is minimized.

12. The method of claim 11, wherein M=3, and wherein said maximum number of threshold voltage comparisons for statically reading any one of said M bits is 3.

13. The method of claim 11, wherein M=4, and wherein said maximum number of threshold voltage comparisons for statically reading any one of said M bits is 5.

14. The method of claim 11, wherein M=3 and wherein said bit ordering is one of:

{7, 6, 2, 4, 5, 1, 3, 0},
{7, 6, 2, 4, 5, 3, 1, 0},
{7, 6, 4, 2, 3, 5, 1, 0},
{7, 6, 4, 0, 2, 3, 5, 1},
{7, 6, 4, 0, 5, 1, 3, 2},
{7, 6, 4, 5, 1, 3, 2, 0},
{7, 6, 5, 1, 3, 2, 4, 0},
{7, 5, 6, 2, 3, 1, 4, 0},
{7, 3, 6, 4, 5, 1, 2, 0} and
{7, 3, 6, 4, 5, 1, 0, 2}.

15. The method of claim 11, wherein M=4 and wherein said bit ordering is one of:

{15, 14, 12, 13, 9, 8, 10, 11, 3, 1, 5, 7, 6, 2, 0, 4},
{15, 14, 12, 13, 9, 8, 10, 11, 3, 7, 5, 1, 0, 4, 6, 2},
{15, 14, 12, 13, 9, 8, 10, 11, 3, 7, 5, 1, 0, 2, 6, 4},
{15, 14, 12, 13, 9, 11, 10, 8, 0, 4, 6, 2, 3, 7, 5, 1},
{15, 14, 12, 13, 9, 11, 10, 8, 0, 4, 5, 1, 3, 7, 6, 2}
{15, 14, 12, 13, 9, 11, 10, 8, 0, 2, 6, 7, 3, 1, 5, 4} and
{15, 14, 12, 13, 9, 11, 10, 8, 0, 1, 5, 7, 3, 2, 6, 4}.

16. The method of claim 1, wherein said criterion is that said minimum number of threshold voltage comparisons for statically reading any one of said M bits is minimized.

17. The method of claim 16, wherein M=3, and wherein said minimum number of threshold voltage comparisons for statically reading any one of said M bits is 1.

18. The method of claim 16, wherein M=4, and wherein said minimum number of threshold voltage comparisons for statically reading any one of said M bits is 1.

19. The method of claim 16, wherein M=3 and wherein said bit ordering is one of:

{7, 6, 2, 3, 4, 0, 5, 1},
{7, 6, 2, 3, 4, 5, 0, 1},
{7, 6, 2, 3, 4, 5, 1, 0},
{7, 6, 2, 3, 5, 4, 0, 1},
{7, 6, 2, 3, 5, 4, 1, 0},
{7, 6, 2, 3, 5, 1, 4, 0},
{7, 6, 4, 5, 2, 0, 1, 3},
{7, 6, 4, 5, 2, 0, 3, 1},
{7, 6, 4, 5, 2, 1, 0, 3},
{7, 6, 4, 5, 2, 1, 3, 0},
{7, 6, 4, 5, 2, 3, 0, 1},
{7, 6, 4, 5, 2, 3, 1, 0},
{7, 6, 4, 5, 0, 2, 1, 3},
{7, 6, 4, 5, 0, 2, 3, 1},
{7, 6, 4, 5, 0, 1, 2, 3},
{7, 6, 4, 5, 0, 1, 3, 2},
{7, 6, 4, 5, 0, 3, 1, 2},
{7, 6, 4, 5, 0, 3, 2, 1},
{7, 6, 4, 5, 1, 2, 0, 3},
{7, 6, 4, 5, 1, 2, 3, 0},
{7, 6, 4, 5, 1, 0, 2, 3},
{7, 6, 4, 5, 1, 0, 3, 2},
{7, 6, 4, 5, 1, 3, 2, 0},
{7, 6, 4, 5, 1, 3, 0, 2},
{7, 6, 4, 5, 3, 2, 0, 1},
{7, 6, 4, 5, 3, 2, 1, 0},
{7, 6, 4, 5, 3, 0, 2, 1},
{7, 6, 4, 5, 3, 0, 1, 2},
{7, 6, 4, 5, 3, 1, 2, 0},
{7, 6, 4, 5, 3, 1, 0, 2},
{7, 6, 5, 4, 2, 0, 1, 3},
{7, 6, 5, 4, 2, 0, 3, 1},
{7, 6, 5, 4, 2, 1, 0, 3},
{7, 6, 5, 4, 2, 1, 3, 0},
{7, 6, 5, 4, 2, 3, 0, 1},
{7, 6, 5, 4, 2, 3, 1, 0},
{7, 6, 5, 4, 0, 2, 1, 3},
{7, 6, 5, 4, 0, 2, 3, 1},
{7, 6, 5, 4, 0, 1, 2, 3},
{7, 6, 5, 4, 0, 1, 3, 2},
{7, 6, 5, 4, 0, 3, 1, 2},
{7, 6, 5, 4, 0, 3, 2, 1},
{7, 6, 5, 4, 1, 2, 0, 3},
{7, 6, 5, 4, 1, 2, 3, 0},
{7, 6, 5, 4, 1, 0, 2, 3},
{7, 6, 5, 4, 1, 0, 3, 2},
{7, 6, 5, 4, 1, 3, 2, 0},
{7, 6, 5, 4, 1, 3, 0, 2},
{7, 6, 5, 4, 3, 2, 0, 1},
{7, 6, 5, 4, 3, 0, 2, 1},
{7, 6, 5, 4, 3, 0, 1, 2},
{7, 6, 5, 4, 3, 1, 2, 0},
{7, 6, 5, 4, 3, 1, 0, 2},
{7, 6, 3, 2, 4, 0, 5, 1},
{7, 6, 3, 2, 4, 5, 0, 1},
{7, 6, 3, 2, 4, 5, 1, 0},
{7, 6, 3, 2, 5, 4, 0, 1},
{7, 6, 3, 2, 5, 4, 1, 0},
{7, 6, 3, 2, 5, 1, 4, 0},
{7, 5, 6, 4, 2, 0, 1, 3},
{7, 5, 6, 4, 2, 0, 3, 1},
{7, 5, 6, 4, 2, 1, 0, 3},
{7, 5, 6, 4, 2, 1, 3, 0},
{7, 5, 6, 4, 2, 3, 0, 1},
{7, 5, 6, 4, 2, 3, 1, 0},
{7, 5, 6, 4, 0, 2, 1, 3},
{7, 5, 6, 4, 0, 2, 3, 1},
{7, 5, 6, 4, 0, 1, 2, 3},
{7, 5, 6, 4, 0, 1, 3, 2},
{7, 5, 6, 4, 0, 3, 1, 2},
{7, 5, 6, 4, 0, 3, 2, 1},
{7, 5, 6, 4, 1, 2, 0, 3},
{7, 5, 6, 4, 1, 2, 3, 0},
{7, 5, 6, 4, 1, 0, 2, 3},
{7, 5, 6, 4, 1, 0, 3, 2},
{7, 5, 6, 4, 1, 3, 2, 0},
{7, 5, 6, 4, 1, 3, 0, 2},
{7, 5, 6, 4, 3, 2, 0, 1},
{7, 5, 6, 4, 3, 2, 1, 0},
{7, 5, 6, 4, 3, 0, 2, 1},
{7, 5, 6, 4, 3, 0, 1, 2},
{7, 5, 6, 4, 3, 1, 2, 0},
{7, 5, 6, 4, 3, 1, 0, 2},
{7, 5, 1, 3, 6, 2, 4, 0},
{7, 5, 1, 3, 6, 4, 2, 0},
{7, 5, 1, 3, 6, 4, 0, 2},
{7, 5, 3, 1, 6, 2, 4, 0},
{7, 5, 3, 1, 6, 4, 2, 0},
{7, 5, 3, 1, 6, 4, 0, 2},
{7, 3, 6, 2, 4, 0, 5, 1},
{7, 3, 6, 2, 4, 5, 0, 1},
{7, 3, 6, 2, 4, 5, 1, 0},
{7, 3, 6, 2, 5, 4, 0, 1},
{7, 3, 6, 2, 5, 4, 1, 0},
{7, 3, 6, 2, 5, 1, 4, 0},
{7, 3, 5, 1, 6, 2, 4, 0},
{7, 3, 5, 1, 6, 4, 2, 0} and
{7, 3, 5, 1, 6, 4, 0, 2}.

20. The method of claim 16, wherein M=4 and wherein said bit ordering is one of:

{15, 14, 12, 13, 9, 8, 10, 11, 3, 2, 0, 4, 6, 7, 5, 1},
{15, 14, 12, 13, 9, 8, 10, 11, 3, 2, 0, 1, 5, 4, 6, 7},
{15, 14, 12, 13, 9, 8, 10, 11, 3, 2, 0, 1, 5, 7, 6, 4},
{15, 14, 12, 13, 9, 8, 10, 11, 3, 2, 6, 4, 0, 1, 5, 7},
{15, 14, 12, 13, 9, 8, 10, 11, 3, 2, 6, 7, 5, 4, 0, 1},
{15, 14, 12, 13, 9, 8, 10, 11, 3, 2, 6, 7, 5, 1, 0, 4},
{15, 14, 12, 13, 9, 8, 10, 11, 3, 1, 0, 4, 5, 7, 6, 2},
{15, 14, 12, 13, 9, 8, 10, 11, 3, 1, 0, 2, 6, 4, 5, 7},
{15, 14, 12, 13, 9, 8, 10, 11, 3, 1, 0, 2, 6, 7, 5, 4},
{15, 14, 12, 13, 9, 8, 10, 11, 3, 1, 5, 4, 0, 2, 6, 7},
{15, 14, 12, 13, 9, 8, 10, 11, 3, 1, 5, 7, 6, 4, 0, 2},
{15, 14, 12, 13, 9, 8, 10, 11, 3, 1, 5, 7, 6, 2, 0, 4},
{15, 14, 12, 13, 9, 8, 10, 11, 3, 7, 6, 4, 5, 1, 0, 2},
{15, 14, 12, 13, 9, 8, 10, 11, 3, 7, 6, 2, 0, 4, 5, 1},

{15, 14, 12, 13, 9, 8, 10, 11, 3, 7, 6, 2, 0, 1, 5, 4},
{15, 14, 12, 13, 9, 8, 10, 11, 3, 7, 5, 4, 6, 2, 0, 1},
{15, 14, 12, 13, 9, 8, 10, 11, 3, 7, 5, 1, 0, 4, 6, 2},
{15, 14, 12, 13, 9, 8, 10, 11, 3, 7, 5, 1, 0, 2, 6, 4},
{15, 14, 12, 13, 9, 11, 10, 8, 0, 4, 6, 2, 3, 1, 5, 7},
{15, 14, 12, 13, 9, 11, 10, 8, 0, 4, 6, 2, 3, 7, 5, 1},
{15, 14, 12, 13, 9, 11, 10, 8, 0, 4, 6, 7, 5, 1, 3, 2},
{15, 14, 12, 13, 9, 11, 10, 8, 0, 4, 5, 1, 3, 2, 6, 7},
{15, 14, 12, 13, 9, 11, 10, 8, 0, 4, 5, 1, 3, 7, 6, 2},
{15, 14, 12, 13, 9, 11, 10, 8, 0, 4, 5, 7, 6, 2, 3, 1},
{15, 14, 12, 13, 9, 11, 10, 8, 0, 2, 6, 4, 5, 1, 3, 7},
{15, 14, 12, 13, 9, 11, 10, 8, 0, 2, 6, 4, 5, 7, 3, 1},
{15, 14, 12, 13, 9, 11, 10, 8, 0, 2, 6, 7, 3, 1, 5, 4},
{15, 14, 12, 13, 9, 11, 10, 8, 0, 2, 3, 1, 5, 4, 6, 7},
{15, 14, 12, 13, 9, 11, 10, 8, 0, 2, 3, 1, 5, 7, 6, 4},
{15, 14, 12, 13, 9, 11, 10, 8, 0, 2, 3, 7, 6, 4, 5, 1},
{15, 14, 12, 13, 9, 11, 10, 8, 0, 1, 5, 4, 6, 2, 3, 7},
{15, 14, 12, 13, 9, 11, 10, 8, 0, 1, 5, 4, 6, 7, 3, 2},
{15, 14, 12, 13, 9, 11, 10, 8, 0, 1, 5, 7, 3, 2, 6, 4},
{15, 14, 12, 13, 9, 11, 10, 8, 0, 1, 3, 2, 6, 4, 5, 7},
{15, 14, 12, 13, 9, 11, 10, 8, 0, 1, 3, 2, 6, 7, 5, 4} and
{15, 14, 12, 13, 9, 11, 10, 8, 0, 1, 3, 7, 5, 4, 6, 2}.

21. The method of claim 1, wherein said criterion is that said maximum number of threshold voltage comparisons for statically reading any one of said M bits exceeds said minimum number of threshold voltage comparisons for statically reading any one of said M bits by at most 1.

22. The method of claim 21, wherein said maximum number of threshold voltage comparisons for statically reading any one of said M bits equals said minimum number of threshold voltage comparisons for statically reading any one of said M bits.

23. The method of claim 22, wherein M=3, and wherein 3 said threshold voltage comparisons are needed to statically read any one of said M bits.

24. The method of claim 22, wherein M=3 and wherein said bit ordering is one of:
{7, 6, 2, 4, 5, 1, 3, 0},
{7, 6, 2, 4, 5, 3, 1, 0},
{7, 6, 4, 2, 3, 5, 1, 0} and
{7, 6, 5, 1, 3, 2, 4, 0}.

25. The method of claim 21, wherein said maximum number of threshold voltage comparisons for statically reading any one of said M bits exceeds said minimum number of threshold voltage comparisons for statically reading any one of said M bits by 1.

26. The method of claim 25, wherein M=3, wherein said maximum number of threshold voltage comparisons for statically reading any one of said M bits is 4, and wherein said minimum number of threshold voltage comparisons for statically reading any one of said M bits is 3.

27. The method of claim 25, wherein M=4, wherein said maximum number of threshold voltage comparisons for statically reading any one of said M bits is 5, and wherein said minimum number of threshold voltage comparisons for statically reading any one of said M bits is 4.

28. The method of claim 25, wherein M=3 and wherein said bit ordering is one of:
{7, 6, 2, 4, 5, 0, 3, 1},
{7, 6, 2, 4, 5, 3, 0, 1},
{7, 6, 2, 5, 4, 0, 3, 1},
{7, 6, 4, 2, 5, 0, 1, 3},
{7, 6, 4, 2, 5, 1, 0, 3},
{7, 6, 4, 2, 3, 0, 5, 1},
{7, 6, 4, 2, 3, 5, 0, 1},
{7, 6, 4, 0, 2, 3, 5, 1},
{7, 6, 4, 0, 5, 2, 1, 3},
{7, 6, 4, 0, 5, 2, 3, 1},
{7, 6, 4, 0, 5, 1, 3, 2},
{7, 6, 4, 0, 5, 3, 1, 2},
{7, 6, 4, 0, 5, 3, 2, 1},
{7, 6, 4, 0, 3, 2, 5, 1},
{7, 6, 4, 0, 3, 5, 1, 2},
{7, 6, 4, 3, 2, 0, 5, 1},
{7, 6, 4, 3, 5, 1, 0, 2},
{7, 6, 5, 2, 4, 0, 1, 3},
{7, 6, 5, 1, 2, 4, 0, 3},
{7, 6, 5, 1, 4, 2, 0, 3},
{7, 6, 5, 1, 3, 4, 0, 2},
{7, 6, 5, 3, 2, 4, 0, 1},
{7, 6, 5, 3, 1, 4, 0, 2},
{7, 6, 3, 5, 4, 2, 0, 1},
{7, 6, 3, 5, 4, 0, 2, 1},
{7, 5, 6, 2, 4, 1, 0, 3},
{7, 5, 6, 2, 1, 4, 0, 3},
{7, 5, 6, 2, 3, 4, 0, 1},
{7, 5, 6, 1, 4, 0, 2, 3},
{7, 5, 6, 3, 2, 4, 0, 1},
{7, 5, 6, 3, 1, 4, 0, 2},
{7, 5, 1, 6, 4, 0, 3, 2},
{7, 5, 3, 6, 4, 0, 1, 2},
{7, 5, 3, 6, 4, 1, 0, 2},
{7, 3, 6, 4, 5, 2, 0, 1},
{7, 3, 6, 4, 5, 0, 2, 1},
{7, 3, 6, 5, 4, 2, 0, 1},
{7, 3, 6, 5, 4, 0, 2, 1},
{7, 3, 5, 6, 4, 0, 1, 2} and
{7, 3, 5, 6, 4, 1, 0, 2}.

29. The method of claim 25, wherein M=4 and wherein said bit ordering is one of:
{15, 14, 12, 8, 0, 10, 11, 3, 2, 6, 4, 13, 9, 1, 5, 7},
{15, 14, 12, 13, 9, 8, 0, 4, 6, 10, 2, 11, 3, 1, 5, 7},
{15, 14, 12, 13, 9, 8, 0, 10, 2, 6, 4, 5, 1, 11, 3, 7},
{15, 14, 12, 13, 9, 1, 5, 4, 6, 10, 8, 0, 2, 11, 3, 7},
{15, 14, 12, 13, 9, 11, 3, 10, 2, 6, 4, 8, 0, 1, 5, 7},
{15, 14, 12, 13, 9, 11, 3, 1, 5, 4, 8, 0, 10, 2, 6, 7},
{15, 14, 12, 13, 5, 9, 8, 10, 2, 6, 4, 0, 1, 11, 3, 7},
{15, 14, 12, 13, 5, 9, 1, 11, 10, 8, 0, 4, 6, 2, 3, 7},
{15, 14, 12, 13, 5, 9, 11, 10, 2, 6, 4, 8, 0, 1, 3, 7},
{15, 14, 10, 2, 6, 12, 13, 9, 11, 3, 1, 8, 0, 4, 5, 7},
{15, 14, 6, 12, 8, 0, 4, 13, 9, 11, 10, 2, 3, 1, 5, 7},
{15, 14, 6, 12, 8, 10, 11, 3, 2, 0, 4, 13, 9, 1, 5, 7},
{15, 14, 6, 12, 13, 9, 8, 10, 2, 0, 4, 5, 1, 11, 3, 7} and
{15, 14, 6, 12, 13, 9, 11, 10, 2, 8, 0, 4, 5, 1, 3, 7}.

30. The method of claim 1, wherein said criterion is that said number of threshold voltage comparisons for sequentially and dynamically reading said M bits exceeds said minimum number of threshold voltage comparisons by at most 1.

31. The method of claim 30, wherein said number of threshold voltage comparisons for sequentially and dynamically reading said M bits is equal to said minimum number of threshold voltage comparisons.

32. The method of claim 31, wherein M=3, and wherein said number of threshold voltage comparisons for sequentially and dynamically reading said M bits is 5.

33. The method of claim 31, wherein M=4, and wherein said number of threshold voltage comparisons for sequentially and dynamically reading said M bits is 9.

34. The method of claim 31, wherein M=3 and wherein said bit ordering is {7, 6, 4, 5, 1, 3, 2, 0}.

35. The method of claim 31, wherein M=4 and wherein said bit ordering is one of:

{15, 14, 12, 13, 9, 8, 10, 11, 3, 2, 0, 4, 6, 7, 5, 1},
{15, 14, 12, 13, 9, 8, 10, 11, 3, 2, 0, 1, 5, 7, 6, 4},
{15, 14, 12, 13, 9, 8, 10, 11, 3, 2, 6, 7, 5, 4, 0, 1},
{15, 14, 12, 13, 9, 8, 10, 11, 3, 2, 6, 7, 5, 1, 0, 4},
{15, 14, 12, 13, 9, 8, 10, 11, 3, 1, 0, 4, 5, 7, 6, 2},
{15, 14, 12, 13, 9, 8, 10, 11, 3, 1, 0, 2, 6, 4, 5, 7},
{15, 14, 12, 13, 9, 8, 10, 11, 3, 1, 0, 2, 6, 7, 5, 4},
{15, 14, 12, 13, 9, 8, 10, 11, 3, 1, 5, 7, 6, 4, 0, 2},
{15, 14, 12, 13, 9, 8, 10, 11, 3, 7, 6, 4, 5, 1, 0, 2},
{15, 14, 12, 13, 9, 8, 10, 11, 3, 7, 6, 2, 0, 4, 5, 1},
{15, 14, 12, 13, 9, 8, 10, 11, 3, 7, 6, 2, 0, 1, 5, 4},
{15, 14, 12, 13, 9, 8, 10, 11, 3, 7, 5, 4, 6, 2, 0, 1},
{15, 14, 12, 13, 9, 11, 10, 8, 0, 4, 6, 7, 5, 1, 3, 2},
{15, 14, 12, 13, 9, 11, 10, 8, 0, 4, 5, 7, 6, 2, 3, 1},
{15, 14, 12, 13, 9, 11, 10, 8, 0, 2, 6, 4, 5, 7, 3, 1},
{15, 14, 12, 13, 9, 11, 10, 8, 0, 2, 3, 1, 5, 4, 6, 7},
{15, 14, 12, 13, 9, 11, 10, 8, 0, 2, 3, 1, 5, 7, 6, 4},
{15, 14, 12, 13, 9, 11, 10, 8, 0, 2, 3, 7, 6, 4, 5, 1},
{15, 14, 12, 13, 9, 11, 10, 8, 0, 1, 5, 4, 6, 7, 3, 2},
{15, 14, 12, 13, 9, 11, 10, 8, 0, 1, 3, 2, 6, 4, 5, 7},
{15, 14, 12, 13, 9, 11, 10, 8, 0, 1, 3, 2, 6, 7, 5, 4} and
{15, 14, 12, 13, 9, 11, 10, 8, 0, 1, 3, 7, 5, 4, 6, 2}.

36. The method of claim 30, wherein said number of threshold voltage comparisons for sequentially and dynamically reading said M bits exceeds said minimum number of threshold voltage comparisons by 1.

37. The method of claim 36, wherein M=3, and wherein said number of threshold voltage comparisons for sequentially and dynamically reading said M bits is 6.

38. The method of claim 36, wherein M=3 and wherein said bit orderings is one of:

{7, 6, 2, 4, 5, 1, 3, 0},
{7, 6, 2, 4, 5, 3, 1, 0},
{7, 6, 2, 3, 4, 5, 0, 1},
{7, 6, 2, 3, 4, 5, 1, 0},
{7, 6, 2, 3, 5, 4, 0, 1},
{7, 6, 2, 3, 5, 4, 1, 0},
{7, 6, 2, 3, 5, 1, 4, 0},
{7, 6, 4, 2, 3, 5, 1, 0},
{7, 6, 4, 0, 2, 3, 5, 1},
{7, 6, 4, 0, 5, 1, 3, 2},
{7, 6, 4, 5, 2, 3, 0, 1},
{7, 6, 4, 5, 2, 3, 1, 0},
{7, 6, 4, 5, 0, 2, 3, 1},
{7, 6, 4, 5, 0, 1, 2, 3},
{7, 6, 4, 5, 0, 1, 3, 2},
{7, 6, 4, 5, 0, 3, 2, 1},
{7, 6, 4, 5, 1, 2, 3, 0},
{7, 6, 4, 5, 1, 0, 2, 3},
{7, 6, 4, 5, 1, 0, 3, 2},
{7, 6, 4, 5, 1, 3, 0, 2},
{7, 6, 4, 5, 3, 2, 0, 1},
{7, 6, 4, 5, 3, 2, 1, 0},
{7, 6, 4, 5, 3, 1, 2, 0},
{7, 6, 4, 5, 3, 1, 0, 2},
{7, 6, 5, 4, 2, 3, 0, 1},
{7, 6, 5, 4, 2, 3, 1, 0},
{7, 6, 5, 4, 0, 2, 3, 1},
{7, 6, 5, 4, 0, 1, 2, 3},
{7, 6, 5, 4, 0, 1, 3, 2},
{7, 6, 5, 4, 0, 3, 2, 1},
{7, 6, 5, 4, 1, 2, 3, 0},
{7, 6, 5, 4, 1, 0, 2, 3},
{7, 6, 5, 4, 1, 0, 3, 2},
{7, 6, 5, 4, 1, 3, 2, 0},
{7, 6, 5, 4, 3, 2, 0, 1},
{7, 6, 5, 1, 3, 2, 4, 0},
{7, 6, 3, 2, 4, 5, 0, 1},
{7, 6, 3, 2, 4, 5, 1, 0},
{7, 6, 3, 2, 5, 4, 0, 1},
{7, 6, 3, 2, 5, 4, 1, 0},
{7, 5, 6, 2, 3, 1, 4, 0},
{7, 5, 6, 4, 2, 0, 1, 3},
{7, 5, 6, 4, 2, 0, 3, 1},
{7, 5, 6, 4, 2, 1, 3, 0},
{7, 5, 6, 4, 2, 3, 1, 0},
{7, 5, 6, 4, 0, 2, 1, 3},
{7, 5, 6, 4, 0, 2, 3, 1},
{7, 5, 6, 4, 0, 1, 3, 2},
{7, 5, 6, 4, 0, 3, 1, 2},
{7, 5, 6, 4, 1, 3, 2, 0},
{7, 5, 6, 4, 1, 3, 0, 2},
{7, 5, 6, 4, 3, 1, 2, 0},
{7, 5, 6, 4, 3, 1, 0, 2},
{7, 5, 1, 3, 6, 2, 4, 0},
{7, 5, 1, 3, 6, 4, 2, 0},
{7, 5, 1, 3, 6, 4, 0, 2},
{7, 5, 3, 1, 6, 4, 2, 0},
{7, 5, 3, 1, 6, 4, 0, 2},
{7, 3, 6, 2, 4, 0, 5, 1},
{7, 3, 6, 2, 4, 5, 1, 0},
{7, 3, 6, 2, 5, 1, 4, 0},
{7, 3, 6, 4, 5, 1, 2, 0},
{7, 3, 6, 4, 5, 1, 0, 2} and
{7, 3, 5, 1, 6, 2, 4, 0}.

39. The method of claim 1, wherein said criterion is that said maximum number of threshold voltage comparisons for dynamically reading any one of said M bits is minimized.

40. The method of claim 39, wherein M=3, and wherein said maximum number of threshold voltage comparisons for dynamically reading any one of said M bits is 2.

41. The method of claim 39, wherein M=4, and wherein said maximum number of threshold voltage comparisons for dynamically reading any one of said M bits is 3.

42. The method of claim 39, wherein M=3 and wherein said bit ordering is one of:

{7, 6, 2, 4, 5, 1, 3, 0},
{7, 6, 2, 4, 5, 3, 1, 0},
{7, 6, 4, 2, 3, 5, 1, 0},
{7, 6, 4, 0, 2, 3, 5, 1},
{7, 6, 4, 0, 5, 1, 3, 2},
{7, 6, 4, 5, 1, 3, 2, 0},
{7, 6, 5, 1, 3, 2, 4, 0},
{7, 5, 6, 2, 3, 1, 4, 0},
{7, 3, 6, 4, 5, 1, 2, 0} and
{7, 3, 6, 4, 5, 1, 0, 2}.

43. The method of claim 39, wherein M=4 and wherein said bit ordering is one of:

{15, 14, 12, 13, 9, 8, 10, 11, 3, 2, 0, 4, 6, 7, 5, 1},
{15, 14, 12, 13, 9, 8, 10, 11, 3, 2, 0, 1, 5, 7, 6, 4},
{15, 14, 12, 13, 9, 8, 10, 11, 3, 2, 6, 4, 0, 1, 5, 7},
{15, 14, 12, 13, 9, 8, 10, 11, 3, 2, 6, 7, 5, 1, 0, 4},
{15, 14, 12, 13, 9, 8, 10, 11, 3, 1, 0, 4, 5, 7, 6, 2},
{15, 14, 12, 13, 9, 8, 10, 11, 3, 1, 0, 2, 6, 4, 5, 7},
{15, 14, 12, 13, 9, 8, 10, 11, 3, 1, 0, 2, 6, 7, 5, 4},
{15, 14, 12, 13, 9, 8, 10, 11, 3, 1, 5, 4, 0, 2, 6, 7},
{15, 14, 12, 13, 9, 8, 10, 11, 3, 1, 5, 7, 6, 4, 0, 2},
{15, 14, 12, 13, 9, 8, 10, 11, 3, 1, 5, 7, 6, 2, 0, 4},
{15, 14, 12, 13, 9, 8, 10, 11, 3, 7, 6, 4, 5, 1, 0, 2},
{15, 14, 12, 13, 9, 8, 10, 11, 3, 7, 6, 2, 0, 4, 5, 1},
{15, 14, 12, 13, 9, 8, 10, 11, 3, 7, 6, 2, 0, 1, 5, 4},
{15, 14, 12, 13, 9, 8, 10, 11, 3, 7, 5, 4, 6, 2, 0, 1},

{15, 14, 12, 13, 9, 8, 10, 11, 3, 7, 5, 1, 0, 4, 6, 2},
{15, 14, 12, 13, 9, 8, 10, 11, 3, 7, 5, 1, 0, 2, 6, 4},
{15, 14, 12, 13, 9, 11, 10, 8, 0, 4, 6, 2, 3, 1, 5, 7},
{15, 14, 12, 13, 9, 11, 10, 8, 0, 4, 6, 2, 3, 7, 5, 1},
{15, 14, 12, 13, 9, 11, 10, 8, 0, 4, 6, 7, 5, 1, 3, 2},
{15, 14, 12, 13, 9, 11, 10, 8, 0, 4, 5, 1, 3, 2, 6, 7},
{15, 14, 12, 13, 9, 11, 10, 8, 0, 4, 5, 1, 3, 7, 6, 2},
{15, 14, 12, 13, 9, 11, 10, 8, 0, 4, 5, 7, 6, 2, 3, 1},
{15, 14, 12, 13, 9, 11, 10, 8, 0, 2, 6, 4, 5, 1, 3, 7},
{15, 14, 12, 13, 9, 11, 10, 8, 0, 2, 6, 4, 5, 7, 3, 1},
{15, 14, 12, 13, 9, 11, 10, 8, 0, 2, 6, 7, 3, 1, 5, 4},
{15, 14, 12, 13, 9, 11, 10, 8, 0, 2, 3, 1, 5, 4, 6, 7},
{15, 14, 12, 13, 9, 11, 10, 8, 0, 2, 3, 1, 5, 7, 6, 4},
{15, 14, 12, 13, 9, 11, 10, 8, 0, 2, 3, 7, 6, 4, 5, 1},
{15, 14, 12, 13, 9, 11, 10, 8, 0, 1, 5, 4, 6, 2, 3, 7},
{15, 14, 12, 13, 9, 11, 10, 8, 0, 1, 5, 4, 6, 7, 3, 2},
{15, 14, 12, 13, 9, 11, 10, 8, 0, 1, 5, 7, 3, 2, 6, 4},
{15, 14, 12, 13, 9, 11, 10, 8, 0, 1, 3, 2, 6, 4, 5, 7},
{15, 14, 12, 13, 9, 11, 10, 8, 0, 1, 3, 2, 6, 7, 5, 4} and
{15, 14, 12, 13, 9, 11, 10, 8, 0, 1, 3, 7, 5, 4, 6, 2}.

44. The method of claim 1, wherein said criterion is that said minimum number of threshold voltage comparisons for dynamically reading any one of said M bits is minimized.

45. The method of claim 44, wherein M=3, and wherein said minimum number of threshold voltage comparisons for dynamically reading any one of said M bits is 1.

46. The method of claim 44, wherein M=4, and wherein said minimum number of threshold voltage comparisons for dynamically reading any one of said M bits is 1.

47. The method of claim 44, wherein M=3 and wherein said bit ordering is one of:

{7, 6, 2, 3, 4, 0, 5, 1},
{7, 6, 2, 3, 4, 5, 0, 1},
{7, 6, 2, 3, 4, 5, 1, 0},
{7, 6, 2, 3, 5, 4, 0, 1},
{7, 6, 2, 3, 5, 4, 1, 0},
{7, 6, 2, 3, 5, 1, 4, 0},
{7, 6, 4, 5, 2, 0, 1, 3},
{7, 6, 4, 5, 2, 0, 3, 1},
{7, 6, 4, 5, 2, 1, 0, 3},
{7, 6, 4, 5, 2, 1, 3, 0},
{7, 6, 4, 5, 2, 3, 0, 1},
{7, 6, 4, 5, 2, 3, 1, 0},
{7, 6, 4, 5, 0, 2, 1, 3},
{7, 6, 4, 5, 0, 2, 3, 1},
{7, 6, 4, 5, 0, 1, 2, 3},
{7, 6, 4, 5, 0, 1, 3, 2},
{7, 6, 4, 5, 0, 3, 1, 2},
{7, 6, 4, 5, 0, 3, 2, 1},
{7, 6, 4, 5, 1, 2, 0, 3},
{7, 6, 4, 5, 1, 2, 3, 0},
{7, 6, 4, 5, 1, 0, 2, 3},
{7, 6, 4, 5, 1, 0, 3, 2},
{7, 6, 4, 5, 1, 3, 2, 0},
{7, 6, 4, 5, 1, 3, 0, 2},
{7, 6, 4, 5, 3, 2, 0, 1},
{7, 6, 4, 5, 3, 2, 1, 0},
{7, 6, 4, 5, 3, 0, 2, 1},
{7, 6, 4, 5, 3, 0, 1, 2},
{7, 6, 4, 5, 3, 1, 2, 0},
{7, 6, 4, 5, 3, 1, 0, 2},
{7, 6, 5, 4, 2, 0, 1, 3},
{7, 6, 5, 4, 2, 0, 3, 1},
{7, 6, 5, 4, 2, 1, 0, 3},
{7, 6, 5, 4, 2, 1, 3, 0},
{7, 6, 5, 4, 2, 3, 0, 1},
{7, 6, 5, 4, 2, 3, 1, 0},
{7, 6, 5, 4, 0, 2, 1, 3},
{7, 6, 5, 4, 0, 2, 3, 1},
{7, 6, 5, 4, 0, 1, 2, 3},
{7, 6, 5, 4, 0, 1, 3, 2},
{7, 6, 5, 4, 0, 3, 1, 2},
{7, 6, 5, 4, 0, 3, 2, 1},
{7, 6, 5, 4, 1, 2, 0, 3},
{7, 6, 5, 4, 1, 2, 3, 0},
{7, 6, 5, 4, 1, 0, 2, 3},
{7, 6, 5, 4, 1, 0, 3, 2},
{7, 6, 5, 4, 1, 3, 2, 0},
{7, 6, 5, 4, 1, 3, 0, 2},
{7, 6, 5, 4, 3, 2, 0, 1},
{7, 6, 5, 4, 3, 0, 2, 1},
{7, 6, 5, 4, 3, 0, 1, 2},
{7, 6, 5, 4, 3, 1, 2, 0},
{7, 6, 5, 4, 3, 1, 0, 2},
{7, 6, 3, 2, 4, 0, 5, 1},
{7, 6, 3, 2, 4, 5, 0, 1},
{7, 6, 3, 2, 4, 5, 1, 0},
{7, 6, 3, 2, 5, 4, 0, 1},
{7, 6, 3, 2, 5, 4, 1, 0},
{7, 6, 3, 2, 5, 1, 4, 0},
{7, 5, 6, 4, 2, 0, 1, 3},
{7, 5, 6, 4, 2, 0, 3, 1},
{7, 5, 6, 4, 2, 1, 0, 3},
{7, 5, 6, 4, 2, 1, 3, 0},
{7, 5, 6, 4, 2, 3, 0, 1},
{7, 5, 6, 4, 2, 3, 1, 0},
{7, 5, 6, 4, 0, 2, 1, 3},
{7, 5, 6, 4, 0, 2, 3, 1},
{7, 5, 6, 4, 0, 1, 2, 3},
{7, 5, 6, 4, 0, 1, 3, 2},
{7, 5, 6, 4, 0, 3, 1, 2},
{7, 5, 6, 4, 0, 3, 2, 1},
{7, 5, 6, 4, 1, 2, 0, 3},
{7, 5, 6, 4, 1, 2, 3, 0},
{7, 5, 6, 4, 1, 0, 2, 3},
{7, 5, 6, 4, 1, 0, 3, 2},
{7, 5, 6, 4, 1, 3, 2, 0},
{7, 5, 6, 4, 1, 3, 0, 2},
{7, 5, 6, 4, 3, 2, 0, 1},
{7, 5, 6, 4, 3, 2, 1, 0},
{7, 5, 6, 4, 3, 0, 2, 1},
{7, 5, 6, 4, 3, 0, 1, 2},
{7, 5, 6, 4, 3, 1, 2, 0},
{7, 5, 6, 4, 3, 1, 0, 2},
{7, 5, 1, 3, 6, 2, 4, 0},
{7, 5, 1, 3, 6, 4, 2, 0},
{7, 5, 1, 3, 6, 4, 0, 2},
{7, 5, 3, 1, 6, 2, 4, 0},
{7, 5, 3, 1, 6, 4, 2, 0},
{7, 5, 3, 1, 6, 4, 0, 2},
{7, 3, 6, 2, 4, 0, 5, 1},
{7, 3, 6, 2, 4, 5, 0, 1},
{7, 3, 6, 2, 4, 5, 1, 0},
{7, 3, 6, 2, 5, 4, 0, 1},
{7, 3, 6, 2, 5, 4, 1, 0},
{7, 3, 6, 2, 5, 1, 4, 0},
{7, 3, 5, 1, 6, 2, 4, 0},
{7, 3, 5, 1, 6, 4, 2, 0} and
{7, 3, 5, 1, 6, 4, 0, 2}.

48. The method of claim 44, wherein M=4 and wherein said bit ordering is one of:

{15, 14, 12, 13, 9, 8, 10, 11, 3, 2, 0, 4, 6, 7, 5, 1},
{15, 14, 12, 13, 9, 8, 10, 11, 3, 2, 0, 1, 5, 4, 6, 7},
{15, 14, 12, 13, 9, 8, 10, 11, 3, 2, 0, 1, 5, 7, 6, 4},

{15, 14, 12, 13, 9, 8, 10, 11, 3, 2, 6, 4, 0, 1, 5, 7},
{15, 14, 12, 13, 9, 8, 10, 11, 3, 2, 6, 7, 5, 4, 0, 1},
{15, 14, 12, 13, 9, 8, 10, 11, 3, 2, 6, 7, 5, 1, 0, 4},
{15, 14, 12, 13, 9, 8, 10, 11, 3, 1, 0, 4, 5, 7, 6, 2},
{15, 14, 12, 13, 9, 8, 10, 11, 3, 1, 0, 2, 6, 4, 5, 7},
{15, 14, 12, 13, 9, 8, 10, 11, 3, 1, 0, 2, 6, 7, 5, 4},
{15, 14, 12, 13, 9, 8, 10, 11, 3, 1, 5, 4, 0, 2, 6, 7},
{15, 14, 12, 13, 9, 8, 10, 11, 3, 1, 5, 7, 6, 4, 0, 2},
{15, 14, 12, 13, 9, 8, 10, 11, 3, 1, 5, 7, 6, 2, 0, 4},
{15, 14, 12, 13, 9, 8, 10, 11, 3, 7, 6, 4, 5, 1, 0, 2},
{15, 14, 12, 13, 9, 8, 10, 11, 3, 7, 6, 2, 0, 4, 5, 1},
{15, 14, 12, 13, 9, 8, 10, 11, 3, 7, 6, 2, 0, 1, 5, 4},
{15, 14, 12, 13, 9, 8, 10, 11, 3, 7, 5, 4, 6, 2, 0, 1},
{15, 14, 12, 13, 9, 8, 10, 11, 3, 7, 5, 1, 0, 4, 6, 2},
{15, 14, 12, 13, 9, 8, 10, 11, 3, 7, 5, 1, 0, 2, 6, 4},
{15, 14, 12, 13, 9, 11, 10, 8, 0, 4, 6, 2, 3, 1, 5, 7},
{15, 14, 12, 13, 9, 11, 10, 8, 0, 4, 6, 2, 3, 7, 5, 1},
{15, 14, 12, 13, 9, 11, 10, 8, 0, 4, 6, 7, 5, 1, 3, 2},
{15, 14, 12, 13, 9, 11, 10, 8, 0, 4, 5, 1, 3, 2, 6, 7},
{15, 14, 12, 13, 9, 11, 10, 8, 0, 4, 5, 1, 3, 7, 6, 2},
{15, 14, 12, 13, 9, 11, 10, 8, 0, 4, 5, 7, 6, 2, 3, 1},
{15, 14, 12, 13, 9, 11, 10, 8, 0, 2, 6, 4, 5, 1, 3, 7},
{15, 14, 12, 13, 9, 11, 10, 8, 0, 2, 6, 4, 5, 7, 3, 1},
{15, 14, 12, 13, 9, 11, 10, 8, 0, 2, 6, 7, 3, 1, 5, 4},
{15, 14, 12, 13, 9, 11, 10, 8, 0, 2, 3, 1, 5, 4, 6, 7},
{15, 14, 12, 13, 9, 11, 10, 8, 0, 2, 3, 1, 5, 7, 6, 4},
{15, 14, 12, 13, 9, 11, 10, 8, 0, 2, 3, 7, 6, 4, 5, 1},
{15, 14, 12, 13, 9, 11, 10, 8, 0, 1, 5, 4, 6, 2, 3, 7},
{15, 14, 12, 13, 9, 11, 10, 8, 0, 1, 5, 4, 6, 7, 3, 2},
{15, 14, 12, 13, 9, 11, 10, 8, 0, 1, 5, 7, 3, 2, 6, 4},
{15, 14, 12, 13, 9, 11, 10, 8, 0, 1, 3, 2, 6, 4, 5, 7},
{15, 14, 12, 13, 9, 11, 10, 8, 0, 1, 3, 2, 6, 7, 5, 4} and
{15, 14, 12, 13, 9, 11, 10, 8, 0, 1, 3, 7, 5, 4, 6, 2}.

49. The method of claim 1, wherein said criterion is that said maximum number of threshold voltage comparisons for dynamically reading any one of said M bits exceeds said minimum number of threshold voltages for dynamically reading any one of said M bits by at most 1.

50. The method of claim 49, wherein said maximum number of threshold voltage comparisons for dynamically reading any one of said M bits equals said minimum number of threshold voltage comparisons for dynamically reading any one of said M bits.

51. The method of claim 50, wherein M=3, and wherein 2 said threshold voltage comparisons are needed to dynamically read any one of said M bits.

52. The method of claim 50, wherein M=4 and wherein 3 said threshold voltage comparisons are needed to dynamically read any one of said M bits.

53. The method of claim 50, wherein M=3 wherein said bit ordering is one of:

{7, 6, 2, 4, 5, 1, 3, 0},
{7, 6, 2, 4, 5, 3, 1, 0},
{7, 6, 4, 2, 3, 5, 1, 0},
{7, 6, 4, 0, 2, 3, 5, 1},
{7, 6, 4, 0, 5, 1, 3, 2},
{7, 6, 5, 1, 3, 2, 4, 0},
{7, 5, 6, 2, 3, 1, 4, 0},
{7, 3, 6, 4, 5, 1, 2, 0},
{7, 3, 6, 4, 5, 1, 0, 2}.

54. The method of claim 50, wherein M=4 and wherein said bit ordering is one of:

{15, 14, 12, 8, 0, 10, 11, 3, 2, 6, 4, 13, 9, 1, 5, 7},
{15, 14, 12, 13, 9, 8, 0, 4, 6, 10, 2, 11, 3, 1, 5, 7},
{15, 14, 12, 13, 9, 8, 0, 10, 2, 6, 4, 5, 1, 11, 3, 7},
{15, 14, 12, 13, 9, 1, 5, 4, 6, 10, 8, 0, 2, 11, 3, 7},
{15, 14, 12, 13, 9, 11, 3, 10, 2, 6, 4, 8, 0, 1, 5, 7},
{15, 14, 12, 13, 9, 11, 3, 1, 5, 4, 8, 0, 10, 2, 6, 7},
{15, 14, 12, 13, 5, 9, 8, 10, 2, 6, 4, 0, 1, 11, 3, 7},
{15, 14, 12, 13, 5, 9, 1, 11, 10, 8, 0, 4, 6, 2, 3, 7},
{15, 14, 12, 13, 5, 9, 11, 10, 2, 6, 4, 8, 0, 1, 3, 7},
{15, 14, 10, 2, 6, 12, 13, 9, 11, 3, 1, 8, 0, 4, 5, 7},
{15, 14, 6, 12, 8, 0, 4, 13, 9, 11, 10, 2, 3, 1, 5, 7},
{15, 14, 6, 12, 8, 10, 11, 3, 2, 0, 4, 13, 9, 1, 5, 7},
{15, 14, 6, 12, 13, 9, 8, 10, 2, 0, 4, 5, 1, 11, 3, 7} and
{15, 14, 6, 12, 13, 9, 11, 10, 2, 8, 0, 4, 5, 1, 3, 7}.

55. The method of claim 49, wherein said maximum number of threshold voltage comparisons for dynamically reading any one of said M bits exceeds said minimum number of threshold voltage comparisons for dynamically reading any one of said M bits by 1.

56. The method of claim 55, wherein M=3, wherein said maximum number of threshold voltage comparisons for dynamically reading any one of said M bits is 3, and wherein said minimum number of threshold voltage comparisons for dynamically reading any one of said M bits is 2.

57. The method of claim 55, wherein M=4, wherein said maximum number of threshold voltage comparisons for dynamically reading any one of said M bits is 3, and wherein said minimum number of threshold voltage comparisons for dynamically reading any one of said M bits is 2.

58. The method of claim 55, wherein M=3 and wherein said bit ordering is one of:

{7, 6, 2, 4, 0, 5, 1, 3},
{7, 6, 2, 4, 0, 5, 3, 1},
{7, 6, 2, 4, 0, 3, 5, 1},
{7, 6, 2, 4, 5, 0, 1, 3},
{7, 6, 2, 4, 5, 0, 3, 1},
{7, 6, 2, 4, 5, 1, 0, 3},
{7, 6, 2, 4, 5, 3, 0, 1},
{7, 6, 2, 4, 3, 0, 5, 1},
{7, 6, 2, 4, 3, 5, 0, 1},
{7, 6, 2, 4, 3, 5, 1, 0},
{7, 6, 2, 5, 4, 0, 1, 3},
{7, 6, 2, 5, 4, 0, 3, 1},
{7, 6, 2, 5, 4, 1, 0, 3},
{7, 6, 2, 5, 4, 1, 3, 0},
{7, 6, 2, 5, 4, 3, 0, 1},
{7, 6, 2, 5, 4, 3, 1, 0},
{7, 6, 2, 5, 1, 4, 0, 3},
{7, 6, 2, 5, 1, 4, 3, 0},
{7, 6, 2, 5, 1, 3, 4, 0},
{7, 6, 2, 5, 3, 4, 0, 1},
{7, 6, 2, 5, 3, 4, 1, 0},
{7, 6, 2, 5, 3, 1, 4, 0},
{7, 6, 4, 2, 0, 5, 1, 3},
{7, 6, 4, 2, 0, 5, 3, 1},
{7, 6, 4, 2, 0, 3, 5, 1},
{7, 6, 4, 2, 5, 0, 1, 3},
{7, 6, 4, 2, 5, 0, 3, 1},
{7, 6, 4, 2, 5, 1, 0, 3},
{7, 6, 4, 2, 5, 1, 3, 0},
{7, 6, 4, 2, 5, 3, 0, 1},
{7, 6, 4, 2, 5, 3, 1, 0},
{7, 6, 4, 2, 3, 0, 5, 1},
{7, 6, 4, 2, 3, 5, 0, 1},
{7, 6, 4, 0, 2, 5, 1, 3},
{7, 6, 4, 0, 2, 5, 3, 1},
{7, 6, 4, 0, 5, 2, 1, 3},
{7, 6, 4, 0, 5, 2, 3, 1},
{7, 6, 4, 0, 5, 1, 2, 3},
{7, 6, 4, 0, 5, 3, 1, 2},
{7, 6, 4, 0, 5, 3, 2, 1},
{7, 6, 4, 0, 3, 2, 5, 1},

{7, 6, 4, 0, 3, 5, 1, 2},
{7, 6, 4, 0, 3, 5, 2, 1},
{7, 6, 4, 5, 1, 3, 2, 0},
{7, 6, 4, 3, 2, 0, 5, 1},
{7, 6, 4, 3, 2, 5, 0, 1},
{7, 6, 4, 3, 2, 5, 1, 0},
{7, 6, 4, 3, 0, 2, 5, 1},
{7, 6, 4, 3, 0, 5, 2, 1},
{7, 6, 4, 3, 0, 5, 1, 2},
{7, 6, 4, 3, 5, 2, 0, 1},
{7, 6, 4, 3, 5, 2, 1, 0},
{7, 6, 4, 3, 5, 0, 2, 1},
{7, 6, 4, 3, 5, 0, 1, 2},
{7, 6, 4, 3, 5, 1, 2, 0},
{7, 6, 4, 3, 5, 1, 0, 2},
{7, 6, 5, 2, 4, 0, 1, 3},
{7, 6, 5, 2, 4, 0, 3, 1},
{7, 6, 5, 2, 4, 1, 0, 3},
{7, 6, 5, 2, 4, 1, 3, 0},
{7, 6, 5, 2, 4, 3, 0, 1},
{7, 6, 5, 2, 4, 3, 1, 0},
{7, 6, 5, 2, 1, 4, 0, 3},
{7, 6, 5, 2, 1, 4, 3, 0},
{7, 6, 5, 2, 1, 3, 4, 0},
{7, 6, 5, 2, 3, 4, 0, 1},
{7, 6, 5, 2, 3, 4, 1, 0},
{7, 6, 5, 2, 3, 1, 4, 0},
{7, 6, 5, 1, 2, 4, 0, 3},
{7, 6, 5, 1, 2, 4, 3, 0},
{7, 6, 5, 1, 2, 3, 4, 0},
{7, 6, 5, 1, 4, 2, 0, 3},
{7, 6, 5, 1, 4, 2, 3, 0},
{7, 6, 5, 1, 4, 0, 2, 3},
{7, 6, 5, 1, 4, 0, 3, 2},
{7, 6, 5, 1, 4, 3, 2, 0},
{7, 6, 5, 1, 4, 3, 0, 2},
{7, 6, 5, 1, 3, 2, 4, 0},
{7, 6, 5, 1, 3, 4, 2, 0},
{7, 6, 5, 1, 3, 4, 0, 2},
{7, 6, 5, 3, 2, 4, 0, 1},
{7, 6, 5, 3, 2, 4, 1, 0},
{7, 6, 5, 3, 2, 1, 4, 0},
{7, 6, 5, 3, 4, 2, 0, 1},
{7, 6, 5, 3, 4, 2, 1, 0},
{7, 6, 5, 3, 4, 0, 2, 1},
{7, 6, 5, 3, 4, 0, 1, 2},
{7, 6, 5, 3, 4, 1, 2, 0},
{7, 6, 5, 3, 4, 1, 0, 2},
{7, 6, 5, 3, 1, 2, 4, 0},
{7, 6, 5, 3, 1, 4, 2, 0},
{7, 6, 5, 3, 1, 4, 0, 2},
{7, 6, 3, 4, 2, 0, 5, 1},
{7, 6, 3, 4, 2, 5, 0, 1},
{7, 6, 3, 4, 2, 5, 1, 0},
{7, 6, 3, 4, 0, 2, 5, 1},
{7, 6, 3, 4, 0, 5, 2, 1},
{7, 6, 3, 4, 0, 5, 1, 2},
{7, 6, 3, 4, 5, 2, 0, 1},
{7, 6, 3, 4, 5, 2, 1, 0},
{7, 6, 3, 4, 5, 0, 2, 1},
{7, 6, 3, 4, 5, 0, 1, 2},
{7, 6, 3, 4, 5, 1, 2, 0},
{7, 6, 3, 4, 5, 1, 0, 2},
{7, 6, 3, 5, 2, 4, 0, 1},
{7, 6, 3, 5, 2, 4, 1, 0},
{7, 6, 3, 5, 2, 1, 4, 0},
{7, 6, 3, 5, 4, 2, 0, 1},
{7, 6, 3, 5, 4, 2, 1, 0},
{7, 6, 3, 5, 4, 0, 2, 1},
{7, 6, 3, 5, 4, 0, 1, 2},
{7, 6, 3, 5, 4, 1, 2, 0},
{7, 6, 3, 5, 4, 1, 0, 2},
{7, 6, 3, 5, 1, 2, 4, 0},
{7, 6, 3, 5, 1, 4, 2, 0},
{7, 6, 3, 5, 1, 4, 0, 2},
{7, 5, 6, 2, 4, 0, 1, 3},
{7, 5, 6, 2, 4, 0, 3, 1},
{7, 5, 6, 2, 4, 1, 0, 3},
{7, 5, 6, 2, 4, 1, 3, 0},
{7, 5, 6, 2, 4, 3, 0, 1},
{7, 5, 6, 2, 4, 3, 1, 0},
{7, 5, 6, 2, 1, 4, 0, 3},
{7, 5, 6, 2, 1, 4, 3, 0},
{7, 5, 6, 2, 1, 3, 4, 0},
{7, 5, 6, 2, 3, 4, 0, 1},
{7, 5, 6, 2, 3, 4, 1, 0},
{7, 5, 6, 1, 2, 4, 0, 3},
{7, 5, 6, 1, 2, 4, 3, 0},
{7, 5, 6, 1, 2, 3, 4, 0},
{7, 5, 6, 1, 4, 2, 0, 3},
{7, 5, 6, 1, 4, 2, 3, 0},
{7, 5, 6, 1, 4, 0, 2, 3},
{7, 5, 6, 1, 4, 0, 3, 2},
{7, 5, 6, 1, 4, 3, 2, 0},
{7, 5, 6, 1, 4, 3, 0, 2},
{7, 5, 6, 1, 3, 2, 4, 0},
{7, 5, 6, 1, 3, 4, 2, 0},
{7, 5, 6, 1, 3, 4, 0, 2},
{7, 5, 6, 3, 2, 4, 0, 1},
{7, 5, 6, 3, 2, 4, 1, 0},
{7, 5, 6, 3, 2, 1, 4, 0},
{7, 5, 6, 3, 4, 2, 0, 1},
{7, 5, 6, 3, 4, 2, 1, 0},
{7, 5, 6, 3, 4, 0, 2, 1},
{7, 5, 6, 3, 4, 0, 1, 2},
{7, 5, 6, 3, 4, 1, 2, 0},
{7, 5, 6, 3, 4, 1, 0, 2},
{7, 5, 6, 3, 1, 2, 4, 0},
{7, 5, 6, 3, 1, 4, 2, 0},
{7, 5, 6, 3, 1, 4, 0, 2},
{7, 5, 1, 6, 2, 4, 0, 3},
{7, 5, 1, 6, 2, 4, 3, 0},
{7, 5, 1, 6, 2, 3, 4, 0},
{7, 5, 1, 6, 4, 2, 0, 3},
{7, 5, 1, 6, 4, 2, 3, 0},
{7, 5, 1, 6, 4, 0, 2, 3},
{7, 5, 1, 6, 4, 0, 3, 2},
{7, 5, 1, 6, 4, 3, 2, 0},
{7, 5, 1, 6, 4, 3, 0, 2},
{7, 5, 1, 6, 3, 2, 4, 0},
{7, 5, 1, 6, 3, 4, 2, 0},
{7, 5, 1, 6, 3, 4, 0, 2},
{7, 5, 3, 6, 2, 4, 0, 1},
{7, 5, 3, 6, 2, 4, 1, 0},
{7, 5, 3, 6, 2, 1, 4, 0},
{7, 5, 3, 6, 4, 2, 0, 1},
{7, 5, 3, 6, 4, 2, 1, 0},
{7, 5, 3, 6, 4, 0, 2, 1},
{7, 5, 3, 6, 4, 0, 1, 2},
{7, 5, 3, 6, 4, 1, 2, 0},
{7, 5, 3, 6, 4, 1, 0, 2},
{7, 5, 3, 6, 1, 2, 4, 0},
{7, 5, 3, 6, 1, 4, 2, 0},
{7, 5, 3, 6, 1, 4, 0, 2},

{7, 3, 6, 4, 2, 0, 5, 1},
{7, 3, 6, 4, 2, 5, 0, 1},
{7, 3, 6, 4, 2, 5, 1, 0},
{7, 3, 6, 4, 0, 2, 5, 1},
{7, 3, 6, 4, 0, 5, 2, 1},
{7, 3, 6, 4, 0, 5, 1, 2},
{7, 3, 6, 4, 5, 2, 0, 1},
{7, 3, 6, 4, 5, 2, 1, 0},
{7, 3, 6, 4, 5, 0, 2, 1},
{7, 3, 6, 4, 5, 0, 1, 2},
{7, 3, 6, 5, 2, 4, 0, 1},
{7, 3, 6, 5, 2, 4, 1, 0},
{7, 3, 6, 5, 2, 1, 4, 0},
{7, 3, 6, 5, 4, 2, 0, 1},
{7, 3, 6, 5, 4, 2, 1, 0},
{7, 3, 6, 5, 4, 0, 2, 1},
{7, 3, 6, 5, 4, 0, 1, 2},
{7, 3, 6, 5, 4, 1, 2, 0},
{7, 3, 6, 5, 4, 1, 0, 2},
{7, 3, 6, 5, 1, 2, 4, 0},
{7, 3, 6, 5, 1, 4, 2, 0},
{7, 3, 6, 5, 1, 4, 0, 2},
{7, 3, 5, 6, 2, 4, 0, 1},
{7, 3, 5, 6, 2, 4, 1, 0},
{7, 3, 5, 6, 2, 1, 4, 0},
{7, 3, 5, 6, 4, 2, 0, 1},
{7, 3, 5, 6, 4, 2, 1, 0},
{7, 3, 5, 6, 4, 0, 2, 1},
{7, 3, 5, 6, 4, 0, 1, 2},
{7, 3, 5, 6, 4, 1, 2, 0},
{7, 3, 5, 6, 4, 1, 0, 2},
{7, 3, 5, 6, 1, 2, 4, 0},
{7, 3, 5, 6, 1, 4, 2, 0} and
{7, 3, 5, 6, 1, 4, 0, 2}.

59. The method of claim 55, wherein M=4 and wherein said bit ordering is one of:

{15, 14, 12, 4, 13, 9, 8, 10, 11, 3, 2, 6, 7, 5, 1, 0},
{15, 14, 12, 13, 9, 8, 10, 2, 11, 3, 7, 6, 4, 5, 1, 0},
{15, 14, 12, 13, 9, 1, 8, 10, 11, 3, 2, 6, 7, 5, 4, 0},
{15, 14, 12, 13, 9, 11, 10, 2, 3, 7, 6, 4, 5, 1, 8, 0},
{15, 14, 12, 13, 9, 11, 3, 1, 5, 7, 6, 4, 8, 10, 2, 0},
{15, 14, 12, 13, 5, 4, 8, 9, 11, 10, 2, 6, 7, 3, 1, 0},
{15, 14, 6, 7, 13, 12, 8, 9, 11, 10, 2, 3, 1, 5, 4, 0},
{15, 13, 5, 7, 14, 12, 8, 10, 11, 9, 1, 3, 2, 6, 4, 0} and
{15, 7, 14, 12, 13, 9, 8, 10, 11, 3, 2, 6, 4, 5, 1, 0}.

60. A memory device comprising:

(a) a memory that includes K cells; and (b) a controller operative to store N bits of data in said cells by programming each said cell with up to M=⌈N/K⌉ of said bits according to a valid, nonserial bit ordering that satisfies a criterion selected from the group consisting of:

(i) a number of threshold voltage comparisons for sequentially and statically reading said M bits exceeds a minimum said number of threshold voltage comparisons by at most 1, (ii) a maximum number of threshold voltage comparisons for statically reading any one of said M bits is minimized, (iii) a minimum number of threshold voltage comparisons for statically reading any one of said M bits is minimized, (iv) a maximum number of threshold voltage comparisons for statically reading any one of said M bits exceeds a minimum number of threshold voltage comparisons for statically reading any one of said M bits by at most 1, (v) a number of threshold voltage comparisons for sequentially and dynamically reading said M bits exceeds a minimum said number of threshold voltage comparisons by at most 1, (vi) a maximum number of threshold voltage comparisons for dynamically reading any one of said M bits is minimized, (vii) a minimum number of threshold voltage comparisons for dynamically reading any one of said M bits is minimized, and (viii) a maximum number of threshold voltage comparisons for dynamically reading any one of said M bits exceeds a minimum number of threshold voltage comparisons for dynamically reading any one of said M bits by at most 1;

wherein M is at least 3.

61. A method of storing N bits of data, comprising the steps of:

(a) providing ⌈N/M⌉ cells; and (b) programming each cell with up to M of the bits according to a valid, nonserial bit ordering that satisfies a criterion selected from the group consisting of:

(i) a total number of transitions in said bit ordering is a minimum said number of transitions, (ii) said total number of transitions in said bit ordering exceeds a minimum said number of transitions by 1, (iii) a maximum said number of transitions in said bit ordering is a minimum said maximum number of transitions, (iv) a minimum said number of transitions in said bit ordering is a minimum said minimum number of transitions, (v) said bit ordering is such that all M bits have a common number of transitions, and (vi) said bit ordering is such that a number of transitions of any bit differs from a number of transitions of any other bit by at most 1;

wherein M is at least 3.

62. The method of claim 61, wherein said total number of transitions in said bit ordering is a minimum said number of transitions.

63. The method of claim 62, wherein M=3 and wherein said total number of transitions is 7.

64. The method of claim 62, wherein M=4 and wherein said total number of transitions is 15.

65. The method of claim 61, wherein said total number of transitions in said bit ordering exceeds a minimum said number of transitions by 1.

66. The method of claim 65, wherein M=3 and wherein said total number of transitions is 8.

67. The method of claim 65, wherein M=4 and wherein said total number of transitions is 16.

68. The method of claim 61, wherein said maximum number of transitions in said bit ordering is a minimum said maximum number of transitions.

69. The method of claim 68, wherein M=3 and wherein said maximum number of transitions is 3.

70. The method of claim 68, wherein M=4 and wherein said maximum number of transitions is 5.

71. The method of claim 61, wherein said minimum number of transitions in said bit ordering is a minimum said minimum number.

72. The method of claim 71, wherein said minimum number of transitions is 1.

73. The method of claim 61, wherein said bit ordering is such that all M bits have a common number of transitions.

74. The method of claim 73, wherein M=3 and wherein said common number is 3.

75. The method of claim 61, wherein said bit ordering is such that said number of transitions of any bit differs from said number of transitions of any other bit by at most 1.

76. The method of claim 75, wherein M=3 and wherein a maximum said number of transitions is 4 and a minimum said number of transitions is 3.

77. The method of claim 75, wherein M=4 and wherein a maximum said number of transitions is 5 and a minimum said number of transitions is 4.

78. A memory device comprising:

(a) a memory that includes K cells; and (b) a controller operative to store N bits of data in said cells by programming each said cell with up to $M=\lceil N/K\rceil$ of said bits according to a valid, nonserial bit ordering that satisfies a criterion selected from the group consisting of:

(i) a total number of transitions in said bit ordering is a minimum said number of transitions, (ii) said total number of transitions in said bit ordering exceeds a minimum said number of transitions by 1, (iii) a maximum said number of transitions in said bit ordering is a minimum said maximum number of transitions, (iv) a minimum said number of transitions in said bit ordering is a minimum said minimum number of transitions, (v) said bit ordering is such that all M bits have a common number of transitions, and (vi) said bit ordering is such that a number of transitions of any bit differs from a number of transitions of any other bit by at most 1;

wherein M is at least 3.

* * * * *

UNITED STATES PATENT AND TRADEMARK OFFICE

CERTIFICATE OF CORRECTION

PATENT NO. : 7,310,347 B2
APPLICATION NO. : 11/035807
DATED : December 18, 2007
INVENTOR(S) : Lasser It is certified that error appears in the above-identified patent and that said Letters Patent is hereby corrected as shown below:

Column 34, line 47 insert the following:

Appendices to the Specification

Signed and Sealed this

Thirteenth Day of January, 2009

JON W. DUDAS
*Director of the United States Patent and Trademark Office*

Appendix A - Evaluation of valid orderings for 3-bit MBC cells

| States order | 1st state | 2nd state | 3rd state | 4th state | 5th state | 6th state | 7th state | 8th state |
|---|---|---|---|---|---|---|---|---|
| 7 6 2 4 0 5 1 3 | 1 1 1 | 1 1 0 | 0 1 0 | 1 0 0 | 0 0 0 | 1 0 1 | 0 0 1 | 0 1 1 |
| 7 6 2 4 0 5 3 1 | 1 1 1 | 1 1 0 | 0 1 0 | 1 0 0 | 0 0 0 | 1 0 1 | 0 1 1 | 0 0 1 |
| 7 6 2 4 0 3 5 1 | 1 1 1 | 1 1 0 | 0 1 0 | 1 0 0 | 0 0 0 | 0 1 1 | 1 0 1 | 0 0 1 |
| 7 6 2 4 5 0 1 3 | 1 1 1 | 1 1 0 | 0 1 0 | 1 0 0 | 1 0 1 | 0 0 0 | 0 0 1 | 0 1 1 |
| 7 6 2 4 5 0 3 1 | 1 1 1 | 1 1 0 | 0 1 0 | 1 0 0 | 1 0 1 | 0 0 0 | 0 1 1 | 0 0 1 |
| 7 6 2 4 5 1 0 3 | 1 1 1 | 1 1 0 | 0 1 0 | 1 0 0 | 1 0 1 | 0 0 1 | 0 0 0 | 0 1 1 |
| 7 6 2 4 5 1 3 0 | 1 1 1 | 1 1 0 | 0 1 0 | 1 0 0 | 1 0 1 | 0 0 1 | 0 1 1 | 0 0 0 |
| 7 6 2 4 5 3 0 1 | 1 1 1 | 1 1 0 | 0 1 0 | 1 0 0 | 1 0 1 | 0 1 1 | 0 0 0 | 0 0 1 |
| 7 6 2 4 5 3 1 0 | 1 1 1 | 1 1 0 | 0 1 0 | 1 0 0 | 1 0 1 | 0 1 1 | 0 0 1 | 0 0 0 |
| 7 6 2 4 3 0 5 1 | 1 1 1 | 1 1 0 | 0 1 0 | 1 0 0 | 0 1 1 | 0 0 0 | 1 0 1 | 0 0 1 |
| 7 6 2 4 3 5 0 1 | 1 1 1 | 1 1 0 | 0 1 0 | 1 0 0 | 0 1 1 | 1 0 1 | 0 0 0 | 0 0 1 |
| 7 6 2 4 3 5 1 0 | 1 1 1 | 1 1 0 | 0 1 0 | 1 0 0 | 0 1 1 | 1 0 1 | 0 0 1 | 0 0 0 |
| 7 6 2 5 4 0 1 3 | 1 1 1 | 1 1 0 | 0 1 0 | 1 0 1 | 1 0 0 | 0 0 0 | 0 0 1 | 0 1 1 |
| 7 6 2 5 4 0 3 1 | 1 1 1 | 1 1 0 | 0 1 0 | 1 0 1 | 1 0 0 | 0 0 0 | 0 1 1 | 0 0 1 |
| 7 6 2 5 4 1 0 3 | 1 1 1 | 1 1 0 | 0 1 0 | 1 0 1 | 1 0 0 | 0 0 1 | 0 0 0 | 0 1 1 |
| 7 6 2 5 4 1 3 0 | 1 1 1 | 1 1 0 | 0 1 0 | 1 0 1 | 1 0 0 | 0 0 1 | 0 1 1 | 0 0 0 |
| 7 6 2 5 4 3 0 1 | 1 1 1 | 1 1 0 | 0 1 0 | 1 0 1 | 1 0 0 | 0 1 1 | 0 0 0 | 0 0 1 |
| 7 6 2 5 4 3 1 0 | 1 1 1 | 1 1 0 | 0 1 0 | 1 0 1 | 1 0 0 | 0 1 1 | 0 0 1 | 0 0 0 |
| 7 6 2 5 1 4 0 3 | 1 1 1 | 1 1 0 | 0 1 0 | 1 0 1 | 0 0 1 | 1 0 0 | 0 0 0 | 0 1 1 |
| 7 6 2 5 1 4 3 0 | 1 1 1 | 1 1 0 | 0 1 0 | 1 0 1 | 0 0 1 | 1 0 0 | 0 1 1 | 0 0 0 |
| 7 6 2 5 1 3 4 0 | 1 1 1 | 1 1 0 | 0 1 0 | 1 0 1 | 0 0 1 | 0 1 1 | 1 0 0 | 0 0 0 |
| 7 6 2 5 3 4 0 1 | 1 1 1 | 1 1 0 | 0 1 0 | 1 0 1 | 0 1 1 | 1 0 0 | 0 0 0 | 0 0 1 |
| 7 6 2 5 3 4 1 0 | 1 1 1 | 1 1 0 | 0 1 0 | 1 0 1 | 0 1 1 | 1 0 0 | 0 0 1 | 0 0 0 |
| 7 6 2 5 3 1 4 0 | 1 1 1 | 1 1 0 | 0 1 0 | 1 0 1 | 0 1 1 | 0 0 1 | 1 0 0 | 0 0 0 |
| 7 6 2 3 4 0 5 1 | 1 1 1 | 1 1 0 | 0 1 0 | 0 1 1 | 1 0 0 | 0 0 0 | 1 0 1 | 0 0 1 |
| 7 6 2 3 4 5 0 1 | 1 1 1 | 1 1 0 | 0 1 0 | 0 1 1 | 1 0 0 | 1 0 1 | 0 0 0 | 0 0 1 |
| 7 6 2 3 4 5 1 0 | 1 1 1 | 1 1 0 | 0 1 0 | 0 1 1 | 1 0 0 | 1 0 1 | 0 0 1 | 0 0 0 |
| 7 6 2 3 5 4 0 1 | 1 1 1 | 1 1 0 | 0 1 0 | 0 1 1 | 1 0 1 | 1 0 0 | 0 0 0 | 0 0 1 |
| 7 6 2 3 5 4 1 0 | 1 1 1 | 1 1 0 | 0 1 0 | 0 1 1 | 1 0 1 | 1 0 0 | 0 0 1 | 0 0 0 |
| 7 6 2 3 5 1 4 0 | 1 1 1 | 1 1 0 | 0 1 0 | 0 1 1 | 1 0 1 | 0 0 1 | 1 0 0 | 0 0 0 |
| 7 6 4 2 0 5 1 3 | 1 1 1 | 1 1 0 | 1 0 0 | 0 1 0 | 0 0 0 | 1 0 1 | 0 0 1 | 0 1 1 |
| 7 6 4 2 0 5 3 1 | 1 1 1 | 1 1 0 | 1 0 0 | 0 1 0 | 0 0 0 | 1 0 1 | 0 1 1 | 0 0 1 |
| 7 6 4 2 0 3 5 1 | 1 1 1 | 1 1 0 | 1 0 0 | 0 1 0 | 0 0 0 | 0 1 1 | 1 0 1 | 0 0 1 |
| 7 6 4 2 5 0 1 3 | 1 1 1 | 1 1 0 | 1 0 0 | 0 1 0 | 1 0 1 | 0 0 0 | 0 0 1 | 0 1 1 |
| 7 6 4 2 5 0 3 1 | 1 1 1 | 1 1 0 | 1 0 0 | 0 1 0 | 1 0 1 | 0 0 0 | 0 1 1 | 0 0 1 |
| 7 6 4 2 5 1 0 3 | 1 1 1 | 1 1 0 | 1 0 0 | 0 1 0 | 1 0 1 | 0 0 1 | 0 0 0 | 0 1 1 |
| 7 6 4 2 5 1 3 0 | 1 1 1 | 1 1 0 | 1 0 0 | 0 1 0 | 1 0 1 | 0 0 1 | 0 1 1 | 0 0 0 |
| 7 6 4 2 5 3 0 1 | 1 1 1 | 1 1 0 | 1 0 0 | 0 1 0 | 1 0 1 | 0 1 1 | 0 0 0 | 0 0 1 |
| 7 6 4 2 5 3 1 0 | 1 1 1 | 1 1 0 | 1 0 0 | 0 1 0 | 1 0 1 | 0 1 1 | 0 0 1 | 0 0 0 |
| 7 6 4 2 3 0 5 1 | 1 1 1 | 1 1 0 | 1 0 0 | 0 1 0 | 0 1 1 | 0 0 0 | 1 0 1 | 0 0 1 |
| 7 6 4 2 3 5 0 1 | 1 1 1 | 1 1 0 | 1 0 0 | 0 1 0 | 0 1 1 | 1 0 1 | 0 0 0 | 0 0 1 |
| 7 6 4 2 3 5 1 0 | 1 1 1 | 1 1 0 | 1 0 0 | 0 1 0 | 0 1 1 | 1 0 1 | 0 0 1 | 0 0 0 |
| 7 6 4 0 2 5 1 3 | 1 1 1 | 1 1 0 | 1 0 0 | 0 0 0 | 0 1 0 | 1 0 1 | 0 0 1 | 0 1 1 |
| 7 6 4 0 2 5 3 1 | 1 1 1 | 1 1 0 | 1 0 0 | 0 0 0 | 0 1 0 | 1 0 1 | 0 1 1 | 0 0 1 |
| 7 6 4 0 2 3 5 1 | 1 1 1 | 1 1 0 | 1 0 0 | 0 0 0 | 0 1 0 | 0 1 1 | 1 0 1 | 0 0 1 |
| 7 6 4 0 5 2 1 3 | 1 1 1 | 1 1 0 | 1 0 0 | 0 0 0 | 1 0 1 | 0 1 0 | 0 0 1 | 0 1 1 |
| 7 6 4 0 5 2 3 1 | 1 1 1 | 1 1 0 | 1 0 0 | 0 0 0 | 1 0 1 | 0 1 0 | 0 1 1 | 0 0 1 |
| 7 6 4 0 5 1 2 3 | 1 1 1 | 1 1 0 | 1 0 0 | 0 0 0 | 1 0 1 | 0 0 1 | 0 1 0 | 0 1 1 |
| 7 6 4 0 5 1 3 2 | 1 1 1 | 1 1 0 | 1 0 0 | 0 0 0 | 1 0 1 | 0 0 1 | 0 1 1 | 0 1 0 |
| 7 6 4 0 5 3 1 2 | 1 1 1 | 1 1 0 | 1 0 0 | 0 0 0 | 1 0 1 | 0 1 1 | 0 0 1 | 0 1 0 |
| 7 6 4 0 5 3 2 1 | 1 1 1 | 1 1 0 | 1 0 0 | 0 0 0 | 1 0 1 | 0 1 1 | 0 1 0 | 0 0 1 |
| 7 6 4 0 3 2 5 1 | 1 1 1 | 1 1 0 | 1 0 0 | 0 0 0 | 0 1 1 | 0 1 0 | 1 0 1 | 0 0 1 |
| 7 6 4 0 3 5 1 2 | 1 1 1 | 1 1 0 | 1 0 0 | 0 0 0 | 0 1 1 | 1 0 1 | 0 0 1 | 0 1 0 |
| 7 6 4 0 3 5 2 1 | 1 1 1 | 1 1 0 | 1 0 0 | 0 0 0 | 0 1 1 | 1 0 1 | 0 1 0 | 0 0 1 |
| 7 6 4 5 2 0 1 3 | 1 1 1 | 1 1 0 | 1 0 0 | 1 0 1 | 0 1 0 | 0 0 0 | 0 0 1 | 0 1 1 |
| 7 6 4 5 2 0 3 1 | 1 1 1 | 1 1 0 | 1 0 0 | 1 0 1 | 0 1 0 | 0 0 0 | 0 1 1 | 0 0 1 |
| 7 6 4 5 2 1 0 3 | 1 1 1 | 1 1 0 | 1 0 0 | 1 0 1 | 0 1 0 | 0 0 1 | 0 0 0 | 0 1 1 |
| 7 6 4 5 2 1 3 0 | 1 1 1 | 1 1 0 | 1 0 0 | 1 0 1 | 0 1 0 | 0 0 1 | 0 1 1 | 0 0 0 |
| 7 6 4 5 2 3 0 1 | 1 1 1 | 1 1 0 | 1 0 0 | 1 0 1 | 0 1 0 | 0 1 1 | 0 0 0 | 0 0 1 |
| 7 6 4 5 2 3 1 0 | 1 1 1 | 1 1 0 | 1 0 0 | 1 0 1 | 0 1 0 | 0 1 1 | 0 0 1 | 0 0 0 |
| 7 6 4 5 0 2 1 3 | 1 1 1 | 1 1 0 | 1 0 0 | 1 0 1 | 0 0 0 | 0 1 0 | 0 0 1 | 0 1 1 |
| 7 6 4 5 0 2 3 1 | 1 1 1 | 1 1 0 | 1 0 0 | 1 0 1 | 0 0 0 | 0 1 0 | 0 1 1 | 0 0 1 |
| 7 6 4 5 0 1 2 3 | 1 1 1 | 1 1 0 | 1 0 0 | 1 0 1 | 0 0 0 | 0 0 1 | 0 1 0 | 0 1 1 |
| 7 6 4 5 0 1 3 2 | 1 1 1 | 1 1 0 | 1 0 0 | 1 0 1 | 0 0 0 | 0 0 1 | 0 1 1 | 0 1 0 |
| 7 6 4 5 0 3 1 2 | 1 1 1 | 1 1 0 | 1 0 0 | 1 0 1 | 0 0 0 | 0 1 1 | 0 0 1 | 0 1 0 |
| 7 6 4 5 0 3 2 1 | 1 1 1 | 1 1 0 | 1 0 0 | 1 0 1 | 0 0 0 | 0 1 1 | 0 1 0 | 0 0 1 |
| 7 6 4 5 1 2 0 3 | 1 1 1 | 1 1 0 | 1 0 0 | 1 0 1 | 0 0 1 | 0 1 0 | 0 0 0 | 0 1 1 |
| 7 6 4 5 1 2 3 0 | 1 1 1 | 1 1 0 | 1 0 0 | 1 0 1 | 0 0 1 | 0 1 0 | 0 1 1 | 0 0 0 |
| 7 6 4 5 1 0 2 3 | 1 1 1 | 1 1 0 | 1 0 0 | 1 0 1 | 0 0 1 | 0 0 0 | 0 1 0 | 0 1 1 |
| 7 6 4 5 1 0 3 2 | 1 1 1 | 1 1 0 | 1 0 0 | 1 0 1 | 0 0 1 | 0 0 0 | 0 1 1 | 0 1 0 |
| 7 6 4 5 1 3 2 0 | 1 1 1 | 1 1 0 | 1 0 0 | 1 0 1 | 0 0 1 | 0 1 1 | 0 1 0 | 0 0 0 |
| 7 6 4 5 1 3 0 2 | 1 1 1 | 1 1 0 | 1 0 0 | 1 0 1 | 0 0 1 | 0 1 1 | 0 0 0 | 0 1 0 |
| 7 6 4 5 3 2 0 1 | 1 1 1 | 1 1 0 | 1 0 0 | 1 0 1 | 0 1 1 | 0 1 0 | 0 0 0 | 0 0 1 |
| 7 6 4 5 3 2 1 0 | 1 1 1 | 1 1 0 | 1 0 0 | 1 0 1 | 0 1 1 | 0 1 0 | 0 0 1 | 0 0 0 |
| 7 6 4 5 3 0 2 1 | 1 1 1 | 1 1 0 | 1 0 0 | 1 0 1 | 0 1 1 | 0 0 0 | 0 1 0 | 0 0 1 |
| 7 6 4 5 3 0 1 2 | 1 1 1 | 1 1 0 | 1 0 0 | 1 0 1 | 0 1 1 | 0 0 0 | 0 0 1 | 0 1 0 |
| 7 6 4 5 3 1 2 0 | 1 1 1 | 1 1 0 | 1 0 0 | 1 0 1 | 0 1 1 | 0 0 1 | 0 1 0 | 0 0 0 |
| 7 6 4 5 3 1 0 2 | 1 1 1 | 1 1 0 | 1 0 0 | 1 0 1 | 0 1 1 | 0 0 1 | 0 0 0 | 0 1 0 |
| 7 6 4 3 2 0 5 1 | 1 1 1 | 1 1 0 | 1 0 0 | 0 1 1 | 0 1 0 | 0 0 0 | 1 0 1 | 0 0 1 |
| 7 6 4 3 2 5 0 1 | 1 1 1 | 1 1 0 | 1 0 0 | 0 1 1 | 0 1 0 | 1 0 1 | 0 0 0 | 0 0 1 |
| 7 6 4 3 2 5 1 0 | 1 1 1 | 1 1 0 | 1 0 0 | 0 1 1 | 0 1 0 | 1 0 1 | 0 0 1 | 0 0 0 |
| 7 6 4 3 0 2 5 1 | 1 1 1 | 1 1 0 | 1 0 0 | 0 1 1 | 0 0 0 | 0 1 0 | 1 0 1 | 0 0 1 |
| 7 6 4 3 0 5 2 1 | 1 1 1 | 1 1 0 | 1 0 0 | 0 1 1 | 0 0 0 | 1 0 1 | 0 1 0 | 0 0 1 |

Appendix A - Evaluation of

| States order | Lower bit sequence | Middle bit sequence | Upper bit sequence | static comp | Y | Min | Max | dynamic comp | Y | Min | Max |
|---|---|---|---|---|---|---|---|---|---|---|---|
| 7 6 2 4 0 5 1 3 | 1 0 0 0 0 1 1 1 | 1 1 1 0 0 0 0 1 | 1 1 0 1 0 1 0 0 | 2 2 5 | 9 | 2 | 5 | 2 2 3 | 7 | 2 | 3 |
| 7 6 2 4 0 5 3 1 | 1 0 0 0 0 1 1 1 | 1 1 1 0 0 0 1 0 | 1 1 0 1 0 1 0 0 | 2 3 5 | 10 | 2 | 5 | 2 2 3 | 7 | 2 | 3 |
| 7 6 2 4 0 3 5 1 | 1 0 0 0 0 1 1 1 | 1 1 1 0 0 1 0 0 | 1 1 0 1 0 0 1 0 | 2 3 5 | 10 | 2 | 5 | 2 2 3 | 7 | 2 | 3 |
| 7 6 2 4 5 0 1 3 | 1 0 0 0 1 0 1 1 | 1 1 1 0 0 0 0 1 | 1 1 0 1 1 0 0 0 | 4 2 3 | 9 | 2 | 4 | 3 2 2 | 7 | 2 | 3 |
| 7 6 2 4 5 0 3 1 | 1 0 0 0 1 0 1 1 | 1 1 1 0 0 0 1 0 | 1 1 0 1 1 0 0 0 | 4 3 3 | 10 | 3 | 4 | 3 2 2 | 7 | 2 | 3 |
| 7 6 2 4 5 1 0 3 | 1 0 0 0 1 1 0 1 | 1 1 1 0 0 0 0 1 | 1 1 0 1 1 0 0 0 | 4 2 3 | 9 | 2 | 4 | 3 2 2 | 7 | 2 | 3 |
| 7 6 2 4 5 1 3 0 | 1 0 0 0 1 1 1 0 | 1 1 1 0 0 0 1 0 | 1 1 0 1 1 0 0 0 | 3 3 3 | 9 | 3 | 3 | 2 2 2 | 6 | 2 | 2 |
| 7 6 2 4 5 3 0 1 | 1 0 0 0 1 1 0 1 | 1 1 1 0 0 1 0 0 | 1 1 0 1 1 0 0 0 | 4 3 3 | 10 | 3 | 4 | 3 2 2 | 7 | 2 | 3 |
| 7 6 2 4 5 3 1 0 | 1 0 0 0 1 1 1 0 | 1 1 1 0 0 1 0 0 | 1 1 0 1 1 0 0 0 | 3 3 3 | 9 | 3 | 3 | 2 2 2 | 6 | 2 | 2 |
| 7 6 2 4 3 0 5 1 | 1 0 0 0 1 0 1 1 | 1 1 1 0 1 0 0 0 | 1 1 0 1 0 0 1 0 | 4 3 5 | 12 | 3 | 5 | 3 2 3 | 8 | 2 | 3 |
| 7 6 2 4 3 5 0 1 | 1 0 0 0 1 1 0 1 | 1 1 1 0 1 0 0 0 | 1 1 0 1 0 1 0 0 | 4 3 5 | 12 | 3 | 5 | 3 2 3 | 8 | 2 | 3 |
| 7 6 2 4 3 5 1 0 | 1 0 0 0 1 1 1 0 | 1 1 1 0 1 0 0 0 | 1 1 0 1 0 1 0 0 | 3 3 5 | 11 | 3 | 5 | 2 2 3 | 7 | 2 | 3 |
| 7 6 2 5 4 0 1 3 | 1 0 0 1 0 0 1 1 | 1 1 1 0 0 0 0 1 | 1 1 0 1 1 0 0 0 | 4 2 3 | 9 | 2 | 4 | 3 2 2 | 7 | 2 | 3 |
| 7 6 2 5 4 0 3 1 | 1 0 0 1 0 0 1 1 | 1 1 1 0 0 0 1 0 | 1 1 0 1 1 0 0 0 | 4 3 3 | 10 | 3 | 4 | 3 2 2 | 7 | 2 | 3 |
| 7 6 2 5 4 1 0 3 | 1 0 0 1 0 1 0 1 | 1 1 1 0 0 0 0 1 | 1 1 0 1 1 0 0 0 | 6 2 3 | 11 | 2 | 6 | 3 2 2 | 7 | 2 | 3 |
| 7 6 2 5 4 1 3 0 | 1 0 0 1 0 1 1 0 | 1 1 1 0 0 0 1 0 | 1 1 0 1 1 0 0 0 | 5 3 3 | 11 | 3 | 5 | 3 2 2 | 7 | 2 | 3 |
| 7 6 2 5 4 3 0 1 | 1 0 0 1 0 1 0 1 | 1 1 1 0 0 1 0 0 | 1 1 0 1 1 0 0 0 | 6 3 3 | 12 | 3 | 6 | 3 2 2 | 7 | 2 | 3 |
| 7 6 2 5 4 3 1 0 | 1 0 0 1 0 1 1 0 | 1 1 1 0 0 1 0 0 | 1 1 0 1 1 0 0 0 | 5 3 3 | 11 | 3 | 5 | 3 2 2 | 7 | 2 | 3 |
| 7 6 2 5 1 4 0 3 | 1 0 0 1 1 0 0 1 | 1 1 1 0 0 0 0 1 | 1 1 0 1 0 1 0 0 | 4 2 5 | 11 | 2 | 5 | 3 2 3 | 8 | 2 | 3 |
| 7 6 2 5 1 4 3 0 | 1 0 0 1 1 0 1 0 | 1 1 1 0 0 0 1 0 | 1 1 0 1 0 1 0 0 | 5 3 5 | 13 | 3 | 5 | 3 2 3 | 8 | 2 | 3 |
| 7 6 2 5 1 3 4 0 | 1 0 0 1 1 1 0 0 | 1 1 1 0 0 1 0 0 | 1 1 0 1 0 0 1 0 | 3 3 5 | 11 | 3 | 5 | 2 2 3 | 7 | 2 | 3 |
| 7 6 2 5 3 4 0 1 | 1 0 0 1 1 0 0 1 | 1 1 1 0 1 0 0 0 | 1 1 0 1 0 1 0 0 | 4 3 5 | 12 | 3 | 5 | 3 2 3 | 8 | 2 | 3 |
| 7 6 2 5 3 4 1 0 | 1 0 0 1 1 0 1 0 | 1 1 1 0 1 0 0 0 | 1 1 0 1 0 1 0 0 | 5 3 5 | 13 | 3 | 5 | 3 2 3 | 8 | 2 | 3 |
| 7 6 2 5 3 1 4 0 | 1 0 0 1 1 1 0 0 | 1 1 1 0 1 0 0 0 | 1 1 0 1 0 0 1 0 | 3 3 5 | 11 | 3 | 5 | 2 2 3 | 7 | 2 | 3 |
| 7 6 2 3 4 0 5 1 | 1 0 0 1 0 0 1 1 | 1 1 1 1 0 0 0 0 | 1 1 0 0 1 0 1 0 | 4 1 5 | 10 | 1 | 5 | 3 1 3 | 7 | 1 | 3 |
| 7 6 2 3 4 5 0 1 | 1 0 0 1 0 1 0 1 | 1 1 1 1 0 0 0 0 | 1 1 0 0 1 1 0 0 | 6 1 3 | 10 | 1 | 6 | 3 1 2 | 6 | 1 | 3 |
| 7 6 2 3 4 5 1 0 | 1 0 0 1 0 1 1 0 | 1 1 1 1 0 0 0 0 | 1 1 0 0 1 1 0 0 | 5 1 3 | 9 | 1 | 5 | 3 1 2 | 6 | 1 | 3 |
| 7 6 2 3 5 4 0 1 | 1 0 0 1 1 0 0 1 | 1 1 1 1 0 0 0 0 | 1 1 0 0 1 1 0 0 | 4 1 3 | 8 | 1 | 4 | 3 1 2 | 6 | 1 | 3 |
| 7 6 2 3 5 4 1 0 | 1 0 0 1 1 0 1 0 | 1 1 1 1 0 0 0 0 | 1 1 0 0 1 1 0 0 | 5 1 3 | 9 | 1 | 5 | 3 1 2 | 6 | 1 | 3 |
| 7 6 2 3 5 1 4 0 | 1 0 0 1 1 1 0 0 | 1 1 1 1 0 0 0 0 | 1 1 0 0 1 0 1 0 | 3 1 5 | 9 | 1 | 5 | 2 1 3 | 6 | 1 | 3 |
| 7 6 4 2 0 5 1 3 | 1 0 0 0 0 1 1 1 | 1 1 0 1 0 0 0 1 | 1 1 1 0 0 1 0 0 | 2 4 3 | 9 | 2 | 4 | 2 3 2 | 7 | 2 | 3 |
| 7 6 4 2 0 5 3 1 | 1 0 0 0 0 1 1 1 | 1 1 0 1 0 0 1 0 | 1 1 1 0 0 1 0 0 | 2 5 3 | 10 | 2 | 5 | 2 3 2 | 7 | 2 | 3 |
| 7 6 4 2 0 3 5 1 | 1 0 0 0 0 1 1 1 | 1 1 0 1 0 1 0 0 | 1 1 1 0 0 0 1 0 | 2 5 3 | 10 | 2 | 5 | 2 3 2 | 7 | 2 | 3 |
| 7 6 4 2 5 0 1 3 | 1 0 0 0 1 0 1 1 | 1 1 0 1 0 0 0 1 | 1 1 1 0 1 0 0 0 | 4 4 3 | 11 | 3 | 4 | 3 3 2 | 8 | 2 | 3 |
| 7 6 4 2 5 0 3 1 | 1 0 0 0 1 0 1 1 | 1 1 0 1 0 0 1 0 | 1 1 1 0 1 0 0 0 | 4 5 3 | 12 | 3 | 5 | 3 3 2 | 8 | 2 | 3 |
| 7 6 4 2 5 1 0 3 | 1 0 0 0 1 1 0 1 | 1 1 0 1 0 0 0 1 | 1 1 1 0 1 0 0 0 | 4 4 3 | 11 | 3 | 4 | 3 3 2 | 8 | 2 | 3 |
| 7 6 4 2 5 1 3 0 | 1 0 0 0 1 1 1 0 | 1 1 0 1 0 0 1 0 | 1 1 1 0 1 0 0 0 | 3 5 3 | 11 | 3 | 5 | 2 3 2 | 7 | 2 | 3 |
| 7 6 4 2 5 3 0 1 | 1 0 0 0 1 1 0 1 | 1 1 0 1 0 1 0 0 | 1 1 1 0 1 0 0 0 | 4 5 3 | 12 | 3 | 5 | 3 3 2 | 8 | 2 | 3 |
| 7 6 4 2 5 3 1 0 | 1 0 0 0 1 1 1 0 | 1 1 0 1 0 1 0 0 | 1 1 1 0 1 0 0 0 | 3 5 3 | 11 | 3 | 5 | 2 3 2 | 7 | 2 | 3 |
| 7 6 4 2 3 0 5 1 | 1 0 0 0 1 0 1 1 | 1 1 0 1 1 0 0 0 | 1 1 1 0 0 0 1 0 | 4 3 3 | 10 | 3 | 4 | 3 2 2 | 7 | 2 | 3 |
| 7 6 4 2 3 5 0 1 | 1 0 0 0 1 1 0 1 | 1 1 0 1 1 0 0 0 | 1 1 1 0 0 1 0 0 | 4 3 3 | 10 | 3 | 4 | 3 2 2 | 7 | 2 | 3 |
| 7 6 4 2 3 5 1 0 | 1 0 0 0 1 1 1 0 | 1 1 0 1 1 0 0 0 | 1 1 1 0 0 1 0 0 | 3 3 3 | 9 | 3 | 3 | 2 2 2 | 6 | 2 | 2 |
| 7 6 4 0 2 5 1 3 | 1 0 0 0 0 1 1 1 | 1 1 0 0 1 0 0 1 | 1 1 1 0 0 1 0 0 | 2 4 3 | 9 | 2 | 4 | 2 3 2 | 7 | 2 | 3 |
| 7 6 4 0 2 5 3 1 | 1 0 0 0 0 1 1 1 | 1 1 0 0 1 0 1 0 | 1 1 1 0 0 1 0 0 | 2 5 3 | 10 | 2 | 5 | 2 3 2 | 7 | 2 | 3 |
| 7 6 4 0 2 3 5 1 | 1 0 0 0 0 1 1 1 | 1 1 0 0 1 1 0 0 | 1 1 1 0 0 0 1 0 | 2 3 3 | 8 | 2 | 3 | 2 2 2 | 6 | 2 | 2 |
| 7 6 4 0 5 2 1 3 | 1 0 0 0 1 0 1 1 | 1 1 0 0 0 1 0 1 | 1 1 1 0 1 0 0 0 | 4 4 3 | 11 | 3 | 4 | 3 3 2 | 8 | 2 | 3 |
| 7 6 4 0 5 2 3 1 | 1 0 0 0 1 0 1 1 | 1 1 0 0 0 1 1 0 | 1 1 1 0 1 0 0 0 | 4 3 3 | 10 | 3 | 4 | 3 2 2 | 7 | 2 | 3 |
| 7 6 4 0 5 1 2 3 | 1 0 0 0 1 1 0 1 | 1 1 0 0 0 0 1 1 | 1 1 1 0 1 0 0 0 | 4 2 3 | 9 | 2 | 4 | 3 2 2 | 7 | 2 | 3 |
| 7 6 4 0 5 1 3 2 | 1 0 0 0 1 1 1 0 | 1 1 0 0 0 0 1 1 | 1 1 1 0 1 0 0 0 | 3 2 3 | 8 | 2 | 3 | 2 2 2 | 6 | 2 | 2 |
| 7 6 4 0 5 3 1 2 | 1 0 0 0 1 1 1 0 | 1 1 0 0 0 1 0 1 | 1 1 1 0 1 0 0 0 | 3 4 3 | 10 | 3 | 4 | 2 3 2 | 7 | 2 | 3 |
| 7 6 4 0 5 3 2 1 | 1 0 0 0 1 1 0 1 | 1 1 0 0 0 1 1 0 | 1 1 1 0 1 0 0 0 | 4 3 3 | 10 | 3 | 4 | 3 2 2 | 7 | 2 | 3 |
| 7 6 4 0 3 2 5 1 | 1 0 0 0 1 0 1 1 | 1 1 0 0 1 1 0 0 | 1 1 1 0 0 0 1 0 | 4 3 3 | 10 | 3 | 4 | 3 2 2 | 7 | 2 | 3 |
| 7 6 4 0 3 5 1 2 | 1 0 0 0 1 1 1 0 | 1 1 0 0 1 0 0 1 | 1 1 1 0 0 1 0 0 | 3 4 3 | 10 | 3 | 4 | 2 3 2 | 7 | 2 | 3 |
| 7 6 4 0 3 5 2 1 | 1 0 0 0 1 1 0 1 | 1 1 0 0 1 0 1 0 | 1 1 1 0 0 1 0 0 | 4 5 3 | 12 | 3 | 5 | 3 3 2 | 8 | 2 | 3 |
| 7 6 4 5 2 0 1 3 | 1 0 0 1 0 0 1 1 | 1 1 0 0 1 0 0 1 | 1 1 1 1 0 0 0 0 | 4 4 1 | 9 | 1 | 4 | 3 3 1 | 7 | 1 | 3 |
| 7 6 4 5 2 0 3 1 | 1 0 0 1 0 0 1 1 | 1 1 0 0 1 0 1 0 | 1 1 1 1 0 0 0 0 | 4 5 1 | 10 | 1 | 5 | 3 3 1 | 7 | 1 | 3 |
| 7 6 4 5 2 1 0 3 | 1 0 0 1 0 1 0 1 | 1 1 0 0 1 0 0 1 | 1 1 1 1 0 0 0 0 | 6 4 1 | 11 | 1 | 6 | 3 3 1 | 7 | 1 | 3 |
| 7 6 4 5 2 1 3 0 | 1 0 0 1 0 1 1 0 | 1 1 0 0 1 0 1 0 | 1 1 1 1 0 0 0 0 | 5 5 1 | 11 | 1 | 5 | 3 3 1 | 7 | 1 | 3 |
| 7 6 4 5 2 3 0 1 | 1 0 0 1 0 1 0 1 | 1 1 0 0 1 1 0 0 | 1 1 1 1 0 0 0 0 | 6 3 1 | 10 | 1 | 6 | 3 2 1 | 6 | 1 | 3 |
| 7 6 4 5 2 3 1 0 | 1 0 0 1 0 1 1 0 | 1 1 0 0 1 1 0 0 | 1 1 1 1 0 0 0 0 | 5 3 1 | 9 | 1 | 5 | 3 2 1 | 6 | 1 | 3 |
| 7 6 4 5 0 2 1 3 | 1 0 0 1 0 0 1 1 | 1 1 0 0 0 1 0 1 | 1 1 1 1 0 0 0 0 | 4 4 1 | 9 | 1 | 4 | 3 3 1 | 7 | 1 | 3 |
| 7 6 4 5 0 2 3 1 | 1 0 0 1 0 0 1 1 | 1 1 0 0 0 1 1 0 | 1 1 1 1 0 0 0 0 | 4 3 1 | 8 | 1 | 4 | 3 2 1 | 6 | 1 | 3 |
| 7 6 4 5 0 1 2 3 | 1 0 0 1 0 1 0 1 | 1 1 0 0 0 0 1 1 | 1 1 1 1 0 0 0 0 | 6 2 1 | 9 | 1 | 6 | 3 2 1 | 6 | 1 | 3 |
| 7 6 4 5 0 1 3 2 | 1 0 0 1 0 1 1 0 | 1 1 0 0 0 0 1 1 | 1 1 1 1 0 0 0 0 | 5 2 1 | 8 | 1 | 5 | 3 2 1 | 6 | 1 | 3 |
| 7 6 4 5 0 3 1 2 | 1 0 0 1 0 1 1 0 | 1 1 0 0 0 1 0 1 | 1 1 1 1 0 0 0 0 | 5 4 1 | 10 | 1 | 5 | 3 3 1 | 7 | 1 | 3 |
| 7 6 4 5 0 3 2 1 | 1 0 0 1 0 1 0 1 | 1 1 0 0 0 1 1 0 | 1 1 1 1 0 0 0 0 | 6 3 1 | 10 | 1 | 6 | 3 2 1 | 6 | 1 | 3 |
| 7 6 4 5 1 2 0 3 | 1 0 0 1 1 0 0 1 | 1 1 0 0 0 1 0 1 | 1 1 1 1 0 0 0 0 | 4 4 1 | 9 | 1 | 4 | 3 3 1 | 7 | 1 | 3 |
| 7 6 4 5 1 2 3 0 | 1 0 0 1 1 0 1 0 | 1 1 0 0 0 1 1 0 | 1 1 1 1 0 0 0 0 | 5 3 1 | 9 | 1 | 5 | 3 2 1 | 6 | 1 | 3 |
| 7 6 4 5 1 0 2 3 | 1 0 0 1 1 0 0 1 | 1 1 0 0 0 0 1 1 | 1 1 1 1 0 0 0 0 | 4 2 1 | 7 | 1 | 4 | 3 2 1 | 6 | 1 | 3 |
| 7 6 4 5 1 0 3 2 | 1 0 0 1 1 0 1 0 | 1 1 0 0 0 0 1 1 | 1 1 1 1 0 0 0 0 | 5 2 1 | 8 | 1 | 5 | 3 2 1 | 6 | 1 | 3 |
| 7 6 4 5 1 3 2 0 | 1 0 0 1 1 1 0 0 | 1 1 0 0 0 1 1 0 | 1 1 1 1 0 0 0 0 | 3 3 1 | 7 | 1 | 3 | 2 2 1 | 5 | 1 | 2 |
| 7 6 4 5 1 3 0 2 | 1 0 0 1 1 1 0 0 | 1 1 0 0 0 1 0 1 | 1 1 1 1 0 0 0 0 | 3 4 1 | 8 | 1 | 4 | 2 3 1 | 6 | 1 | 3 |
| 7 6 4 5 3 2 0 1 | 1 0 0 1 1 0 0 1 | 1 1 0 0 1 1 0 0 | 1 1 1 1 0 0 0 0 | 4 3 1 | 8 | 1 | 4 | 3 2 1 | 6 | 1 | 3 |
| 7 6 4 5 3 2 1 0 | 1 0 0 1 1 0 1 0 | 1 1 0 0 1 1 0 0 | 1 1 1 1 0 0 0 0 | 5 3 1 | 9 | 1 | 5 | 3 2 1 | 6 | 1 | 3 |
| 7 6 4 5 3 0 2 1 | 1 0 0 1 1 0 0 1 | 1 1 0 0 1 0 1 0 | 1 1 1 1 0 0 0 0 | 4 5 1 | 10 | 1 | 5 | 3 3 1 | 7 | 1 | 3 |
| 7 6 4 5 3 0 1 2 | 1 0 0 1 1 0 1 0 | 1 1 0 0 1 0 0 1 | 1 1 1 1 0 0 0 0 | 5 4 1 | 10 | 1 | 5 | 3 3 1 | 7 | 1 | 3 |
| 7 6 4 5 3 1 2 0 | 1 0 0 1 1 1 0 0 | 1 1 0 0 1 0 1 0 | 1 1 1 1 0 0 0 0 | 3 5 1 | 9 | 1 | 5 | 2 3 1 | 6 | 1 | 3 |
| 7 6 4 5 3 1 0 2 | 1 0 0 1 1 1 0 0 | 1 1 0 0 1 0 0 1 | 1 1 1 1 0 0 0 0 | 3 4 1 | 8 | 1 | 4 | 2 3 1 | 6 | 1 | 3 |
| 7 6 4 3 2 0 5 1 | 1 0 0 1 0 0 1 1 | 1 1 0 1 1 0 0 0 | 1 1 1 0 0 0 1 0 | 4 3 3 | 10 | 3 | 4 | 3 2 2 | 7 | 2 | 3 |
| 7 6 4 3 2 5 0 1 | 1 0 0 1 0 1 0 1 | 1 1 0 1 1 0 0 0 | 1 1 1 0 0 1 0 0 | 6 3 3 | 12 | 3 | 6 | 3 2 2 | 7 | 2 | 3 |
| 7 6 4 3 2 5 1 0 | 1 0 0 1 0 1 1 0 | 1 1 0 1 1 0 0 0 | 1 1 1 0 0 1 0 0 | 5 3 3 | 11 | 3 | 5 | 3 2 2 | 7 | 2 | 3 |
| 7 6 4 3 0 2 5 1 | 1 0 0 1 0 0 1 1 | 1 1 0 1 0 1 0 0 | 1 1 1 0 0 0 1 0 | 4 5 3 | 12 | 3 | 5 | 3 3 2 | 8 | 2 | 3 |
| 7 6 4 3 0 5 2 1 | 1 0 0 1 0 1 0 1 | 1 1 0 1 0 0 1 0 | 1 1 1 0 0 1 0 0 | 6 5 3 | 14 | 3 | 6 | 3 3 2 | 8 | 2 | 3 |

Appendix A - Evaluation of valid orderings for 3-bit MBC cells

| States order | 1st state | 2nd state | 3rd state | 4th state | 5th state | 6th state | 7th state | 8th state |
|---|---|---|---|---|---|---|---|---|
| 7 6 4 3 0 5 1 2 | 1 1 1 | 1 1 0 | 1 0 0 | 0 1 1 | 0 0 0 | 1 0 1 | 0 0 1 | 0 1 0 |
| 7 6 4 3 5 2 0 1 | 1 1 1 | 1 1 0 | 1 0 0 | 0 1 1 | 1 0 1 | 0 1 0 | 0 0 0 | 0 0 1 |
| 7 6 4 3 5 2 1 0 | 1 1 1 | 1 1 0 | 1 0 0 | 0 1 1 | 1 0 1 | 0 1 0 | 0 0 1 | 0 0 0 |
| 7 6 4 3 5 0 2 1 | 1 1 1 | 1 1 0 | 1 0 0 | 0 1 1 | 1 0 1 | 0 0 0 | 0 1 0 | 0 0 1 |
| 7 6 4 3 5 0 1 2 | 1 1 1 | 1 1 0 | 1 0 0 | 0 1 1 | 1 0 1 | 0 0 0 | 0 0 1 | 0 1 0 |
| 7 6 4 3 5 1 2 0 | 1 1 1 | 1 1 0 | 1 0 0 | 0 1 1 | 1 0 1 | 0 0 1 | 0 1 0 | 0 0 0 |
| 7 6 4 3 5 1 0 2 | 1 1 1 | 1 1 0 | 1 0 0 | 0 1 1 | 1 0 1 | 0 0 1 | 0 0 0 | 0 1 0 |
| 7 6 5 2 4 0 1 3 | 1 1 1 | 1 1 0 | 1 0 1 | 0 1 0 | 1 0 0 | 0 0 0 | 0 0 1 | 0 1 1 |
| 7 6 5 2 4 0 3 1 | 1 1 1 | 1 1 0 | 1 0 1 | 0 1 0 | 1 0 0 | 0 0 0 | 0 1 1 | 0 0 1 |
| 7 6 5 2 4 1 0 3 | 1 1 1 | 1 1 0 | 1 0 1 | 0 1 0 | 1 0 0 | 0 0 1 | 0 0 0 | 0 1 1 |
| 7 6 5 2 4 1 3 0 | 1 1 1 | 1 1 0 | 1 0 1 | 0 1 0 | 1 0 0 | 0 0 1 | 0 1 1 | 0 0 0 |
| 7 6 5 2 4 3 0 1 | 1 1 1 | 1 1 0 | 1 0 1 | 0 1 0 | 1 0 0 | 0 1 1 | 0 0 0 | 0 0 1 |
| 7 6 5 2 4 3 1 0 | 1 1 1 | 1 1 0 | 1 0 1 | 0 1 0 | 1 0 0 | 0 1 1 | 0 0 1 | 0 0 0 |
| 7 6 5 2 1 4 0 3 | 1 1 1 | 1 1 0 | 1 0 1 | 0 1 0 | 0 0 1 | 1 0 0 | 0 0 0 | 0 1 1 |
| 7 6 5 2 1 4 3 0 | 1 1 1 | 1 1 0 | 1 0 1 | 0 1 0 | 0 0 1 | 1 0 0 | 0 1 1 | 0 0 0 |
| 7 6 5 2 1 3 4 0 | 1 1 1 | 1 1 0 | 1 0 1 | 0 1 0 | 0 0 1 | 0 1 1 | 1 0 0 | 0 0 0 |
| 7 6 5 2 3 4 0 1 | 1 1 1 | 1 1 0 | 1 0 1 | 0 1 0 | 0 1 1 | 1 0 0 | 0 0 0 | 0 0 1 |
| 7 6 5 2 3 4 1 0 | 1 1 1 | 1 1 0 | 1 0 1 | 0 1 0 | 0 1 1 | 1 0 0 | 0 0 1 | 0 0 0 |
| 7 6 5 2 3 1 4 0 | 1 1 1 | 1 1 0 | 1 0 1 | 0 1 0 | 0 1 1 | 0 0 1 | 1 0 0 | 0 0 0 |
| 7 6 5 4 2 0 1 3 | 1 1 1 | 1 1 0 | 1 0 1 | 1 0 0 | 0 1 0 | 0 0 0 | 0 0 1 | 0 1 1 |
| 7 6 5 4 2 0 3 1 | 1 1 1 | 1 1 0 | 1 0 1 | 1 0 0 | 0 1 0 | 0 0 0 | 0 1 1 | 0 0 1 |
| 7 6 5 4 2 1 0 3 | 1 1 1 | 1 1 0 | 1 0 1 | 1 0 0 | 0 1 0 | 0 0 1 | 0 0 0 | 0 1 1 |
| 7 6 5 4 2 1 3 0 | 1 1 1 | 1 1 0 | 1 0 1 | 1 0 0 | 0 1 0 | 0 0 1 | 0 1 1 | 0 0 0 |
| 7 6 5 4 2 3 0 1 | 1 1 1 | 1 1 0 | 1 0 1 | 1 0 0 | 0 1 0 | 0 1 1 | 0 0 0 | 0 0 1 |
| 7 6 5 4 2 3 1 0 | 1 1 1 | 1 1 0 | 1 0 1 | 1 0 0 | 0 1 0 | 0 1 1 | 0 0 1 | 0 0 0 |
| 7 6 5 4 0 2 1 3 | 1 1 1 | 1 1 0 | 1 0 1 | 1 0 0 | 0 0 0 | 0 1 0 | 0 0 1 | 0 1 1 |
| 7 6 5 4 0 2 3 1 | 1 1 1 | 1 1 0 | 1 0 1 | 1 0 0 | 0 0 0 | 0 1 0 | 0 1 1 | 0 0 1 |
| 7 6 5 4 0 1 2 3 | 1 1 1 | 1 1 0 | 1 0 1 | 1 0 0 | 0 0 0 | 0 0 1 | 0 1 0 | 0 1 1 |
| 7 6 5 4 0 1 3 2 | 1 1 1 | 1 1 0 | 1 0 1 | 1 0 0 | 0 0 0 | 0 0 1 | 0 1 1 | 0 1 0 |
| 7 6 5 4 0 3 1 2 | 1 1 1 | 1 1 0 | 1 0 1 | 1 0 0 | 0 0 0 | 0 1 1 | 0 0 1 | 0 1 0 |
| 7 6 5 4 0 3 2 1 | 1 1 1 | 1 1 0 | 1 0 1 | 1 0 0 | 0 0 0 | 0 1 1 | 0 1 0 | 0 0 1 |
| 7 6 5 4 1 2 0 3 | 1 1 1 | 1 1 0 | 1 0 1 | 1 0 0 | 0 0 1 | 0 1 0 | 0 0 0 | 0 1 1 |
| 7 6 5 4 1 2 3 0 | 1 1 1 | 1 1 0 | 1 0 1 | 1 0 0 | 0 0 1 | 0 1 0 | 0 1 1 | 0 0 0 |
| 7 6 5 4 1 0 2 3 | 1 1 1 | 1 1 0 | 1 0 1 | 1 0 0 | 0 0 1 | 0 0 0 | 0 1 0 | 0 1 1 |
| 7 6 5 4 1 0 3 2 | 1 1 1 | 1 1 0 | 1 0 1 | 1 0 0 | 0 0 1 | 0 0 0 | 0 1 1 | 0 1 0 |
| 7 6 5 4 1 3 2 0 | 1 1 1 | 1 1 0 | 1 0 1 | 1 0 0 | 0 0 1 | 0 1 1 | 0 1 0 | 0 0 0 |
| 7 6 5 4 1 3 0 2 | 1 1 1 | 1 1 0 | 1 0 1 | 1 0 0 | 0 0 1 | 0 1 1 | 0 0 0 | 0 1 0 |
| 7 6 5 4 3 2 0 1 | 1 1 1 | 1 1 0 | 1 0 1 | 1 0 0 | 0 1 1 | 0 1 0 | 0 0 0 | 0 0 1 |
| 7 6 5 4 3 2 1 0 | 1 1 1 | 1 1 0 | 1 0 1 | 1 0 0 | 0 1 1 | 0 1 0 | 0 0 1 | 0 0 0 |
| 7 6 5 4 3 0 2 1 | 1 1 1 | 1 1 0 | 1 0 1 | 1 0 0 | 0 1 1 | 0 0 0 | 0 1 0 | 0 0 1 |
| 7 6 5 4 3 0 1 2 | 1 1 1 | 1 1 0 | 1 0 1 | 1 0 0 | 0 1 1 | 0 0 0 | 0 0 1 | 0 1 0 |
| 7 6 5 4 3 1 2 0 | 1 1 1 | 1 1 0 | 1 0 1 | 1 0 0 | 0 1 1 | 0 0 1 | 0 1 0 | 0 0 0 |
| 7 6 5 4 3 1 0 2 | 1 1 1 | 1 1 0 | 1 0 1 | 1 0 0 | 0 1 1 | 0 0 1 | 0 0 0 | 0 1 0 |
| 7 6 5 1 2 4 0 3 | 1 1 1 | 1 1 0 | 1 0 1 | 0 0 1 | 0 1 0 | 1 0 0 | 0 0 0 | 0 1 1 |
| 7 6 5 1 2 4 3 0 | 1 1 1 | 1 1 0 | 1 0 1 | 0 0 1 | 0 1 0 | 1 0 0 | 0 1 1 | 0 0 0 |
| 7 6 5 1 2 3 4 0 | 1 1 1 | 1 1 0 | 1 0 1 | 0 0 1 | 0 1 0 | 0 1 1 | 1 0 0 | 0 0 0 |
| 7 6 5 1 4 2 0 3 | 1 1 1 | 1 1 0 | 1 0 1 | 0 0 1 | 1 0 0 | 0 1 0 | 0 0 0 | 0 1 1 |
| 7 6 5 1 4 2 3 0 | 1 1 1 | 1 1 0 | 1 0 1 | 0 0 1 | 1 0 0 | 0 1 0 | 0 1 1 | 0 0 0 |
| 7 6 5 1 4 0 2 3 | 1 1 1 | 1 1 0 | 1 0 1 | 0 0 1 | 1 0 0 | 0 0 0 | 0 1 0 | 0 1 1 |
| 7 6 5 1 4 0 3 2 | 1 1 1 | 1 1 0 | 1 0 1 | 0 0 1 | 1 0 0 | 0 0 0 | 0 1 1 | 0 1 0 |
| 7 6 5 1 4 3 2 0 | 1 1 1 | 1 1 0 | 1 0 1 | 0 0 1 | 1 0 0 | 0 1 1 | 0 1 0 | 0 0 0 |
| 7 6 5 1 4 3 0 2 | 1 1 1 | 1 1 0 | 1 0 1 | 0 0 1 | 1 0 0 | 0 1 1 | 0 0 0 | 0 1 0 |
| 7 6 5 1 3 2 4 0 | 1 1 1 | 1 1 0 | 1 0 1 | 0 0 1 | 0 1 1 | 0 1 0 | 1 0 0 | 0 0 0 |
| 7 6 5 1 3 4 2 0 | 1 1 1 | 1 1 0 | 1 0 1 | 0 0 1 | 0 1 1 | 1 0 0 | 0 1 0 | 0 0 0 |
| 7 6 5 1 3 4 0 2 | 1 1 1 | 1 1 0 | 1 0 1 | 0 0 1 | 0 1 1 | 1 0 0 | 0 0 0 | 0 1 0 |
| 7 6 5 3 2 4 0 1 | 1 1 1 | 1 1 0 | 1 0 1 | 0 1 1 | 0 1 0 | 1 0 0 | 0 0 0 | 0 0 1 |
| 7 6 5 3 2 4 1 0 | 1 1 1 | 1 1 0 | 1 0 1 | 0 1 1 | 0 1 0 | 1 0 0 | 0 0 1 | 0 0 0 |
| 7 6 5 3 2 1 4 0 | 1 1 1 | 1 1 0 | 1 0 1 | 0 1 1 | 0 1 0 | 0 0 1 | 1 0 0 | 0 0 0 |
| 7 6 5 3 4 2 0 1 | 1 1 1 | 1 1 0 | 1 0 1 | 0 1 1 | 1 0 0 | 0 1 0 | 0 0 0 | 0 0 1 |
| 7 6 5 3 4 2 1 0 | 1 1 1 | 1 1 0 | 1 0 1 | 0 1 1 | 1 0 0 | 0 1 0 | 0 0 1 | 0 0 0 |
| 7 6 5 3 4 0 2 1 | 1 1 1 | 1 1 0 | 1 0 1 | 0 1 1 | 1 0 0 | 0 0 0 | 0 1 0 | 0 0 1 |
| 7 6 5 3 4 0 1 2 | 1 1 1 | 1 1 0 | 1 0 1 | 0 1 1 | 1 0 0 | 0 0 0 | 0 0 1 | 0 1 0 |
| 7 6 5 3 4 1 2 0 | 1 1 1 | 1 1 0 | 1 0 1 | 0 1 1 | 1 0 0 | 0 0 1 | 0 1 0 | 0 0 0 |
| 7 6 5 3 4 1 0 2 | 1 1 1 | 1 1 0 | 1 0 1 | 0 1 1 | 1 0 0 | 0 0 1 | 0 0 0 | 0 1 0 |
| 7 6 5 3 1 2 4 0 | 1 1 1 | 1 1 0 | 1 0 1 | 0 1 1 | 0 0 1 | 0 1 0 | 1 0 0 | 0 0 0 |
| 7 6 5 3 1 4 2 0 | 1 1 1 | 1 1 0 | 1 0 1 | 0 1 1 | 0 0 1 | 1 0 0 | 0 1 0 | 0 0 0 |
| 7 6 5 3 1 4 0 2 | 1 1 1 | 1 1 0 | 1 0 1 | 0 1 1 | 0 0 1 | 1 0 0 | 0 0 0 | 0 1 0 |
| 7 6 3 2 4 0 5 1 | 1 1 1 | 1 1 0 | 0 1 1 | 0 1 0 | 1 0 0 | 0 0 0 | 1 0 1 | 0 0 1 |
| 7 6 3 2 4 5 0 1 | 1 1 1 | 1 1 0 | 0 1 1 | 0 1 0 | 1 0 0 | 1 0 1 | 0 0 0 | 0 0 1 |
| 7 6 3 2 4 5 1 0 | 1 1 1 | 1 1 0 | 0 1 1 | 0 1 0 | 1 0 0 | 1 0 1 | 0 0 1 | 0 0 0 |
| 7 6 3 2 5 4 0 1 | 1 1 1 | 1 1 0 | 0 1 1 | 0 1 0 | 1 0 1 | 1 0 0 | 0 0 0 | 0 0 1 |
| 7 6 3 2 5 4 1 0 | 1 1 1 | 1 1 0 | 0 1 1 | 0 1 0 | 1 0 1 | 1 0 0 | 0 0 1 | 0 0 0 |
| 7 6 3 2 5 1 4 0 | 1 1 1 | 1 1 0 | 0 1 1 | 0 1 0 | 1 0 1 | 0 0 1 | 1 0 0 | 0 0 0 |
| 7 6 3 4 2 0 5 1 | 1 1 1 | 1 1 0 | 0 1 1 | 1 0 0 | 0 1 0 | 0 0 0 | 1 0 1 | 0 0 1 |
| 7 6 3 4 2 5 0 1 | 1 1 1 | 1 1 0 | 0 1 1 | 1 0 0 | 0 1 0 | 1 0 1 | 0 0 0 | 0 0 1 |
| 7 6 3 4 2 5 1 0 | 1 1 1 | 1 1 0 | 0 1 1 | 1 0 0 | 0 1 0 | 1 0 1 | 0 0 1 | 0 0 0 |
| 7 6 3 4 0 2 5 1 | 1 1 1 | 1 1 0 | 0 1 1 | 1 0 0 | 0 0 0 | 0 1 0 | 1 0 1 | 0 0 1 |
| 7 6 3 4 0 5 2 1 | 1 1 1 | 1 1 0 | 0 1 1 | 1 0 0 | 0 0 0 | 1 0 1 | 0 1 0 | 0 0 1 |
| 7 6 3 4 0 5 1 2 | 1 1 1 | 1 1 0 | 0 1 1 | 1 0 0 | 0 0 0 | 1 0 1 | 0 0 1 | 0 1 0 |
| 7 6 3 4 5 2 0 1 | 1 1 1 | 1 1 0 | 0 1 1 | 1 0 0 | 1 0 1 | 0 1 0 | 0 0 0 | 0 0 1 |
| 7 6 3 4 5 2 1 0 | 1 1 1 | 1 1 0 | 0 1 1 | 1 0 0 | 1 0 1 | 0 1 0 | 0 0 1 | 0 0 0 |
| 7 6 3 4 5 0 2 1 | 1 1 1 | 1 1 0 | 0 1 1 | 1 0 0 | 1 0 1 | 0 0 0 | 0 1 0 | 0 0 1 |
| 7 6 3 4 5 0 1 2 | 1 1 1 | 1 1 0 | 0 1 1 | 1 0 0 | 1 0 1 | 0 0 0 | 0 0 1 | 0 1 0 |

Appendix A - Evaluation of

| States order | Lower bit sequence | Middle bit sequence | Upper bit sequence | static comp | | | | dynamic comp | | | |
|---|---|---|---|---|---|---|---|---|---|---|---|
| | | | | | T | Min | Max | | T | Min | Max |
| 7 6 4 3 0 5 1 2 | 1 0 0 1 0 1 1 0 | 1 1 0 1 0 0 0 1 | 1 1 1 0 0 1 0 0 | 5 4 3 | 12 | 3 | 5 | 3 3 2 | 8 | 2 | 3 |
| 7 6 4 3 5 2 0 1 | 1 0 0 1 1 0 0 1 | 1 1 0 1 0 1 0 0 | 1 1 1 0 1 0 0 0 | 4 5 3 | 12 | 3 | 5 | 3 3 2 | 8 | 2 | 3 |
| 7 6 4 3 5 2 1 0 | 1 0 0 1 1 0 1 0 | 1 1 0 1 0 1 0 0 | 1 1 1 0 1 0 0 0 | 5 5 3 | 13 | 3 | 5 | 3 3 2 | 8 | 2 | 3 |
| 7 6 4 3 5 0 2 1 | 1 0 0 1 1 0 0 1 | 1 1 0 1 0 0 1 0 | 1 1 1 0 1 0 0 0 | 4 5 3 | 12 | 3 | 5 | 3 3 2 | 8 | 2 | 3 |
| 7 6 4 3 5 0 1 2 | 1 0 0 1 1 0 1 0 | 1 1 0 1 0 0 0 1 | 1 1 1 0 1 0 0 0 | 5 4 3 | 12 | 3 | 5 | 3 3 2 | 8 | 2 | 3 |
| 7 6 4 3 5 1 2 0 | 1 0 0 1 1 1 0 0 | 1 1 0 1 0 0 1 0 | 1 1 1 0 1 0 0 0 | 3 5 3 | 11 | 3 | 5 | 2 3 2 | 7 | 2 | 3 |
| 7 6 4 3 5 1 0 2 | 1 0 0 1 1 1 0 0 | 1 1 0 1 0 0 0 1 | 1 1 1 0 1 0 0 0 | 3 4 3 | 10 | 3 | 4 | 2 3 2 | 7 | 2 | 3 |
| 7 6 5 2 4 0 1 3 | 1 0 1 0 0 0 1 1 | 1 1 0 1 0 0 0 1 | 1 1 1 0 1 0 0 0 | 4 4 3 | 11 | 3 | 4 | 3 3 2 | 8 | 2 | 3 |
| 7 6 5 2 4 0 3 1 | 1 0 1 0 0 0 1 1 | 1 1 0 1 0 0 1 0 | 1 1 1 0 1 0 0 0 | 4 5 3 | 12 | 3 | 5 | 3 3 2 | 8 | 2 | 3 |
| 7 6 5 2 4 1 0 3 | 1 0 1 0 0 1 0 1 | 1 1 0 1 0 0 0 1 | 1 1 1 0 1 0 0 0 | 6 4 3 | 13 | 3 | 6 | 3 3 2 | 8 | 2 | 3 |
| 7 6 5 2 4 1 3 0 | 1 0 1 0 0 1 1 0 | 1 1 0 1 0 0 1 0 | 1 1 1 0 1 0 0 0 | 5 5 3 | 13 | 3 | 5 | 3 3 2 | 8 | 2 | 3 |
| 7 6 5 2 4 3 0 1 | 1 0 1 0 0 1 0 1 | 1 1 0 1 0 1 0 0 | 1 1 1 0 1 0 0 0 | 6 5 3 | 14 | 3 | 6 | 3 3 2 | 8 | 2 | 3 |
| 7 6 5 2 4 3 1 0 | 1 0 1 0 0 1 1 0 | 1 1 0 1 0 1 0 0 | 1 1 1 0 1 0 0 0 | 5 5 3 | 13 | 3 | 5 | 3 3 2 | 8 | 2 | 3 |
| 7 6 5 2 1 4 0 3 | 1 0 1 0 1 0 0 1 | 1 1 0 1 0 0 0 1 | 1 1 1 0 0 1 0 0 | 6 4 3 | 13 | 3 | 6 | 3 3 2 | 8 | 2 | 3 |
| 7 6 5 2 1 4 3 0 | 1 0 1 0 1 0 1 0 | 1 1 0 1 0 0 1 0 | 1 1 1 0 0 1 0 0 | 7 5 3 | 15 | 3 | 7 | 3 3 2 | 8 | 2 | 3 |
| 7 6 5 2 1 3 4 0 | 1 0 1 0 1 1 0 0 | 1 1 0 1 0 1 0 0 | 1 1 1 0 0 0 1 0 | 5 5 3 | 13 | 3 | 5 | 3 3 2 | 8 | 2 | 3 |
| 7 6 5 2 3 4 0 1 | 1 0 1 0 1 0 0 1 | 1 1 0 1 1 0 0 0 | 1 1 1 0 0 1 0 0 | 6 3 3 | 12 | 3 | 6 | 3 2 2 | 7 | 2 | 3 |
| 7 6 5 2 3 4 1 0 | 1 0 1 0 1 0 1 0 | 1 1 0 1 1 0 0 0 | 1 1 1 0 0 1 0 0 | 7 3 3 | 13 | 3 | 7 | 3 2 2 | 7 | 2 | 3 |
| 7 6 5 2 3 1 4 0 | 1 0 1 0 1 1 0 0 | 1 1 0 1 1 0 0 0 | 1 1 1 0 0 0 1 0 | 5 3 3 | 11 | 3 | 5 | 3 2 2 | 7 | 2 | 3 |
| 7 6 5 4 2 0 1 3 | 1 0 1 0 0 0 1 1 | 1 1 0 0 1 0 0 1 | 1 1 1 1 0 0 0 0 | 4 4 1 | 9 | 1 | 4 | 3 3 1 | 7 | 1 | 3 |
| 7 6 5 4 2 0 3 1 | 1 0 1 0 0 0 1 1 | 1 1 0 0 1 0 1 0 | 1 1 1 1 0 0 0 0 | 4 5 1 | 10 | 1 | 5 | 3 3 1 | 7 | 1 | 3 |
| 7 6 5 4 2 1 0 3 | 1 0 1 0 0 1 0 1 | 1 1 0 0 1 0 0 1 | 1 1 1 1 0 0 0 0 | 6 4 1 | 11 | 1 | 6 | 3 3 1 | 7 | 1 | 3 |
| 7 6 5 4 2 1 3 0 | 1 0 1 0 0 1 1 0 | 1 1 0 0 1 0 1 0 | 1 1 1 1 0 0 0 0 | 5 5 1 | 11 | 1 | 5 | 3 3 1 | 7 | 1 | 3 |
| 7 6 5 4 2 3 0 1 | 1 0 1 0 0 1 0 1 | 1 1 0 0 1 1 0 0 | 1 1 1 1 0 0 0 0 | 6 3 1 | 10 | 1 | 6 | 3 2 1 | 6 | 1 | 3 |
| 7 6 5 4 2 3 1 0 | 1 0 1 0 0 1 1 0 | 1 1 0 0 1 1 0 0 | 1 1 1 1 0 0 0 0 | 5 3 1 | 9 | 1 | 5 | 3 2 1 | 6 | 1 | 3 |
| 7 6 5 4 0 2 1 3 | 1 0 1 0 0 0 1 1 | 1 1 0 0 0 1 0 1 | 1 1 1 1 0 0 0 0 | 4 4 1 | 9 | 1 | 4 | 3 3 1 | 7 | 1 | 3 |
| 7 6 5 4 0 2 3 1 | 1 0 1 0 0 0 1 1 | 1 1 0 0 0 1 1 0 | 1 1 1 1 0 0 0 0 | 4 3 1 | 8 | 1 | 4 | 3 2 1 | 6 | 1 | 3 |
| 7 6 5 4 0 1 2 3 | 1 0 1 0 0 1 0 1 | 1 1 0 0 0 0 1 1 | 1 1 1 1 0 0 0 0 | 6 2 1 | 9 | 1 | 6 | 3 2 1 | 6 | 1 | 3 |
| 7 6 5 4 0 1 3 2 | 1 0 1 0 0 1 1 0 | 1 1 0 0 0 0 1 1 | 1 1 1 1 0 0 0 0 | 5 2 1 | 8 | 1 | 5 | 3 2 1 | 6 | 1 | 3 |
| 7 6 5 4 0 3 1 2 | 1 0 1 0 0 1 1 0 | 1 1 0 0 0 1 0 1 | 1 1 1 1 0 0 0 0 | 5 4 1 | 10 | 1 | 5 | 3 3 1 | 7 | 1 | 3 |
| 7 6 5 4 0 3 2 1 | 1 0 1 0 0 1 0 1 | 1 1 0 0 0 1 1 0 | 1 1 1 1 0 0 0 0 | 6 3 1 | 10 | 1 | 6 | 3 2 1 | 6 | 1 | 3 |
| 7 6 5 4 1 2 0 3 | 1 0 1 0 1 0 0 1 | 1 1 0 0 0 1 0 1 | 1 1 1 1 0 0 0 0 | 6 4 1 | 11 | 1 | 6 | 3 3 1 | 7 | 1 | 3 |
| 7 6 5 4 1 2 3 0 | 1 0 1 0 1 0 1 0 | 1 1 0 0 0 1 1 0 | 1 1 1 1 0 0 0 0 | 7 3 1 | 11 | 1 | 7 | 3 2 1 | 6 | 1 | 3 |
| 7 6 5 4 1 0 2 3 | 1 0 1 0 1 0 0 1 | 1 1 0 0 0 0 1 1 | 1 1 1 1 0 0 0 0 | 6 2 1 | 9 | 1 | 6 | 3 2 1 | 6 | 1 | 3 |
| 7 6 5 4 1 0 3 2 | 1 0 1 0 1 0 1 0 | 1 1 0 0 0 0 1 1 | 1 1 1 1 0 0 0 0 | 7 2 1 | 10 | 1 | 7 | 3 2 1 | 6 | 1 | 3 |
| 7 6 5 4 1 3 2 0 | 1 0 1 0 1 1 0 0 | 1 1 0 0 0 1 1 0 | 1 1 1 1 0 0 0 0 | 5 3 1 | 9 | 1 | 5 | 3 2 1 | 6 | 1 | 3 |
| 7 6 5 4 1 3 0 2 | 1 0 1 0 1 1 0 0 | 1 1 0 0 0 1 0 1 | 1 1 1 1 0 0 0 0 | 5 4 1 | 10 | 1 | 5 | 3 3 1 | 7 | 1 | 3 |
| 7 6 5 4 3 2 0 1 | 1 0 1 0 1 0 0 1 | 1 1 0 0 1 1 0 0 | 1 1 1 1 0 0 0 0 | 6 3 1 | 10 | 1 | 6 | 3 2 1 | 6 | 1 | 3 |
| 7 6 5 4 3 2 1 0 | 1 0 1 0 1 0 1 0 | 1 1 0 0 1 1 0 0 | 1 1 1 1 0 0 0 0 | 7 3 1 | 11 | 1 | 7 | 3 2 1 | 6 | 1 | 3 |
| 7 6 5 4 3 0 2 1 | 1 0 1 0 1 0 0 1 | 1 1 0 0 1 0 1 0 | 1 1 1 1 0 0 0 0 | 6 5 1 | 12 | 1 | 6 | 3 3 1 | 7 | 1 | 3 |
| 7 6 5 4 3 0 1 2 | 1 0 1 0 1 0 1 0 | 1 1 0 0 1 0 0 1 | 1 1 1 1 0 0 0 0 | 7 4 1 | 12 | 1 | 7 | 3 3 1 | 7 | 1 | 3 |
| 7 6 5 4 3 1 2 0 | 1 0 1 0 1 1 0 0 | 1 1 0 0 1 0 1 0 | 1 1 1 1 0 0 0 0 | 5 5 1 | 11 | 1 | 5 | 3 3 1 | 7 | 1 | 3 |
| 7 6 5 4 3 1 0 2 | 1 0 1 0 1 1 0 0 | 1 1 0 0 1 0 0 1 | 1 1 1 1 0 0 0 0 | 5 4 1 | 10 | 1 | 5 | 3 3 1 | 7 | 1 | 3 |
| 7 6 5 1 2 4 0 3 | 1 0 1 1 0 0 0 1 | 1 1 0 0 1 0 0 1 | 1 1 1 0 0 1 0 0 | 4 4 3 | 11 | 3 | 4 | 3 3 2 | 8 | 2 | 3 |
| 7 6 5 1 2 4 3 0 | 1 0 1 1 0 0 1 0 | 1 1 0 0 1 0 1 0 | 1 1 1 0 0 1 0 0 | 5 5 3 | 13 | 3 | 5 | 3 3 2 | 8 | 2 | 3 |
| 7 6 5 1 2 3 4 0 | 1 0 1 1 0 1 0 0 | 1 1 0 0 1 1 0 0 | 1 1 1 0 0 0 1 0 | 5 3 3 | 11 | 3 | 5 | 3 2 2 | 7 | 2 | 3 |
| 7 6 5 1 4 2 0 3 | 1 0 1 1 0 0 0 1 | 1 1 0 0 0 1 0 1 | 1 1 1 0 1 0 0 0 | 4 4 3 | 11 | 3 | 4 | 3 3 2 | 8 | 2 | 3 |
| 7 6 5 1 4 2 3 0 | 1 0 1 1 0 0 1 0 | 1 1 0 0 0 1 1 0 | 1 1 1 0 1 0 0 0 | 5 3 3 | 11 | 3 | 5 | 3 2 2 | 7 | 2 | 3 |
| 7 6 5 1 4 0 2 3 | 1 0 1 1 0 0 0 1 | 1 1 0 0 0 0 1 1 | 1 1 1 0 1 0 0 0 | 4 2 3 | 9 | 2 | 4 | 3 2 2 | 7 | 2 | 3 |
| 7 6 5 1 4 0 3 2 | 1 0 1 1 0 0 1 0 | 1 1 0 0 0 0 1 1 | 1 1 1 0 1 0 0 0 | 5 2 3 | 10 | 2 | 5 | 3 2 2 | 7 | 2 | 3 |
| 7 6 5 1 4 3 2 0 | 1 0 1 1 0 1 0 0 | 1 1 0 0 0 1 1 0 | 1 1 1 0 1 0 0 0 | 5 3 3 | 11 | 3 | 5 | 3 2 2 | 7 | 2 | 3 |
| 7 6 5 1 4 3 0 2 | 1 0 1 1 0 1 0 0 | 1 1 0 0 0 1 0 1 | 1 1 1 0 1 0 0 0 | 5 4 3 | 12 | 3 | 5 | 3 3 2 | 8 | 2 | 3 |
| 7 6 5 1 3 2 4 0 | 1 0 1 1 1 0 0 0 | 1 1 0 0 1 1 0 0 | 1 1 1 0 0 0 1 0 | 3 3 3 | 9 | 3 | 3 | 2 2 2 | 6 | 2 | 2 |
| 7 6 5 1 3 4 2 0 | 1 0 1 1 1 0 0 0 | 1 1 0 0 1 0 1 0 | 1 1 1 0 0 1 0 0 | 3 5 3 | 11 | 3 | 5 | 2 3 2 | 7 | 2 | 3 |
| 7 6 5 1 3 4 0 2 | 1 0 1 1 1 0 0 0 | 1 1 0 0 1 0 0 1 | 1 1 1 0 0 1 0 0 | 3 4 3 | 10 | 3 | 4 | 2 3 2 | 7 | 2 | 3 |
| 7 6 5 3 2 4 0 1 | 1 0 1 1 0 0 0 1 | 1 1 0 1 1 0 0 0 | 1 1 1 0 0 1 0 0 | 4 3 3 | 10 | 3 | 4 | 3 2 2 | 7 | 2 | 3 |
| 7 6 5 3 2 4 1 0 | 1 0 1 1 0 0 1 0 | 1 1 0 1 1 0 0 0 | 1 1 1 0 0 1 0 0 | 5 3 3 | 11 | 3 | 5 | 3 2 2 | 7 | 2 | 3 |
| 7 6 5 3 2 1 4 0 | 1 0 1 1 0 1 0 0 | 1 1 0 1 1 0 0 0 | 1 1 1 0 0 0 1 0 | 5 3 3 | 11 | 3 | 5 | 3 2 2 | 7 | 2 | 3 |
| 7 6 5 3 4 2 0 1 | 1 0 1 1 0 0 0 1 | 1 1 0 1 0 1 0 0 | 1 1 1 0 1 0 0 0 | 4 5 3 | 12 | 3 | 5 | 3 3 2 | 8 | 2 | 3 |
| 7 6 5 3 4 2 1 0 | 1 0 1 1 0 0 1 0 | 1 1 0 1 0 1 0 0 | 1 1 1 0 1 0 0 0 | 5 5 3 | 13 | 3 | 5 | 3 3 2 | 8 | 2 | 3 |
| 7 6 5 3 4 0 2 1 | 1 0 1 1 0 0 0 1 | 1 1 0 1 0 0 1 0 | 1 1 1 0 1 0 0 0 | 4 5 3 | 12 | 3 | 5 | 3 3 2 | 8 | 2 | 3 |
| 7 6 5 3 4 0 1 2 | 1 0 1 1 0 0 1 0 | 1 1 0 1 0 0 0 1 | 1 1 1 0 1 0 0 0 | 5 4 3 | 12 | 3 | 5 | 3 3 2 | 8 | 2 | 3 |
| 7 6 5 3 4 1 2 0 | 1 0 1 1 0 1 0 0 | 1 1 0 1 0 0 1 0 | 1 1 1 0 1 0 0 0 | 5 5 3 | 13 | 3 | 5 | 3 3 2 | 8 | 2 | 3 |
| 7 6 5 3 4 1 0 2 | 1 0 1 1 0 1 0 0 | 1 1 0 1 0 0 0 1 | 1 1 1 0 1 0 0 0 | 5 4 3 | 12 | 3 | 5 | 3 3 2 | 8 | 2 | 3 |
| 7 6 5 3 1 2 4 0 | 1 0 1 1 1 0 0 0 | 1 1 0 1 0 1 0 0 | 1 1 1 0 0 0 1 0 | 3 5 3 | 11 | 3 | 5 | 2 3 2 | 7 | 2 | 3 |
| 7 6 5 3 1 4 2 0 | 1 0 1 1 1 0 0 0 | 1 1 0 1 0 0 1 0 | 1 1 1 0 0 1 0 0 | 3 5 3 | 11 | 3 | 5 | 2 3 2 | 7 | 2 | 3 |
| 7 6 5 3 1 4 0 2 | 1 0 1 1 1 0 0 0 | 1 1 0 1 0 0 0 1 | 1 1 1 0 0 1 0 0 | 3 4 3 | 10 | 3 | 4 | 2 3 2 | 7 | 2 | 3 |
| 7 6 3 2 4 0 5 1 | 1 0 1 0 0 0 1 1 | 1 1 1 1 0 0 0 0 | 1 1 0 0 1 0 1 0 | 4 1 5 | 10 | 1 | 5 | 3 1 3 | 7 | 1 | 3 |
| 7 6 3 2 4 5 0 1 | 1 0 1 0 0 1 0 1 | 1 1 1 1 0 0 0 0 | 1 1 0 0 1 1 0 0 | 6 1 3 | 10 | 1 | 6 | 3 1 2 | 6 | 1 | 3 |
| 7 6 3 2 4 5 1 0 | 1 0 1 0 0 1 1 0 | 1 1 1 1 0 0 0 0 | 1 1 0 0 1 1 0 0 | 5 1 3 | 9 | 1 | 5 | 3 1 2 | 6 | 1 | 3 |
| 7 6 3 2 5 4 0 1 | 1 0 1 0 1 0 0 1 | 1 1 1 1 0 0 0 0 | 1 1 0 0 1 1 0 0 | 6 1 3 | 10 | 1 | 6 | 3 1 2 | 6 | 1 | 3 |
| 7 6 3 2 5 4 1 0 | 1 0 1 0 1 0 1 0 | 1 1 1 1 0 0 0 0 | 1 1 0 0 1 1 0 0 | 7 1 3 | 11 | 1 | 7 | 3 1 2 | 6 | 1 | 3 |
| 7 6 3 2 5 1 4 0 | 1 0 1 0 1 1 0 0 | 1 1 1 1 0 0 0 0 | 1 1 0 0 1 0 1 0 | 5 1 5 | 11 | 1 | 5 | 3 1 3 | 7 | 1 | 3 |
| 7 6 3 4 2 0 5 1 | 1 0 1 0 0 0 1 1 | 1 1 1 0 1 0 0 0 | 1 1 0 1 0 0 1 0 | 4 3 5 | 12 | 3 | 5 | 3 2 3 | 8 | 2 | 3 |
| 7 6 3 4 2 5 0 1 | 1 0 1 0 0 1 0 1 | 1 1 1 0 1 0 0 0 | 1 1 0 1 0 1 0 0 | 6 3 5 | 14 | 3 | 6 | 3 2 3 | 8 | 2 | 3 |
| 7 6 3 4 2 5 1 0 | 1 0 1 0 0 1 1 0 | 1 1 1 0 1 0 0 0 | 1 1 0 1 0 1 0 0 | 5 3 5 | 13 | 3 | 5 | 3 2 3 | 8 | 2 | 3 |
| 7 6 3 4 0 2 5 1 | 1 0 1 0 0 0 1 1 | 1 1 1 0 0 1 0 0 | 1 1 0 1 0 0 1 0 | 4 3 5 | 12 | 3 | 5 | 3 2 3 | 8 | 2 | 3 |
| 7 6 3 4 0 5 2 1 | 1 0 1 0 0 1 0 1 | 1 1 1 0 0 0 1 0 | 1 1 0 1 0 1 0 0 | 6 3 5 | 14 | 3 | 6 | 3 2 3 | 8 | 2 | 3 |
| 7 6 3 4 0 5 1 2 | 1 0 1 0 0 1 1 0 | 1 1 1 0 0 0 0 1 | 1 1 0 1 0 1 0 0 | 5 2 5 | 12 | 2 | 5 | 3 2 3 | 8 | 2 | 3 |
| 7 6 3 4 5 2 0 1 | 1 0 1 0 1 0 0 1 | 1 1 1 0 0 1 0 0 | 1 1 0 1 1 0 0 0 | 6 3 3 | 12 | 3 | 6 | 3 2 2 | 7 | 2 | 3 |
| 7 6 3 4 5 2 1 0 | 1 0 1 0 1 0 1 0 | 1 1 1 0 0 1 0 0 | 1 1 0 1 1 0 0 0 | 7 3 3 | 13 | 3 | 7 | 3 2 2 | 7 | 2 | 3 |
| 7 6 3 4 5 0 2 1 | 1 0 1 0 1 0 0 1 | 1 1 1 0 0 0 1 0 | 1 1 0 1 1 0 0 0 | 6 3 3 | 12 | 3 | 6 | 3 2 2 | 7 | 2 | 3 |
| 7 6 3 4 5 0 1 2 | 1 0 1 0 1 0 1 0 | 1 1 1 0 0 0 0 1 | 1 1 0 1 1 0 0 0 | 7 2 3 | 12 | 2 | 7 | 3 2 2 | 7 | 2 | 3 |

Appendix A - Evaluation of valid orderings for 3-bit MBC cells

| States order | 1st state | 2nd state | 3rd state | 4th state | 5th state | 6th state | 7th state | 8th state |
|---|---|---|---|---|---|---|---|---|
| 7 6 3 4 5 1 2 0 | 1 1 1 | 1 1 0 | 0 1 1 | 1 0 0 | 1 0 1 | 0 0 1 | 0 1 0 | 0 0 0 |
| 7 6 3 4 5 1 0 2 | 1 1 1 | 1 1 0 | 0 1 1 | 1 0 0 | 1 0 1 | 0 0 1 | 0 0 0 | 0 1 0 |
| 7 6 3 5 2 4 0 1 | 1 1 1 | 1 1 0 | 0 1 1 | 1 0 1 | 0 1 0 | 1 0 0 | 0 0 0 | 0 0 1 |
| 7 6 3 5 2 4 1 0 | 1 1 1 | 1 1 0 | 0 1 1 | 1 0 1 | 0 1 0 | 1 0 0 | 0 0 1 | 0 0 0 |
| 7 6 3 5 2 1 4 0 | 1 1 1 | 1 1 0 | 0 1 1 | 1 0 1 | 0 1 0 | 0 0 1 | 1 0 0 | 0 0 0 |
| 7 6 3 5 4 2 0 1 | 1 1 1 | 1 1 0 | 0 1 1 | 1 0 1 | 1 0 0 | 0 1 0 | 0 0 0 | 0 0 1 |
| 7 6 3 5 4 2 1 0 | 1 1 1 | 1 1 0 | 0 1 1 | 1 0 1 | 1 0 0 | 0 1 0 | 0 0 1 | 0 0 0 |
| 7 6 3 5 4 0 2 1 | 1 1 1 | 1 1 0 | 0 1 1 | 1 0 1 | 1 0 0 | 0 0 0 | 0 1 0 | 0 0 1 |
| 7 6 3 5 4 0 1 2 | 1 1 1 | 1 1 0 | 0 1 1 | 1 0 1 | 1 0 0 | 0 0 0 | 0 0 1 | 0 1 0 |
| 7 6 3 5 4 1 2 0 | 1 1 1 | 1 1 0 | 0 1 1 | 1 0 1 | 1 0 0 | 0 0 1 | 0 1 0 | 0 0 0 |
| 7 6 3 5 4 1 0 2 | 1 1 1 | 1 1 0 | 0 1 1 | 1 0 1 | 1 0 0 | 0 0 1 | 0 0 0 | 0 1 0 |
| 7 6 3 5 1 2 4 0 | 1 1 1 | 1 1 0 | 0 1 1 | 1 0 1 | 0 0 1 | 0 1 0 | 1 0 0 | 0 0 0 |
| 7 6 3 5 1 4 2 0 | 1 1 1 | 1 1 0 | 0 1 1 | 1 0 1 | 0 0 1 | 1 0 0 | 0 1 0 | 0 0 0 |
| 7 6 3 5 1 4 0 2 | 1 1 1 | 1 1 0 | 0 1 1 | 1 0 1 | 0 0 1 | 1 0 0 | 0 0 0 | 0 1 0 |
| 7 5 6 2 4 0 1 3 | 1 1 1 | 1 0 1 | 1 1 0 | 0 1 0 | 1 0 0 | 0 0 0 | 0 0 1 | 0 1 1 |
| 7 5 6 2 4 0 3 1 | 1 1 1 | 1 0 1 | 1 1 0 | 0 1 0 | 1 0 0 | 0 0 0 | 0 1 1 | 0 0 1 |
| 7 5 6 2 4 1 0 3 | 1 1 1 | 1 0 1 | 1 1 0 | 0 1 0 | 1 0 0 | 0 0 1 | 0 0 0 | 0 1 1 |
| 7 5 6 2 4 1 3 0 | 1 1 1 | 1 0 1 | 1 1 0 | 0 1 0 | 1 0 0 | 0 0 1 | 0 1 1 | 0 0 0 |
| 7 5 6 2 4 3 0 1 | 1 1 1 | 1 0 1 | 1 1 0 | 0 1 0 | 1 0 0 | 0 1 1 | 0 0 0 | 0 0 1 |
| 7 5 6 2 4 3 1 0 | 1 1 1 | 1 0 1 | 1 1 0 | 0 1 0 | 1 0 0 | 0 1 1 | 0 0 1 | 0 0 0 |
| 7 5 6 2 1 4 0 3 | 1 1 1 | 1 0 1 | 1 1 0 | 0 1 0 | 0 0 1 | 1 0 0 | 0 0 0 | 0 1 1 |
| 7 5 6 2 1 4 3 0 | 1 1 1 | 1 0 1 | 1 1 0 | 0 1 0 | 0 0 1 | 1 0 0 | 0 1 1 | 0 0 0 |
| 7 5 6 2 1 3 4 0 | 1 1 1 | 1 0 1 | 1 1 0 | 0 1 0 | 0 0 1 | 0 1 1 | 1 0 0 | 0 0 0 |
| 7 5 6 2 3 4 0 1 | 1 1 1 | 1 0 1 | 1 1 0 | 0 1 0 | 0 1 1 | 1 0 0 | 0 0 0 | 0 0 1 |
| 7 5 6 2 3 4 1 0 | 1 1 1 | 1 0 1 | 1 1 0 | 0 1 0 | 0 1 1 | 1 0 0 | 0 0 1 | 0 0 0 |
| 7 5 6 2 3 1 4 0 | 1 1 1 | 1 0 1 | 1 1 0 | 0 1 0 | 0 1 1 | 0 0 1 | 1 0 0 | 0 0 0 |
| 7 5 6 4 2 0 1 3 | 1 1 1 | 1 0 1 | 1 1 0 | 1 0 0 | 0 1 0 | 0 0 0 | 0 0 1 | 0 1 1 |
| 7 5 6 4 2 0 3 1 | 1 1 1 | 1 0 1 | 1 1 0 | 1 0 0 | 0 1 0 | 0 0 0 | 0 1 1 | 0 0 1 |
| 7 5 6 4 2 1 0 3 | 1 1 1 | 1 0 1 | 1 1 0 | 1 0 0 | 0 1 0 | 0 0 1 | 0 0 0 | 0 1 1 |
| 7 5 6 4 2 1 3 0 | 1 1 1 | 1 0 1 | 1 1 0 | 1 0 0 | 0 1 0 | 0 0 1 | 0 1 1 | 0 0 0 |
| 7 5 6 4 2 3 0 1 | 1 1 1 | 1 0 1 | 1 1 0 | 1 0 0 | 0 1 0 | 0 1 1 | 0 0 0 | 0 0 1 |
| 7 5 6 4 2 3 1 0 | 1 1 1 | 1 0 1 | 1 1 0 | 1 0 0 | 0 1 0 | 0 1 1 | 0 0 1 | 0 0 0 |
| 7 5 6 4 0 2 1 3 | 1 1 1 | 1 0 1 | 1 1 0 | 1 0 0 | 0 0 0 | 0 1 0 | 0 0 1 | 0 1 1 |
| 7 5 6 4 0 2 3 1 | 1 1 1 | 1 0 1 | 1 1 0 | 1 0 0 | 0 0 0 | 0 1 0 | 0 1 1 | 0 0 1 |
| 7 5 6 4 0 1 2 3 | 1 1 1 | 1 0 1 | 1 1 0 | 1 0 0 | 0 0 0 | 0 0 1 | 0 1 0 | 0 1 1 |
| 7 5 6 4 0 1 3 2 | 1 1 1 | 1 0 1 | 1 1 0 | 1 0 0 | 0 0 0 | 0 0 1 | 0 1 1 | 0 1 0 |
| 7 5 6 4 0 3 1 2 | 1 1 1 | 1 0 1 | 1 1 0 | 1 0 0 | 0 0 0 | 0 1 1 | 0 0 1 | 0 1 0 |
| 7 5 6 4 0 3 2 1 | 1 1 1 | 1 0 1 | 1 1 0 | 1 0 0 | 0 0 0 | 0 1 1 | 0 1 0 | 0 0 1 |
| 7 5 6 4 1 2 0 3 | 1 1 1 | 1 0 1 | 1 1 0 | 1 0 0 | 0 0 1 | 0 1 0 | 0 0 0 | 0 1 1 |
| 7 5 6 4 1 2 3 0 | 1 1 1 | 1 0 1 | 1 1 0 | 1 0 0 | 0 0 1 | 0 1 0 | 0 1 1 | 0 0 0 |
| 7 5 6 4 1 0 2 3 | 1 1 1 | 1 0 1 | 1 1 0 | 1 0 0 | 0 0 1 | 0 0 0 | 0 1 0 | 0 1 1 |
| 7 5 6 4 1 0 3 2 | 1 1 1 | 1 0 1 | 1 1 0 | 1 0 0 | 0 0 1 | 0 0 0 | 0 1 1 | 0 1 0 |
| 7 5 6 4 1 3 2 0 | 1 1 1 | 1 0 1 | 1 1 0 | 1 0 0 | 0 0 1 | 0 1 1 | 0 1 0 | 0 0 0 |
| 7 5 6 4 1 3 0 2 | 1 1 1 | 1 0 1 | 1 1 0 | 1 0 0 | 0 0 1 | 0 1 1 | 0 0 0 | 0 1 0 |
| 7 5 6 4 3 2 0 1 | 1 1 1 | 1 0 1 | 1 1 0 | 1 0 0 | 0 1 1 | 0 1 0 | 0 0 0 | 0 0 1 |
| 7 5 6 4 3 2 1 0 | 1 1 1 | 1 0 1 | 1 1 0 | 1 0 0 | 0 1 1 | 0 1 0 | 0 0 1 | 0 0 0 |
| 7 5 6 4 3 0 2 1 | 1 1 1 | 1 0 1 | 1 1 0 | 1 0 0 | 0 1 1 | 0 0 0 | 0 1 0 | 0 0 1 |
| 7 5 6 4 3 0 1 2 | 1 1 1 | 1 0 1 | 1 1 0 | 1 0 0 | 0 1 1 | 0 0 0 | 0 0 1 | 0 1 0 |
| 7 5 6 4 3 1 2 0 | 1 1 1 | 1 0 1 | 1 1 0 | 1 0 0 | 0 1 1 | 0 0 1 | 0 1 0 | 0 0 0 |
| 7 5 6 4 3 1 0 2 | 1 1 1 | 1 0 1 | 1 1 0 | 1 0 0 | 0 1 1 | 0 0 1 | 0 0 0 | 0 1 0 |
| 7 5 6 1 2 4 0 3 | 1 1 1 | 1 0 1 | 1 1 0 | 0 0 1 | 0 1 0 | 1 0 0 | 0 0 0 | 0 1 1 |
| 7 5 6 1 2 4 3 0 | 1 1 1 | 1 0 1 | 1 1 0 | 0 0 1 | 0 1 0 | 1 0 0 | 0 1 1 | 0 0 0 |
| 7 5 6 1 2 3 4 0 | 1 1 1 | 1 0 1 | 1 1 0 | 0 0 1 | 0 1 0 | 0 1 1 | 1 0 0 | 0 0 0 |
| 7 5 6 1 4 2 0 3 | 1 1 1 | 1 0 1 | 1 1 0 | 0 0 1 | 1 0 0 | 0 1 0 | 0 0 0 | 0 1 1 |
| 7 5 6 1 4 2 3 0 | 1 1 1 | 1 0 1 | 1 1 0 | 0 0 1 | 1 0 0 | 0 1 0 | 0 1 1 | 0 0 0 |
| 7 5 6 1 4 0 2 3 | 1 1 1 | 1 0 1 | 1 1 0 | 0 0 1 | 1 0 0 | 0 0 0 | 0 1 0 | 0 1 1 |
| 7 5 6 1 4 0 3 2 | 1 1 1 | 1 0 1 | 1 1 0 | 0 0 1 | 1 0 0 | 0 0 0 | 0 1 1 | 0 1 0 |
| 7 5 6 1 4 3 2 0 | 1 1 1 | 1 0 1 | 1 1 0 | 0 0 1 | 1 0 0 | 0 1 1 | 0 1 0 | 0 0 0 |
| 7 5 6 1 4 3 0 2 | 1 1 1 | 1 0 1 | 1 1 0 | 0 0 1 | 1 0 0 | 0 1 1 | 0 0 0 | 0 1 0 |
| 7 5 6 1 3 2 4 0 | 1 1 1 | 1 0 1 | 1 1 0 | 0 0 1 | 0 1 1 | 0 1 0 | 1 0 0 | 0 0 0 |
| 7 5 6 1 3 4 2 0 | 1 1 1 | 1 0 1 | 1 1 0 | 0 0 1 | 0 1 1 | 1 0 0 | 0 1 0 | 0 0 0 |
| 7 5 6 1 3 4 0 2 | 1 1 1 | 1 0 1 | 1 1 0 | 0 0 1 | 0 1 1 | 1 0 0 | 0 0 0 | 0 1 0 |
| 7 5 6 3 2 4 0 1 | 1 1 1 | 1 0 1 | 1 1 0 | 0 1 1 | 0 1 0 | 1 0 0 | 0 0 0 | 0 0 1 |
| 7 5 6 3 2 4 1 0 | 1 1 1 | 1 0 1 | 1 1 0 | 0 1 1 | 0 1 0 | 1 0 0 | 0 0 1 | 0 0 0 |
| 7 5 6 3 2 1 4 0 | 1 1 1 | 1 0 1 | 1 1 0 | 0 1 1 | 0 1 0 | 0 0 1 | 1 0 0 | 0 0 0 |
| 7 5 6 3 4 2 0 1 | 1 1 1 | 1 0 1 | 1 1 0 | 0 1 1 | 1 0 0 | 0 1 0 | 0 0 0 | 0 0 1 |
| 7 5 6 3 4 2 1 0 | 1 1 1 | 1 0 1 | 1 1 0 | 0 1 1 | 1 0 0 | 0 1 0 | 0 0 1 | 0 0 0 |
| 7 5 6 3 4 0 2 1 | 1 1 1 | 1 0 1 | 1 1 0 | 0 1 1 | 1 0 0 | 0 0 0 | 0 1 0 | 0 0 1 |
| 7 5 6 3 4 0 1 2 | 1 1 1 | 1 0 1 | 1 1 0 | 0 1 1 | 1 0 0 | 0 0 0 | 0 0 1 | 0 1 0 |
| 7 5 6 3 4 1 2 0 | 1 1 1 | 1 0 1 | 1 1 0 | 0 1 1 | 1 0 0 | 0 0 1 | 0 1 0 | 0 0 0 |
| 7 5 6 3 4 1 0 2 | 1 1 1 | 1 0 1 | 1 1 0 | 0 1 1 | 1 0 0 | 0 0 1 | 0 0 0 | 0 1 0 |
| 7 5 6 3 1 2 4 0 | 1 1 1 | 1 0 1 | 1 1 0 | 0 1 1 | 0 0 1 | 0 1 0 | 1 0 0 | 0 0 0 |
| 7 5 6 3 1 4 2 0 | 1 1 1 | 1 0 1 | 1 1 0 | 0 1 1 | 0 0 1 | 1 0 0 | 0 1 0 | 0 0 0 |
| 7 5 6 3 1 4 0 2 | 1 1 1 | 1 0 1 | 1 1 0 | 0 1 1 | 0 0 1 | 1 0 0 | 0 0 0 | 0 1 0 |
| 7 5 1 6 2 4 0 3 | 1 1 1 | 1 0 1 | 0 0 1 | 1 1 0 | 0 1 0 | 1 0 0 | 0 0 0 | 0 1 1 |
| 7 5 1 6 2 4 3 0 | 1 1 1 | 1 0 1 | 0 0 1 | 1 1 0 | 0 1 0 | 1 0 0 | 0 1 1 | 0 0 0 |
| 7 5 1 6 2 3 4 0 | 1 1 1 | 1 0 1 | 0 0 1 | 1 1 0 | 0 1 0 | 0 1 1 | 1 0 0 | 0 0 0 |
| 7 5 1 6 4 2 0 3 | 1 1 1 | 1 0 1 | 0 0 1 | 1 1 0 | 1 0 0 | 0 1 0 | 0 0 0 | 0 1 1 |
| 7 5 1 6 4 2 3 0 | 1 1 1 | 1 0 1 | 0 0 1 | 1 1 0 | 1 0 0 | 0 1 0 | 0 1 1 | 0 0 0 |
| 7 5 1 6 4 0 2 3 | 1 1 1 | 1 0 1 | 0 0 1 | 1 1 0 | 1 0 0 | 0 0 0 | 0 1 0 | 0 1 1 |
| 7 5 1 6 4 0 3 2 | 1 1 1 | 1 0 1 | 0 0 1 | 1 1 0 | 1 0 0 | 0 0 0 | 0 1 1 | 0 1 0 |
| 7 5 1 6 4 3 2 0 | 1 1 1 | 1 0 1 | 0 0 1 | 1 1 0 | 1 0 0 | 0 1 1 | 0 1 0 | 0 0 0 |
| 7 5 1 6 4 3 0 2 | 1 1 1 | 1 0 1 | 0 0 1 | 1 1 0 | 1 0 0 | 0 1 1 | 0 0 0 | 0 1 0 |

Appendix A - Evaluation of

| States order | Lower bit sequence | Middle bit sequence | Upper bit sequence | static comp | T | Min | Max | dynamic comp | T | Min | Max |
|---|---|---|---|---|---|---|---|---|---|---|---|
| 7 6 3 4 5 1 2 0 | 1 0 1 0 1 1 0 0 | 1 1 1 0 0 0 1 0 | 1 1 0 1 1 0 0 0 | 5 3 3 | 11 | 3 | 5 | 3 2 2 | 7 | 2 | 3 |
| 7 6 3 4 5 1 0 2 | 1 0 1 0 1 1 0 0 | 1 1 1 0 0 0 0 1 | 1 1 0 1 1 0 0 0 | 5 2 3 | 10 | 2 | 5 | 3 2 2 | 7 | 2 | 3 |
| 7 6 3 5 2 4 0 1 | 1 0 1 1 0 0 0 1 | 1 1 1 0 1 0 0 0 | 1 1 0 1 0 1 0 0 | 4 3 5 | 12 | 3 | 5 | 3 2 3 | 8 | 2 | 3 |
| 7 6 3 5 2 4 1 0 | 1 0 1 1 0 0 1 0 | 1 1 1 0 1 0 0 0 | 1 1 0 1 0 1 0 0 | 5 3 5 | 13 | 3 | 5 | 3 2 3 | 8 | 2 | 3 |
| 7 6 3 5 2 1 4 0 | 1 0 1 1 0 1 0 0 | 1 1 1 0 1 0 0 0 | 1 1 0 1 0 0 1 0 | 5 3 5 | 13 | 3 | 5 | 3 2 3 | 8 | 2 | 3 |
| 7 6 3 5 4 2 0 1 | 1 0 1 1 0 0 0 1 | 1 1 1 0 0 1 0 0 | 1 1 0 1 1 0 0 0 | 4 3 3 | 10 | 3 | 4 | 3 2 2 | 7 | 2 | 3 |
| 7 6 3 5 4 2 1 0 | 1 0 1 1 0 0 1 0 | 1 1 1 0 0 1 0 0 | 1 1 0 1 1 0 0 0 | 5 3 3 | 11 | 3 | 5 | 3 2 2 | 7 | 2 | 3 |
| 7 6 3 5 4 0 2 1 | 1 0 1 1 0 0 0 1 | 1 1 1 0 0 0 1 0 | 1 1 0 1 1 0 0 0 | 4 3 3 | 10 | 3 | 4 | 3 2 2 | 7 | 2 | 3 |
| 7 6 3 5 4 0 1 2 | 1 0 1 1 0 0 1 0 | 1 1 1 0 0 0 0 1 | 1 1 0 1 1 0 0 0 | 5 2 3 | 10 | 2 | 5 | 3 2 2 | 7 | 2 | 3 |
| 7 6 3 5 4 1 2 0 | 1 0 1 1 0 1 0 0 | 1 1 1 0 0 0 1 0 | 1 1 0 1 1 0 0 0 | 5 3 3 | 11 | 3 | 5 | 3 2 2 | 7 | 2 | 3 |
| 7 6 3 5 4 1 0 2 | 1 0 1 1 0 1 0 0 | 1 1 1 0 0 0 0 1 | 1 1 0 1 1 0 0 0 | 5 2 3 | 10 | 2 | 5 | 3 2 2 | 7 | 2 | 3 |
| 7 6 3 5 1 2 4 0 | 1 0 1 1 1 0 0 0 | 1 1 1 0 0 1 0 0 | 1 1 0 1 0 0 1 0 | 3 3 5 | 11 | 3 | 5 | 2 2 3 | 7 | 2 | 3 |
| 7 6 3 5 1 4 2 0 | 1 0 1 1 1 0 0 0 | 1 1 1 0 0 0 1 0 | 1 1 0 1 0 1 0 0 | 3 3 5 | 11 | 3 | 5 | 2 2 3 | 7 | 2 | 3 |
| 7 6 3 5 1 4 0 2 | 1 0 1 1 1 0 0 0 | 1 1 1 0 0 0 0 1 | 1 1 0 1 0 1 0 0 | 3 2 5 | 10 | 2 | 5 | 2 2 3 | 7 | 2 | 3 |
| 7 5 6 2 4 0 1 3 | 1 1 0 0 0 0 1 1 | 1 0 1 1 0 0 0 1 | 1 1 1 0 1 0 0 0 | 2 4 3 | 9 | 2 | 4 | 2 3 2 | 7 | 2 | 3 |
| 7 5 6 2 4 0 3 1 | 1 1 0 0 0 0 1 1 | 1 0 1 1 0 0 1 0 | 1 1 1 0 1 0 0 0 | 2 5 3 | 10 | 2 | 5 | 2 3 2 | 7 | 2 | 3 |
| 7 5 6 2 4 1 0 3 | 1 1 0 0 0 1 0 1 | 1 0 1 1 0 0 0 1 | 1 1 1 0 1 0 0 0 | 4 4 3 | 11 | 3 | 4 | 3 3 2 | 8 | 2 | 3 |
| 7 5 6 2 4 1 3 0 | 1 1 0 0 0 1 1 0 | 1 0 1 1 0 0 1 0 | 1 1 1 0 1 0 0 0 | 3 5 3 | 11 | 3 | 5 | 2 3 2 | 7 | 2 | 3 |
| 7 5 6 2 4 3 0 1 | 1 1 0 0 0 1 0 1 | 1 0 1 1 0 1 0 0 | 1 1 1 0 1 0 0 0 | 4 5 3 | 12 | 3 | 5 | 3 3 2 | 8 | 2 | 3 |
| 7 5 6 2 4 3 1 0 | 1 1 0 0 0 1 1 0 | 1 0 1 1 0 1 0 0 | 1 1 1 0 1 0 0 0 | 3 5 3 | 11 | 3 | 5 | 2 3 2 | 7 | 2 | 3 |
| 7 5 6 2 1 4 0 3 | 1 1 0 0 1 0 0 1 | 1 0 1 1 0 0 0 1 | 1 1 1 0 0 1 0 0 | 4 4 3 | 11 | 3 | 4 | 3 3 2 | 8 | 2 | 3 |
| 7 5 6 2 1 4 3 0 | 1 1 0 0 1 0 1 0 | 1 0 1 1 0 0 1 0 | 1 1 1 0 0 1 0 0 | 5 5 3 | 13 | 3 | 5 | 3 3 2 | 8 | 2 | 3 |
| 7 5 6 2 1 3 4 0 | 1 1 0 0 1 1 0 0 | 1 0 1 1 0 1 0 0 | 1 1 1 0 0 0 1 0 | 3 5 3 | 11 | 3 | 5 | 2 3 2 | 7 | 2 | 3 |
| 7 5 6 2 3 4 0 1 | 1 1 0 0 1 0 0 1 | 1 0 1 1 1 0 0 0 | 1 1 1 0 0 1 0 0 | 4 3 3 | 10 | 3 | 4 | 3 2 2 | 7 | 2 | 3 |
| 7 5 6 2 3 4 1 0 | 1 1 0 0 1 0 1 0 | 1 0 1 1 1 0 0 0 | 1 1 1 0 0 1 0 0 | 5 3 3 | 11 | 3 | 5 | 3 2 2 | 7 | 2 | 3 |
| 7 5 6 2 3 1 4 0 | 1 1 0 0 1 1 0 0 | 1 0 1 1 1 0 0 0 | 1 1 1 0 0 0 1 0 | 3 3 3 | 9 | 3 | 3 | 2 2 2 | 6 | 2 | 2 |
| 7 5 6 4 2 0 1 3 | 1 1 0 0 0 0 1 1 | 1 0 1 0 1 0 0 1 | 1 1 1 1 0 0 0 0 | 2 6 1 | 9 | 1 | 6 | 2 3 1 | 6 | 1 | 3 |
| 7 5 6 4 2 0 3 1 | 1 1 0 0 0 0 1 1 | 1 0 1 0 1 0 1 0 | 1 1 1 1 0 0 0 0 | 2 7 1 | 10 | 1 | 7 | 2 3 1 | 6 | 1 | 3 |
| 7 5 6 4 2 1 0 3 | 1 1 0 0 0 1 0 1 | 1 0 1 0 1 0 0 1 | 1 1 1 1 0 0 0 0 | 4 6 1 | 11 | 1 | 6 | 3 3 1 | 7 | 1 | 3 |
| 7 5 6 4 2 1 3 0 | 1 1 0 0 0 1 1 0 | 1 0 1 0 1 0 1 0 | 1 1 1 1 0 0 0 0 | 3 7 1 | 11 | 1 | 7 | 2 3 1 | 6 | 1 | 3 |
| 7 5 6 4 2 3 0 1 | 1 1 0 0 0 1 0 1 | 1 0 1 0 1 1 0 0 | 1 1 1 1 0 0 0 0 | 4 5 1 | 10 | 1 | 5 | 3 3 1 | 7 | 1 | 3 |
| 7 5 6 4 2 3 1 0 | 1 1 0 0 0 1 1 0 | 1 0 1 0 1 1 0 0 | 1 1 1 1 0 0 0 0 | 3 5 1 | 9 | 1 | 5 | 2 3 1 | 6 | 1 | 3 |
| 7 5 6 4 0 2 1 3 | 1 1 0 0 0 0 1 1 | 1 0 1 0 0 1 0 1 | 1 1 1 1 0 0 0 0 | 2 6 1 | 9 | 1 | 6 | 2 3 1 | 6 | 1 | 3 |
| 7 5 6 4 0 2 3 1 | 1 1 0 0 0 0 1 1 | 1 0 1 0 0 1 1 0 | 1 1 1 1 0 0 0 0 | 2 5 1 | 8 | 1 | 5 | 2 3 1 | 6 | 1 | 3 |
| 7 5 6 4 0 1 2 3 | 1 1 0 0 0 1 0 1 | 1 0 1 0 0 0 1 1 | 1 1 1 1 0 0 0 0 | 4 4 1 | 9 | 1 | 4 | 3 3 1 | 7 | 1 | 3 |
| 7 5 6 4 0 1 3 2 | 1 1 0 0 0 1 1 0 | 1 0 1 0 0 0 1 1 | 1 1 1 1 0 0 0 0 | 3 4 1 | 8 | 1 | 4 | 2 3 1 | 6 | 1 | 3 |
| 7 5 6 4 0 3 1 2 | 1 1 0 0 0 1 1 0 | 1 0 1 0 0 1 0 1 | 1 1 1 1 0 0 0 0 | 3 6 1 | 10 | 1 | 6 | 2 3 1 | 6 | 1 | 3 |
| 7 5 6 4 0 3 2 1 | 1 1 0 0 0 1 0 1 | 1 0 1 0 0 1 1 0 | 1 1 1 1 0 0 0 0 | 4 5 1 | 10 | 1 | 5 | 3 3 1 | 7 | 1 | 3 |
| 7 5 6 4 1 2 0 3 | 1 1 0 0 1 0 0 1 | 1 0 1 0 0 1 0 1 | 1 1 1 1 0 0 0 0 | 4 6 1 | 11 | 1 | 6 | 3 3 1 | 7 | 1 | 3 |
| 7 5 6 4 1 2 3 0 | 1 1 0 0 1 0 1 0 | 1 0 1 0 0 1 1 0 | 1 1 1 1 0 0 0 0 | 5 5 1 | 11 | 1 | 5 | 3 3 1 | 7 | 1 | 3 |
| 7 5 6 4 1 0 2 3 | 1 1 0 0 1 0 0 1 | 1 0 1 0 0 0 1 1 | 1 1 1 1 0 0 0 0 | 4 4 1 | 9 | 1 | 4 | 3 3 1 | 7 | 1 | 3 |
| 7 5 6 4 1 0 3 2 | 1 1 0 0 1 0 1 0 | 1 0 1 0 0 0 1 1 | 1 1 1 1 0 0 0 0 | 5 4 1 | 10 | 1 | 5 | 3 3 1 | 7 | 1 | 3 |
| 7 5 6 4 1 3 2 0 | 1 1 0 0 1 1 0 0 | 1 0 1 0 0 1 1 0 | 1 1 1 1 0 0 0 0 | 3 5 1 | 9 | 1 | 5 | 2 3 1 | 6 | 1 | 3 |
| 7 5 6 4 1 3 0 2 | 1 1 0 0 1 1 0 0 | 1 0 1 0 0 1 0 1 | 1 1 1 1 0 0 0 0 | 3 6 1 | 10 | 1 | 6 | 2 3 1 | 6 | 1 | 3 |
| 7 5 6 4 3 2 0 1 | 1 1 0 0 1 0 0 1 | 1 0 1 0 1 1 0 0 | 1 1 1 1 0 0 0 0 | 4 5 1 | 10 | 1 | 5 | 3 3 1 | 7 | 1 | 3 |
| 7 5 6 4 3 2 1 0 | 1 1 0 0 1 0 1 0 | 1 0 1 0 1 1 0 0 | 1 1 1 1 0 0 0 0 | 5 5 1 | 11 | 1 | 5 | 3 3 1 | 7 | 1 | 3 |
| 7 5 6 4 3 0 2 1 | 1 1 0 0 1 0 0 1 | 1 0 1 0 1 0 1 0 | 1 1 1 1 0 0 0 0 | 4 7 1 | 12 | 1 | 7 | 3 3 1 | 7 | 1 | 3 |
| 7 5 6 4 3 0 1 2 | 1 1 0 0 1 0 1 0 | 1 0 1 0 1 0 0 1 | 1 1 1 1 0 0 0 0 | 5 6 1 | 12 | 1 | 6 | 3 3 1 | 7 | 1 | 3 |
| 7 5 6 4 3 1 2 0 | 1 1 0 0 1 1 0 0 | 1 0 1 0 1 0 1 0 | 1 1 1 1 0 0 0 0 | 3 7 1 | 11 | 1 | 7 | 2 3 1 | 6 | 1 | 3 |
| 7 5 6 4 3 1 0 2 | 1 1 0 0 1 1 0 0 | 1 0 1 0 1 0 0 1 | 1 1 1 1 0 0 0 0 | 3 6 1 | 10 | 1 | 6 | 2 3 1 | 6 | 1 | 3 |
| 7 5 6 1 2 4 0 3 | 1 1 0 1 0 0 0 1 | 1 0 1 0 1 0 0 1 | 1 1 1 0 0 1 0 0 | 4 6 3 | 13 | 3 | 6 | 3 3 2 | 8 | 2 | 3 |
| 7 5 6 1 2 4 3 0 | 1 1 0 1 0 0 1 0 | 1 0 1 0 1 0 1 0 | 1 1 1 0 0 1 0 0 | 5 7 3 | 15 | 3 | 7 | 3 3 2 | 8 | 2 | 3 |
| 7 5 6 1 2 3 4 0 | 1 1 0 1 0 1 0 0 | 1 0 1 0 1 1 0 0 | 1 1 1 0 0 0 1 0 | 5 5 3 | 13 | 3 | 5 | 3 3 2 | 8 | 2 | 3 |
| 7 5 6 1 4 2 0 3 | 1 1 0 1 0 0 0 1 | 1 0 1 0 0 1 0 1 | 1 1 1 0 1 0 0 0 | 4 6 3 | 13 | 3 | 6 | 3 3 2 | 8 | 2 | 3 |
| 7 5 6 1 4 2 3 0 | 1 1 0 1 0 0 1 0 | 1 0 1 0 0 1 1 0 | 1 1 1 0 1 0 0 0 | 5 5 3 | 13 | 3 | 5 | 3 3 2 | 8 | 2 | 3 |
| 7 5 6 1 4 0 2 3 | 1 1 0 1 0 0 0 1 | 1 0 1 0 0 0 1 1 | 1 1 1 0 1 0 0 0 | 4 4 3 | 11 | 3 | 4 | 3 3 2 | 8 | 2 | 3 |
| 7 5 6 1 4 0 3 2 | 1 1 0 1 0 0 1 0 | 1 0 1 0 0 0 1 1 | 1 1 1 0 1 0 0 0 | 5 4 3 | 12 | 3 | 5 | 3 3 2 | 8 | 2 | 3 |
| 7 5 6 1 4 3 2 0 | 1 1 0 1 0 1 0 0 | 1 0 1 0 0 1 1 0 | 1 1 1 0 1 0 0 0 | 5 5 3 | 13 | 3 | 5 | 3 3 2 | 8 | 2 | 3 |
| 7 5 6 1 4 3 0 2 | 1 1 0 1 0 1 0 0 | 1 0 1 0 0 1 0 1 | 1 1 1 0 1 0 0 0 | 5 6 3 | 14 | 3 | 6 | 3 3 2 | 8 | 2 | 3 |
| 7 5 6 1 3 2 4 0 | 1 1 0 1 1 0 0 0 | 1 0 1 0 1 1 0 0 | 1 1 1 0 0 0 1 0 | 3 5 3 | 11 | 3 | 5 | 2 3 2 | 7 | 2 | 3 |
| 7 5 6 1 3 4 2 0 | 1 1 0 1 1 0 0 0 | 1 0 1 0 1 0 1 0 | 1 1 1 0 0 1 0 0 | 3 7 3 | 13 | 3 | 7 | 2 3 2 | 7 | 2 | 3 |
| 7 5 6 1 3 4 0 2 | 1 1 0 1 1 0 0 0 | 1 0 1 0 1 0 0 1 | 1 1 1 0 0 1 0 0 | 3 6 3 | 12 | 3 | 6 | 2 3 2 | 7 | 2 | 3 |
| 7 5 6 3 2 4 0 1 | 1 1 0 1 0 0 0 1 | 1 0 1 1 1 0 0 0 | 1 1 1 0 0 1 0 0 | 4 3 3 | 10 | 3 | 4 | 3 2 2 | 7 | 2 | 3 |
| 7 5 6 3 2 4 1 0 | 1 1 0 1 0 0 1 0 | 1 0 1 1 1 0 0 0 | 1 1 1 0 0 1 0 0 | 5 3 3 | 11 | 3 | 5 | 3 2 2 | 7 | 2 | 3 |
| 7 5 6 3 2 1 4 0 | 1 1 0 1 0 1 0 0 | 1 0 1 1 1 0 0 0 | 1 1 1 0 0 0 1 0 | 5 3 3 | 11 | 3 | 5 | 3 2 2 | 7 | 2 | 3 |
| 7 5 6 3 4 2 0 1 | 1 1 0 1 0 0 0 1 | 1 0 1 1 0 1 0 0 | 1 1 1 0 1 0 0 0 | 4 5 3 | 12 | 3 | 5 | 3 3 2 | 8 | 2 | 3 |
| 7 5 6 3 4 2 1 0 | 1 1 0 1 0 0 1 0 | 1 0 1 1 0 1 0 0 | 1 1 1 0 1 0 0 0 | 5 5 3 | 13 | 3 | 5 | 3 3 2 | 8 | 2 | 3 |
| 7 5 6 3 4 0 2 1 | 1 1 0 1 0 0 0 1 | 1 0 1 1 0 0 1 0 | 1 1 1 0 1 0 0 0 | 4 5 3 | 12 | 3 | 5 | 3 3 2 | 8 | 2 | 3 |
| 7 5 6 3 4 0 1 2 | 1 1 0 1 0 0 1 0 | 1 0 1 1 0 0 0 1 | 1 1 1 0 1 0 0 0 | 5 4 3 | 12 | 3 | 5 | 3 3 2 | 8 | 2 | 3 |
| 7 5 6 3 4 1 2 0 | 1 1 0 1 0 1 0 0 | 1 0 1 1 0 0 1 0 | 1 1 1 0 1 0 0 0 | 5 5 3 | 13 | 3 | 5 | 3 3 2 | 8 | 2 | 3 |
| 7 5 6 3 4 1 0 2 | 1 1 0 1 0 1 0 0 | 1 0 1 1 0 0 0 1 | 1 1 1 0 1 0 0 0 | 5 4 3 | 12 | 3 | 5 | 3 3 2 | 8 | 2 | 3 |
| 7 5 6 3 1 2 4 0 | 1 1 0 1 1 0 0 0 | 1 0 1 1 0 1 0 0 | 1 1 1 0 0 0 1 0 | 3 5 3 | 11 | 3 | 5 | 2 3 2 | 7 | 2 | 3 |
| 7 5 6 3 1 4 2 0 | 1 1 0 1 1 0 0 0 | 1 0 1 1 0 0 1 0 | 1 1 1 0 0 1 0 0 | 3 5 3 | 11 | 3 | 5 | 2 3 2 | 7 | 2 | 3 |
| 7 5 6 3 1 4 0 2 | 1 1 0 1 1 0 0 0 | 1 0 1 1 0 0 0 1 | 1 1 1 0 0 1 0 0 | 3 4 3 | 10 | 3 | 4 | 2 3 2 | 7 | 2 | 3 |
| 7 5 1 6 2 4 0 3 | 1 1 1 0 0 0 0 1 | 1 0 0 1 1 0 0 1 | 1 1 0 1 0 1 0 0 | 2 4 5 | 11 | 2 | 5 | 2 3 3 | 8 | 2 | 3 |
| 7 5 1 6 2 4 3 0 | 1 1 1 0 0 0 1 0 | 1 0 0 1 1 0 1 0 | 1 1 0 1 0 1 0 0 | 3 5 5 | 13 | 3 | 5 | 2 3 3 | 8 | 2 | 3 |
| 7 5 1 6 2 3 4 0 | 1 1 1 0 0 1 0 0 | 1 0 0 1 1 1 0 0 | 1 1 0 1 0 0 1 0 | 3 3 5 | 11 | 3 | 5 | 2 2 3 | 7 | 2 | 3 |
| 7 5 1 6 4 2 0 3 | 1 1 1 0 0 0 0 1 | 1 0 0 1 0 1 0 1 | 1 1 0 1 1 0 0 0 | 2 6 3 | 11 | 2 | 6 | 2 3 2 | 7 | 2 | 3 |
| 7 5 1 6 4 2 3 0 | 1 1 1 0 0 0 1 0 | 1 0 0 1 0 1 1 0 | 1 1 0 1 1 0 0 0 | 3 5 3 | 11 | 3 | 5 | 2 3 2 | 7 | 2 | 3 |
| 7 5 1 6 4 0 2 3 | 1 1 1 0 0 0 0 1 | 1 0 0 1 0 0 1 1 | 1 1 0 1 1 0 0 0 | 2 4 3 | 9 | 2 | 4 | 2 3 2 | 7 | 2 | 3 |
| 7 5 1 6 4 0 3 2 | 1 1 1 0 0 0 1 0 | 1 0 0 1 0 0 1 1 | 1 1 0 1 1 0 0 0 | 3 4 3 | 10 | 3 | 4 | 2 3 2 | 7 | 2 | 3 |
| 7 5 1 6 4 3 2 0 | 1 1 1 0 0 1 0 0 | 1 0 0 1 0 1 1 0 | 1 1 0 1 1 0 0 0 | 3 5 3 | 11 | 3 | 5 | 2 3 2 | 7 | 2 | 3 |
| 7 5 1 6 4 3 0 2 | 1 1 1 0 0 1 0 0 | 1 0 0 1 0 1 0 1 | 1 1 0 1 1 0 0 0 | 3 6 3 | 12 | 3 | 6 | 2 3 2 | 7 | 2 | 3 |

Appendix A - Evaluation of valid orderings for 3-bit MBC cells

| States order | 1st state | 2nd state | 3rd state | 4th state | 5th state | 6th state | 7th state | 8th state |
|---|---|---|---|---|---|---|---|---|
| 7 5 1 6 3 2 4 0 | 1 1 1 | 1 0 1 | 0 0 1 | 1 1 0 | 0 1 1 | 0 1 0 | 1 0 0 | 0 0 0 |
| 7 5 1 6 3 4 2 0 | 1 1 1 | 1 0 1 | 0 0 1 | 1 1 0 | 0 1 1 | 1 0 0 | 0 1 0 | 0 0 0 |
| 7 5 1 6 3 4 0 2 | 1 1 1 | 1 0 1 | 0 0 1 | 1 1 0 | 0 1 1 | 1 0 0 | 0 0 0 | 0 1 0 |
| 7 5 1 3 6 2 4 0 | 1 1 1 | 1 0 1 | 0 0 1 | 0 1 1 | 1 1 0 | 0 1 0 | 1 0 0 | 0 0 0 |
| 7 5 1 3 6 4 2 0 | 1 1 1 | 1 0 1 | 0 0 1 | 0 1 1 | 1 1 0 | 1 0 0 | 0 1 0 | 0 0 0 |
| 7 5 1 3 6 4 0 2 | 1 1 1 | 1 0 1 | 0 0 1 | 0 1 1 | 1 1 0 | 1 0 0 | 0 0 0 | 0 1 0 |
| 7 5 3 6 2 4 0 1 | 1 1 1 | 1 0 1 | 0 1 1 | 1 1 0 | 0 1 0 | 1 0 0 | 0 0 0 | 0 0 1 |
| 7 5 3 6 2 4 1 0 | 1 1 1 | 1 0 1 | 0 1 1 | 1 1 0 | 0 1 0 | 1 0 0 | 0 0 1 | 0 0 0 |
| 7 5 3 6 2 1 4 0 | 1 1 1 | 1 0 1 | 0 1 1 | 1 1 0 | 0 1 0 | 0 0 1 | 1 0 0 | 0 0 0 |
| 7 5 3 6 4 2 0 1 | 1 1 1 | 1 0 1 | 0 1 1 | 1 1 0 | 1 0 0 | 0 1 0 | 0 0 0 | 0 0 1 |
| 7 5 3 6 4 2 1 0 | 1 1 1 | 1 0 1 | 0 1 1 | 1 1 0 | 1 0 0 | 0 1 0 | 0 0 1 | 0 0 0 |
| 7 5 3 6 4 0 2 1 | 1 1 1 | 1 0 1 | 0 1 1 | 1 1 0 | 1 0 0 | 0 0 0 | 0 1 0 | 0 0 1 |
| 7 5 3 6 4 0 1 2 | 1 1 1 | 1 0 1 | 0 1 1 | 1 1 0 | 1 0 0 | 0 0 0 | 0 0 1 | 0 1 0 |
| 7 5 3 6 4 1 2 0 | 1 1 1 | 1 0 1 | 0 1 1 | 1 1 0 | 1 0 0 | 0 0 1 | 0 1 0 | 0 0 0 |
| 7 5 3 6 4 1 0 2 | 1 1 1 | 1 0 1 | 0 1 1 | 1 1 0 | 1 0 0 | 0 0 1 | 0 0 0 | 0 1 0 |
| 7 5 3 6 1 2 4 0 | 1 1 1 | 1 0 1 | 0 1 1 | 1 1 0 | 0 0 1 | 0 1 0 | 1 0 0 | 0 0 0 |
| 7 5 3 6 1 4 2 0 | 1 1 1 | 1 0 1 | 0 1 1 | 1 1 0 | 0 0 1 | 1 0 0 | 0 1 0 | 0 0 0 |
| 7 5 3 6 1 4 0 2 | 1 1 1 | 1 0 1 | 0 1 1 | 1 1 0 | 0 0 1 | 1 0 0 | 0 0 0 | 0 1 0 |
| 7 5 3 1 6 2 4 0 | 1 1 1 | 1 0 1 | 0 1 1 | 0 0 1 | 1 1 0 | 0 1 0 | 1 0 0 | 0 0 0 |
| 7 5 3 1 6 4 2 0 | 1 1 1 | 1 0 1 | 0 1 1 | 0 0 1 | 1 1 0 | 1 0 0 | 0 1 0 | 0 0 0 |
| 7 5 3 1 6 4 0 2 | 1 1 1 | 1 0 1 | 0 1 1 | 0 0 1 | 1 1 0 | 1 0 0 | 0 0 0 | 0 1 0 |
| 7 3 6 2 4 0 5 1 | 1 1 1 | 0 1 1 | 1 1 0 | 0 1 0 | 1 0 0 | 0 0 0 | 1 0 1 | 0 0 1 |
| 7 3 6 2 4 5 0 1 | 1 1 1 | 0 1 1 | 1 1 0 | 0 1 0 | 1 0 0 | 1 0 1 | 0 0 0 | 0 0 1 |
| 7 3 6 2 4 5 1 0 | 1 1 1 | 0 1 1 | 1 1 0 | 0 1 0 | 1 0 0 | 1 0 1 | 0 0 1 | 0 0 0 |
| 7 3 6 2 5 4 0 1 | 1 1 1 | 0 1 1 | 1 1 0 | 0 1 0 | 1 0 1 | 1 0 0 | 0 0 0 | 0 0 1 |
| 7 3 6 2 5 4 1 0 | 1 1 1 | 0 1 1 | 1 1 0 | 0 1 0 | 1 0 1 | 1 0 0 | 0 0 1 | 0 0 0 |
| 7 3 6 2 5 1 4 0 | 1 1 1 | 0 1 1 | 1 1 0 | 0 1 0 | 1 0 1 | 0 0 1 | 1 0 0 | 0 0 0 |
| 7 3 6 4 2 0 5 1 | 1 1 1 | 0 1 1 | 1 1 0 | 1 0 0 | 0 1 0 | 0 0 0 | 1 0 1 | 0 0 1 |
| 7 3 6 4 2 5 0 1 | 1 1 1 | 0 1 1 | 1 1 0 | 1 0 0 | 0 1 0 | 1 0 1 | 0 0 0 | 0 0 1 |
| 7 3 6 4 2 5 1 0 | 1 1 1 | 0 1 1 | 1 1 0 | 1 0 0 | 0 1 0 | 1 0 1 | 0 0 1 | 0 0 0 |
| 7 3 6 4 0 2 5 1 | 1 1 1 | 0 1 1 | 1 1 0 | 1 0 0 | 0 0 0 | 0 1 0 | 1 0 1 | 0 0 1 |
| 7 3 6 4 0 5 2 1 | 1 1 1 | 0 1 1 | 1 1 0 | 1 0 0 | 0 0 0 | 1 0 1 | 0 1 0 | 0 0 1 |
| 7 3 6 4 0 5 1 2 | 1 1 1 | 0 1 1 | 1 1 0 | 1 0 0 | 0 0 0 | 1 0 1 | 0 0 1 | 0 1 0 |
| 7 3 6 4 5 2 0 1 | 1 1 1 | 0 1 1 | 1 1 0 | 1 0 0 | 1 0 1 | 0 1 0 | 0 0 0 | 0 0 1 |
| 7 3 6 4 5 2 1 0 | 1 1 1 | 0 1 1 | 1 1 0 | 1 0 0 | 1 0 1 | 0 1 0 | 0 0 1 | 0 0 0 |
| 7 3 6 4 5 0 2 1 | 1 1 1 | 0 1 1 | 1 1 0 | 1 0 0 | 1 0 1 | 0 0 0 | 0 1 0 | 0 0 1 |
| 7 3 6 4 5 0 1 2 | 1 1 1 | 0 1 1 | 1 1 0 | 1 0 0 | 1 0 1 | 0 0 0 | 0 0 1 | 0 1 0 |
| 7 3 6 4 5 1 2 0 | 1 1 1 | 0 1 1 | 1 1 0 | 1 0 0 | 1 0 1 | 0 0 1 | 0 1 0 | 0 0 0 |
| 7 3 6 4 5 1 0 2 | 1 1 1 | 0 1 1 | 1 1 0 | 1 0 0 | 1 0 1 | 0 0 1 | 0 0 0 | 0 1 0 |
| 7 3 6 5 2 4 0 1 | 1 1 1 | 0 1 1 | 1 1 0 | 1 0 1 | 0 1 0 | 1 0 0 | 0 0 0 | 0 0 1 |
| 7 3 6 5 2 4 1 0 | 1 1 1 | 0 1 1 | 1 1 0 | 1 0 1 | 0 1 0 | 1 0 0 | 0 0 1 | 0 0 0 |
| 7 3 6 5 2 1 4 0 | 1 1 1 | 0 1 1 | 1 1 0 | 1 0 1 | 0 1 0 | 0 0 1 | 1 0 0 | 0 0 0 |
| 7 3 6 5 4 2 0 1 | 1 1 1 | 0 1 1 | 1 1 0 | 1 0 1 | 1 0 0 | 0 1 0 | 0 0 0 | 0 0 1 |
| 7 3 6 5 4 2 1 0 | 1 1 1 | 0 1 1 | 1 1 0 | 1 0 1 | 1 0 0 | 0 1 0 | 0 0 1 | 0 0 0 |
| 7 3 6 5 4 0 2 1 | 1 1 1 | 0 1 1 | 1 1 0 | 1 0 1 | 1 0 0 | 0 0 0 | 0 1 0 | 0 0 1 |
| 7 3 6 5 4 0 1 2 | 1 1 1 | 0 1 1 | 1 1 0 | 1 0 1 | 1 0 0 | 0 0 0 | 0 0 1 | 0 1 0 |
| 7 3 6 5 4 1 2 0 | 1 1 1 | 0 1 1 | 1 1 0 | 1 0 1 | 1 0 0 | 0 0 1 | 0 1 0 | 0 0 0 |
| 7 3 6 5 4 1 0 2 | 1 1 1 | 0 1 1 | 1 1 0 | 1 0 1 | 1 0 0 | 0 0 1 | 0 0 0 | 0 1 0 |
| 7 3 6 5 1 2 4 0 | 1 1 1 | 0 1 1 | 1 1 0 | 1 0 1 | 0 0 1 | 0 1 0 | 1 0 0 | 0 0 0 |
| 7 3 6 5 1 4 2 0 | 1 1 1 | 0 1 1 | 1 1 0 | 1 0 1 | 0 0 1 | 1 0 0 | 0 1 0 | 0 0 0 |
| 7 3 6 5 1 4 0 2 | 1 1 1 | 0 1 1 | 1 1 0 | 1 0 1 | 0 0 1 | 1 0 0 | 0 0 0 | 0 1 0 |
| 7 3 5 6 2 4 0 1 | 1 1 1 | 0 1 1 | 1 0 1 | 1 1 0 | 0 1 0 | 1 0 0 | 0 0 0 | 0 0 1 |
| 7 3 5 6 2 4 1 0 | 1 1 1 | 0 1 1 | 1 0 1 | 1 1 0 | 0 1 0 | 1 0 0 | 0 0 1 | 0 0 0 |
| 7 3 5 6 2 1 4 0 | 1 1 1 | 0 1 1 | 1 0 1 | 1 1 0 | 0 1 0 | 0 0 1 | 1 0 0 | 0 0 0 |
| 7 3 5 6 4 2 0 1 | 1 1 1 | 0 1 1 | 1 0 1 | 1 1 0 | 1 0 0 | 0 1 0 | 0 0 0 | 0 0 1 |
| 7 3 5 6 4 2 1 0 | 1 1 1 | 0 1 1 | 1 0 1 | 1 1 0 | 1 0 0 | 0 1 0 | 0 0 1 | 0 0 0 |
| 7 3 5 6 4 0 2 1 | 1 1 1 | 0 1 1 | 1 0 1 | 1 1 0 | 1 0 0 | 0 0 0 | 0 1 0 | 0 0 1 |
| 7 3 5 6 4 0 1 2 | 1 1 1 | 0 1 1 | 1 0 1 | 1 1 0 | 1 0 0 | 0 0 0 | 0 0 1 | 0 1 0 |
| 7 3 5 6 4 1 2 0 | 1 1 1 | 0 1 1 | 1 0 1 | 1 1 0 | 1 0 0 | 0 0 1 | 0 1 0 | 0 0 0 |
| 7 3 5 6 4 1 0 2 | 1 1 1 | 0 1 1 | 1 0 1 | 1 1 0 | 1 0 0 | 0 0 1 | 0 0 0 | 0 1 0 |
| 7 3 5 6 1 2 4 0 | 1 1 1 | 0 1 1 | 1 0 1 | 1 1 0 | 0 0 1 | 0 1 0 | 1 0 0 | 0 0 0 |
| 7 3 5 6 1 4 2 0 | 1 1 1 | 0 1 1 | 1 0 1 | 1 1 0 | 0 0 1 | 1 0 0 | 0 1 0 | 0 0 0 |
| 7 3 5 6 1 4 0 2 | 1 1 1 | 0 1 1 | 1 0 1 | 1 1 0 | 0 0 1 | 1 0 0 | 0 0 0 | 0 1 0 |
| 7 3 5 1 6 2 4 0 | 1 1 1 | 0 1 1 | 1 0 1 | 0 0 1 | 1 1 0 | 0 1 0 | 1 0 0 | 0 0 0 |
| 7 3 5 1 6 4 2 0 | 1 1 1 | 0 1 1 | 1 0 1 | 0 0 1 | 1 1 0 | 1 0 0 | 0 1 0 | 0 0 0 |
| 7 3 5 1 6 4 0 2 | 1 1 1 | 0 1 1 | 1 0 1 | 0 0 1 | 1 1 0 | 1 0 0 | 0 0 0 | 0 1 0 |

Appendix A - Evaluation of

| States order | Lower bit sequence | Middle bit sequence | Upper bit sequence | static comp | T | Min | Max | dynamic comp | T | Min | Max |
|---|---|---|---|---|---|---|---|---|---|---|---|
| 7 5 1 6 3 2 4 0 | 1 1 1 0 1 0 0 0 | 1 0 0 1 1 1 0 0 | 1 1 0 1 0 0 1 0 | 3 3 5 | 11 | 3 | 5 | 2 2 3 | 7 | 2 | 3 |
| 7 5 1 6 3 4 2 0 | 1 1 1 0 1 0 0 0 | 1 0 0 1 1 0 1 0 | 1 1 0 1 0 1 0 0 | 3 5 5 | 13 | 3 | 5 | 2 3 3 | 8 | 2 | 3 |
| 7 5 1 6 3 4 0 2 | 1 1 1 0 1 0 0 0 | 1 0 0 1 1 0 0 1 | 1 1 0 1 0 1 0 0 | 3 4 5 | 12 | 3 | 5 | 2 3 3 | 8 | 2 | 3 |
| 7 5 1 3 6 2 4 0 | 1 1 1 1 0 0 0 0 | 1 0 0 1 1 1 0 0 | 1 1 0 0 1 0 1 0 | 1 3 5 | 9 | 1 | 5 | 1 2 3 | 6 | 1 | 3 |
| 7 5 1 3 6 4 2 0 | 1 1 1 1 0 0 0 0 | 1 0 0 1 1 0 1 0 | 1 1 0 0 1 1 0 0 | 1 5 3 | 9 | 1 | 5 | 1 3 2 | 6 | 1 | 3 |
| 7 5 1 3 6 4 0 2 | 1 1 1 1 0 0 0 0 | 1 0 0 1 1 0 0 1 | 1 1 0 0 1 1 0 0 | 1 4 3 | 8 | 1 | 4 | 1 3 2 | 6 | 1 | 3 |
| 7 5 3 6 2 4 0 1 | 1 1 1 0 0 0 0 1 | 1 0 1 1 1 0 0 0 | 1 1 0 1 0 1 0 0 | 2 3 5 | 10 | 2 | 5 | 2 2 3 | 7 | 2 | 3 |
| 7 5 3 6 2 4 1 0 | 1 1 1 0 0 0 1 0 | 1 0 1 1 1 0 0 0 | 1 1 0 1 0 1 0 0 | 3 3 5 | 11 | 3 | 5 | 2 2 3 | 7 | 2 | 3 |
| 7 5 3 6 2 1 4 0 | 1 1 1 0 0 1 0 0 | 1 0 1 1 1 0 0 0 | 1 1 0 1 0 0 1 0 | 3 3 5 | 11 | 3 | 5 | 2 2 3 | 7 | 2 | 3 |
| 7 5 3 6 4 2 0 1 | 1 1 1 0 0 0 0 1 | 1 0 1 1 0 1 0 0 | 1 1 0 1 1 0 0 0 | 2 5 3 | 10 | 2 | 5 | 2 3 2 | 7 | 2 | 3 |
| 7 5 3 6 4 2 1 0 | 1 1 1 0 0 0 1 0 | 1 0 1 1 0 1 0 0 | 1 1 0 1 1 0 0 0 | 3 5 3 | 11 | 3 | 5 | 2 3 2 | 7 | 2 | 3 |
| 7 5 3 6 4 0 2 1 | 1 1 1 0 0 0 0 1 | 1 0 1 1 0 0 1 0 | 1 1 0 1 1 0 0 0 | 2 5 3 | 10 | 2 | 5 | 2 3 2 | 7 | 2 | 3 |
| 7 5 3 6 4 0 1 2 | 1 1 1 0 0 0 1 0 | 1 0 1 1 0 0 0 1 | 1 1 0 1 1 0 0 0 | 3 4 3 | 10 | 3 | 4 | 2 3 2 | 7 | 2 | 3 |
| 7 5 3 6 4 1 2 0 | 1 1 1 0 0 1 0 0 | 1 0 1 1 0 0 1 0 | 1 1 0 1 1 0 0 0 | 3 5 3 | 11 | 3 | 5 | 2 3 2 | 7 | 2 | 3 |
| 7 5 3 6 4 1 0 2 | 1 1 1 0 0 1 0 0 | 1 0 1 1 0 0 0 1 | 1 1 0 1 1 0 0 0 | 3 4 3 | 10 | 3 | 4 | 2 3 2 | 7 | 2 | 3 |
| 7 5 3 6 1 2 4 0 | 1 1 1 0 1 0 0 0 | 1 0 1 1 0 1 0 0 | 1 1 0 1 0 0 1 0 | 3 5 5 | 13 | 3 | 5 | 2 3 3 | 8 | 2 | 3 |
| 7 5 3 6 1 4 2 0 | 1 1 1 0 1 0 0 0 | 1 0 1 1 0 0 1 0 | 1 1 0 1 0 1 0 0 | 3 5 5 | 13 | 3 | 5 | 2 3 3 | 8 | 2 | 3 |
| 7 5 3 6 1 4 0 2 | 1 1 1 0 1 0 0 0 | 1 0 1 1 0 0 0 1 | 1 1 0 1 0 1 0 0 | 3 4 5 | 12 | 3 | 5 | 2 3 3 | 8 | 2 | 3 |
| 7 5 3 1 6 2 4 0 | 1 1 1 1 0 0 0 0 | 1 0 1 0 1 1 0 0 | 1 1 0 0 1 0 1 0 | 1 5 5 | 11 | 1 | 5 | 1 3 3 | 7 | 1 | 3 |
| 7 5 3 1 6 4 2 0 | 1 1 1 1 0 0 0 0 | 1 0 1 0 1 0 1 0 | 1 1 0 0 1 1 0 0 | 1 7 3 | 11 | 1 | 7 | 1 3 2 | 6 | 1 | 3 |
| 7 5 3 1 6 4 0 2 | 1 1 1 1 0 0 0 0 | 1 0 1 0 1 0 0 1 | 1 1 0 0 1 1 0 0 | 1 6 3 | 10 | 1 | 6 | 1 3 2 | 6 | 1 | 3 |
| 7 3 6 2 4 0 5 1 | 1 1 0 0 0 0 1 1 | 1 1 1 1 0 0 0 0 | 1 0 1 0 1 0 1 0 | 2 1 7 | 10 | 1 | 7 | 2 1 3 | 6 | 1 | 3 |
| 7 3 6 2 4 5 0 1 | 1 1 0 0 0 1 0 1 | 1 1 1 1 0 0 0 0 | 1 0 1 0 1 1 0 0 | 4 1 5 | 10 | 1 | 5 | 3 1 3 | 7 | 1 | 3 |
| 7 3 6 2 4 5 1 0 | 1 1 0 0 0 1 1 0 | 1 1 1 1 0 0 0 0 | 1 0 1 0 1 1 0 0 | 3 1 5 | 9 | 1 | 5 | 2 1 3 | 6 | 1 | 3 |
| 7 3 6 2 5 4 0 1 | 1 1 0 0 1 0 0 1 | 1 1 1 1 0 0 0 0 | 1 0 1 0 1 1 0 0 | 4 1 5 | 10 | 1 | 5 | 3 1 3 | 7 | 1 | 3 |
| 7 3 6 2 5 4 1 0 | 1 1 0 0 1 0 1 0 | 1 1 1 1 0 0 0 0 | 1 0 1 0 1 1 0 0 | 5 1 5 | 11 | 1 | 5 | 3 1 3 | 7 | 1 | 3 |
| 7 3 6 2 5 1 4 0 | 1 1 0 0 1 1 0 0 | 1 1 1 1 0 0 0 0 | 1 0 1 0 1 0 1 0 | 3 1 7 | 11 | 1 | 7 | 2 1 3 | 6 | 1 | 3 |
| 7 3 6 4 2 0 5 1 | 1 1 0 0 0 0 1 1 | 1 1 1 0 1 0 0 0 | 1 0 1 1 0 0 1 0 | 2 3 5 | 10 | 2 | 5 | 2 2 3 | 7 | 2 | 3 |
| 7 3 6 4 2 5 0 1 | 1 1 0 0 0 1 0 1 | 1 1 1 0 1 0 0 0 | 1 0 1 1 0 1 0 0 | 4 3 5 | 12 | 3 | 5 | 3 2 3 | 8 | 2 | 3 |
| 7 3 6 4 2 5 1 0 | 1 1 0 0 0 1 1 0 | 1 1 1 0 1 0 0 0 | 1 0 1 1 0 1 0 0 | 3 3 5 | 11 | 3 | 5 | 2 2 3 | 7 | 2 | 3 |
| 7 3 6 4 0 2 5 1 | 1 1 0 0 0 0 1 1 | 1 1 1 0 0 1 0 0 | 1 0 1 1 0 0 1 0 | 2 3 5 | 10 | 2 | 5 | 2 2 3 | 7 | 2 | 3 |
| 7 3 6 4 0 5 2 1 | 1 1 0 0 0 1 0 1 | 1 1 1 0 0 0 1 0 | 1 0 1 1 0 1 0 0 | 4 3 5 | 12 | 3 | 5 | 3 2 3 | 8 | 2 | 3 |
| 7 3 6 4 0 5 1 2 | 1 1 0 0 0 1 1 0 | 1 1 1 0 0 0 0 1 | 1 0 1 1 0 1 0 0 | 3 2 5 | 10 | 2 | 5 | 2 2 3 | 7 | 2 | 3 |
| 7 3 6 4 5 2 0 1 | 1 1 0 0 1 0 0 1 | 1 1 1 0 0 1 0 0 | 1 0 1 1 1 0 0 0 | 4 3 3 | 10 | 3 | 4 | 3 2 2 | 7 | 2 | 3 |
| 7 3 6 4 5 2 1 0 | 1 1 0 0 1 0 1 0 | 1 1 1 0 0 1 0 0 | 1 0 1 1 1 0 0 0 | 5 3 3 | 11 | 3 | 5 | 3 2 2 | 7 | 2 | 3 |
| 7 3 6 4 5 0 2 1 | 1 1 0 0 1 0 0 1 | 1 1 1 0 0 0 1 0 | 1 0 1 1 1 0 0 0 | 4 3 3 | 10 | 3 | 4 | 3 2 2 | 7 | 2 | 3 |
| 7 3 6 4 5 0 1 2 | 1 1 0 0 1 0 1 0 | 1 1 1 0 0 0 0 1 | 1 0 1 1 1 0 0 0 | 5 2 3 | 10 | 2 | 5 | 3 2 2 | 7 | 2 | 3 |
| 7 3 6 4 5 1 2 0 | 1 1 0 0 1 1 0 0 | 1 1 1 0 0 0 1 0 | 1 0 1 1 1 0 0 0 | 3 3 3 | 9 | 3 | 3 | 2 2 2 | 6 | 2 | 2 |
| 7 3 6 4 5 1 0 2 | 1 1 0 0 1 1 0 0 | 1 1 1 0 0 0 0 1 | 1 0 1 1 1 0 0 0 | 3 2 3 | 8 | 2 | 3 | 2 2 2 | 6 | 2 | 2 |
| 7 3 6 5 2 4 0 1 | 1 1 0 1 0 0 0 1 | 1 1 1 0 1 0 0 0 | 1 0 1 1 0 1 0 0 | 4 3 5 | 12 | 3 | 5 | 3 2 3 | 8 | 2 | 3 |
| 7 3 6 5 2 4 1 0 | 1 1 0 1 0 0 1 0 | 1 1 1 0 1 0 0 0 | 1 0 1 1 0 1 0 0 | 5 3 5 | 13 | 3 | 5 | 3 2 3 | 8 | 2 | 3 |
| 7 3 6 5 2 1 4 0 | 1 1 0 1 0 1 0 0 | 1 1 1 0 1 0 0 0 | 1 0 1 1 0 0 1 0 | 5 3 5 | 13 | 3 | 5 | 3 2 3 | 8 | 2 | 3 |
| 7 3 6 5 4 2 0 1 | 1 1 0 1 0 0 0 1 | 1 1 1 0 0 1 0 0 | 1 0 1 1 1 0 0 0 | 4 3 3 | 10 | 3 | 4 | 3 2 2 | 7 | 2 | 3 |
| 7 3 6 5 4 2 1 0 | 1 1 0 1 0 0 1 0 | 1 1 1 0 0 1 0 0 | 1 0 1 1 1 0 0 0 | 5 3 3 | 11 | 3 | 5 | 3 2 2 | 7 | 2 | 3 |
| 7 3 6 5 4 0 2 1 | 1 1 0 1 0 0 0 1 | 1 1 1 0 0 0 1 0 | 1 0 1 1 1 0 0 0 | 4 3 3 | 10 | 3 | 4 | 3 2 2 | 7 | 2 | 3 |
| 7 3 6 5 4 0 1 2 | 1 1 0 1 0 0 1 0 | 1 1 1 0 0 0 0 1 | 1 0 1 1 1 0 0 0 | 5 2 3 | 10 | 2 | 5 | 3 2 2 | 7 | 2 | 3 |
| 7 3 6 5 4 1 2 0 | 1 1 0 1 0 1 0 0 | 1 1 1 0 0 0 1 0 | 1 0 1 1 1 0 0 0 | 5 3 3 | 11 | 3 | 5 | 3 2 2 | 7 | 2 | 3 |
| 7 3 6 5 4 1 0 2 | 1 1 0 1 0 1 0 0 | 1 1 1 0 0 0 0 1 | 1 0 1 1 1 0 0 0 | 5 2 3 | 10 | 2 | 5 | 3 2 2 | 7 | 2 | 3 |
| 7 3 6 5 1 2 4 0 | 1 1 0 1 1 0 0 0 | 1 1 1 0 0 1 0 0 | 1 0 1 1 0 0 1 0 | 3 3 5 | 11 | 3 | 5 | 2 2 3 | 7 | 2 | 3 |
| 7 3 6 5 1 4 2 0 | 1 1 0 1 1 0 0 0 | 1 1 1 0 0 0 1 0 | 1 0 1 1 0 1 0 0 | 3 3 5 | 11 | 3 | 5 | 2 2 3 | 7 | 2 | 3 |
| 7 3 6 5 1 4 0 2 | 1 1 0 1 1 0 0 0 | 1 1 1 0 0 0 0 1 | 1 0 1 1 0 1 0 0 | 3 2 5 | 10 | 2 | 5 | 2 2 3 | 7 | 2 | 3 |
| 7 3 5 6 2 4 0 1 | 1 1 1 0 0 0 0 1 | 1 1 0 1 1 0 0 0 | 1 0 1 1 0 1 0 0 | 2 3 5 | 10 | 2 | 5 | 2 2 3 | 7 | 2 | 3 |
| 7 3 5 6 2 4 1 0 | 1 1 1 0 0 0 1 0 | 1 1 0 1 1 0 0 0 | 1 0 1 1 0 1 0 0 | 3 3 5 | 11 | 3 | 5 | 2 2 3 | 7 | 2 | 3 |
| 7 3 5 6 2 1 4 0 | 1 1 1 0 0 1 0 0 | 1 1 0 1 1 0 0 0 | 1 0 1 1 0 0 1 0 | 3 3 5 | 11 | 3 | 5 | 2 2 3 | 7 | 2 | 3 |
| 7 3 5 6 4 2 0 1 | 1 1 1 0 0 0 0 1 | 1 1 0 1 0 1 0 0 | 1 0 1 1 1 0 0 0 | 2 5 3 | 10 | 2 | 5 | 2 3 2 | 7 | 2 | 3 |
| 7 3 5 6 4 2 1 0 | 1 1 1 0 0 0 1 0 | 1 1 0 1 0 1 0 0 | 1 0 1 1 1 0 0 0 | 3 5 3 | 11 | 3 | 5 | 2 3 2 | 7 | 2 | 3 |
| 7 3 5 6 4 0 2 1 | 1 1 1 0 0 0 0 1 | 1 1 0 1 0 0 1 0 | 1 0 1 1 1 0 0 0 | 2 5 3 | 10 | 2 | 5 | 2 3 2 | 7 | 2 | 3 |
| 7 3 5 6 4 0 1 2 | 1 1 1 0 0 0 1 0 | 1 1 0 1 0 0 0 1 | 1 0 1 1 1 0 0 0 | 3 4 3 | 10 | 3 | 4 | 2 3 2 | 7 | 2 | 3 |
| 7 3 5 6 4 1 2 0 | 1 1 1 0 0 1 0 0 | 1 1 0 1 0 0 1 0 | 1 0 1 1 1 0 0 0 | 3 5 3 | 11 | 3 | 5 | 2 3 2 | 7 | 2 | 3 |
| 7 3 5 6 4 1 0 2 | 1 1 1 0 0 1 0 0 | 1 1 0 1 0 0 0 1 | 1 0 1 1 1 0 0 0 | 3 4 3 | 10 | 3 | 4 | 2 3 2 | 7 | 2 | 3 |
| 7 3 5 6 1 2 4 0 | 1 1 1 0 1 0 0 0 | 1 1 0 1 0 1 0 0 | 1 0 1 1 0 0 1 0 | 3 5 5 | 13 | 3 | 5 | 2 3 3 | 8 | 2 | 3 |
| 7 3 5 6 1 4 2 0 | 1 1 1 0 1 0 0 0 | 1 1 0 1 0 0 1 0 | 1 0 1 1 0 1 0 0 | 3 5 5 | 13 | 3 | 5 | 2 3 3 | 8 | 2 | 3 |
| 7 3 5 6 1 4 0 2 | 1 1 1 0 1 0 0 0 | 1 1 0 1 0 0 0 1 | 1 0 1 1 0 1 0 0 | 3 4 5 | 12 | 3 | 5 | 2 3 3 | 8 | 2 | 3 |
| 7 3 5 1 6 2 4 0 | 1 1 1 1 0 0 0 0 | 1 1 0 0 1 1 0 0 | 1 0 1 0 1 0 1 0 | 1 3 7 | 11 | 1 | 7 | 1 2 3 | 6 | 1 | 3 |
| 7 3 5 1 6 4 2 0 | 1 1 1 1 0 0 0 0 | 1 1 0 0 1 0 1 0 | 1 0 1 0 1 1 0 0 | 1 5 5 | 11 | 1 | 5 | 1 3 3 | 7 | 1 | 3 |
| 7 3 5 1 6 4 0 2 | 1 1 1 1 0 0 0 0 | 1 1 0 0 1 0 0 1 | 1 0 1 0 1 1 0 0 | 1 4 5 | 10 | 1 | 5 | 1 3 3 | 7 | 1 | 3 |
| | | | | MIN | 7 | 1 | 3 | | 5 | 1 | 2 |
| | | | | MAX | 15 | 3 | 7 | | 8 | 2 | 3 |
| | | | | Average | 11 | 2.2 | 5 | | 7 | 1.7 | 3 |

Appendix B - Evaluation of valid orderings for 4-bit MBC cells

| States Order | static comp | T | Min | Max | dynamic comp | T | Min | Max |
|---|---|---|---|---|---|---|---|---|
| 15 14 12 13 9 8 10 11 3 2 0 4 6 7 5 1 | 6 5 3 1 | 15 | 1 | 6 | 3 3 2 1 | 9 | 1 | 3 |
| 15 14 12 13 9 8 10 11 3 2 0 1 5 4 6 7 | 8 4 2 1 | 15 | 1 | 8 | 4 3 2 1 | 10 | 1 | 4 |
| 15 14 12 13 9 8 10 11 3 2 0 1 5 7 6 4 | 7 5 2 1 | 15 | 1 | 7 | 3 3 2 1 | 9 | 1 | 3 |
| 15 14 12 13 9 8 10 11 3 2 6 4 0 1 5 7 | 6 4 4 1 | 15 | 1 | 6 | 3 3 3 1 | 10 | 1 | 3 |
| 15 14 12 13 9 8 10 11 3 2 6 7 5 4 0 1 | 8 3 3 1 | 15 | 1 | 8 | 4 2 2 1 | 9 | 1 | 4 |
| 15 14 12 13 9 8 10 11 3 2 6 7 5 1 0 4 | 7 3 4 1 | 15 | 1 | 7 | 3 2 3 1 | 9 | 1 | 3 |
| 15 14 12 13 9 8 10 11 3 1 0 4 5 7 6 2 | 7 4 3 1 | 15 | 1 | 7 | 3 3 2 1 | 9 | 1 | 3 |
| 15 14 12 13 9 8 10 11 3 1 0 2 6 4 5 7 | 6 6 2 1 | 15 | 1 | 6 | 3 3 2 1 | 9 | 1 | 3 |
| 15 14 12 13 9 8 10 11 3 1 0 2 6 7 5 4 | 7 5 2 1 | 15 | 1 | 7 | 3 3 2 1 | 9 | 1 | 3 |
| 15 14 12 13 9 8 10 11 3 1 5 4 0 2 6 7 | 6 4 4 1 | 15 | 1 | 6 | 3 3 3 1 | 10 | 1 | 3 |
| 15 14 12 13 9 8 10 11 3 1 5 7 6 4 0 2 | 5 6 3 1 | 15 | 1 | 6 | 3 3 2 1 | 9 | 1 | 3 |
| 15 14 12 13 9 8 10 11 3 1 5 7 6 2 0 4 | 5 5 4 1 | 15 | 1 | 5 | 3 3 3 1 | 10 | 1 | 3 |
| 15 14 12 13 9 8 10 11 3 7 6 4 5 1 0 2 | 7 4 3 1 | 15 | 1 | 7 | 3 3 2 1 | 9 | 1 | 3 |
| 15 14 12 13 9 8 10 11 3 7 6 2 0 4 5 1 | 6 3 5 1 | 15 | 1 | 6 | 3 2 3 1 | 9 | 1 | 3 |
| 15 14 12 13 9 8 10 11 3 7 6 2 0 1 5 4 | 7 3 4 1 | 15 | 1 | 7 | 3 2 3 1 | 9 | 1 | 3 |
| 15 14 12 13 9 8 10 11 3 7 5 4 6 2 0 1 | 6 5 3 1 | 15 | 1 | 6 | 3 3 2 1 | 9 | 1 | 3 |
| 15 14 12 13 9 8 10 11 3 7 5 1 0 4 6 2 | 5 4 5 1 | 15 | 1 | 5 | 3 3 3 1 | 10 | 1 | 3 |
| 15 14 12 13 9 8 10 11 3 7 5 1 0 2 6 4 | 5 5 4 1 | 15 | 1 | 5 | 3 3 3 1 | 10 | 1 | 3 |
| 15 14 12 13 9 11 10 8 0 4 6 2 3 1 5 7 | 4 6 4 1 | 15 | 1 | 6 | 3 3 3 1 | 10 | 1 | 3 |
| 15 14 12 13 9 11 10 8 0 4 6 2 3 7 5 1 | 4 5 5 1 | 15 | 1 | 5 | 3 3 3 1 | 10 | 1 | 3 |
| 15 14 12 13 9 11 10 8 0 4 6 7 5 1 3 2 | 5 6 3 1 | 15 | 1 | 6 | 3 3 2 1 | 9 | 1 | 3 |
| 15 14 12 13 9 11 10 8 0 4 5 1 3 2 6 7 | 6 4 4 1 | 15 | 1 | 6 | 3 3 3 1 | 10 | 1 | 3 |
| 15 14 12 13 9 11 10 8 0 4 5 1 3 7 6 2 | 5 4 5 1 | 15 | 1 | 5 | 3 3 3 1 | 10 | 1 | 3 |
| 15 14 12 13 9 11 10 8 0 4 5 7 6 2 3 1 | 6 5 3 1 | 15 | 1 | 6 | 3 3 2 1 | 9 | 1 | 3 |
| 15 14 12 13 9 11 10 8 0 2 6 4 5 1 3 7 | 4 6 4 1 | 15 | 1 | 6 | 3 3 3 1 | 10 | 1 | 3 |
| 15 14 12 13 9 11 10 8 0 2 6 4 5 7 3 1 | 4 7 3 1 | 15 | 1 | 7 | 3 3 2 1 | 9 | 1 | 3 |
| 15 14 12 13 9 11 10 8 0 2 6 7 3 1 5 4 | 5 5 4 1 | 15 | 1 | 5 | 3 3 3 1 | 10 | 1 | 3 |
| 15 14 12 13 9 11 10 8 0 2 3 1 5 4 6 7 | 6 6 2 1 | 15 | 1 | 6 | 3 3 2 1 | 9 | 1 | 3 |
| 15 14 12 13 9 11 10 8 0 2 3 1 5 7 6 4 | 5 7 2 1 | 15 | 1 | 7 | 3 3 2 1 | 9 | 1 | 3 |
| 15 14 12 13 9 11 10 8 0 2 3 7 6 4 5 1 | 6 5 3 1 | 15 | 1 | 6 | 3 3 2 1 | 9 | 1 | 3 |
| 15 14 12 13 9 11 10 8 0 1 5 4 6 2 3 7 | 6 4 4 1 | 15 | 1 | 6 | 3 3 3 1 | 10 | 1 | 3 |
| 15 14 12 13 9 11 10 8 0 1 5 4 6 7 3 2 | 7 4 3 1 | 15 | 1 | 7 | 3 3 2 1 | 9 | 1 | 3 |
| 15 14 12 13 9 11 10 8 0 1 5 7 3 2 6 4 | 5 5 4 1 | 15 | 1 | 5 | 3 3 3 1 | 10 | 1 | 3 |
| 15 14 12 13 9 11 10 8 0 1 3 2 6 4 5 7 | 6 6 2 1 | 15 | 1 | 6 | 3 3 2 1 | 9 | 1 | 3 |
| 15 14 12 13 9 11 10 8 0 1 3 2 6 7 5 4 | 7 5 2 1 | 15 | 1 | 7 | 3 3 2 1 | 9 | 1 | 3 |
| 15 14 12 13 9 11 10 8 0 1 3 7 5 4 6 2 | 5 6 3 1 | 15 | 1 | 6 | 3 3 2 1 | 9 | 1 | 3 |

Appendix C - 4-bit, 6-comparisons, almost equal spread

| States Order | Static comp | T | Min | Max |
|---|---|---|---|---|
| 15 14 12 8 0 4 6 7 13 9 11 10 2 3 1 5 | 4 5 4 3 | 16 | 3 | 5 |
| 15 14 12 8 0 4 13 9 11 10 2 6 7 5 1 3 | 4 4 5 3 | 16 | 3 | 5 |
| 15 14 12 8 0 4 13 9 11 10 2 3 1 5 7 6 | 5 4 4 3 | 16 | 3 | 5 |
| 15 14 12 8 10 2 6 4 13 9 11 3 7 5 1 0 | 3 5 5 3 | 16 | 3 | 5 |
| 15 14 12 8 10 2 6 7 13 9 11 3 1 0 4 5 | 4 5 4 3 | 16 | 3 | 5 |
| 15 14 12 8 10 2 6 7 13 9 11 3 1 5 4 0 | 3 5 5 3 | 16 | 3 | 5 |
| 15 14 12 8 10 11 3 2 0 4 6 7 13 9 1 5 | 4 5 4 3 | 16 | 3 | 5 |
| 15 14 12 8 10 11 3 2 0 4 13 9 1 5 7 6 | 5 4 4 3 | 16 | 3 | 5 |
| 15 14 12 8 10 11 3 2 6 7 13 9 1 5 4 0 | 5 3 5 3 | 16 | 3 | 5 |
| 15 14 12 8 10 11 3 7 13 9 1 0 2 6 4 5 | 4 5 4 3 | 16 | 3 | 5 |
| 15 14 12 8 10 11 3 7 13 9 1 5 4 6 2 0 | 3 5 5 3 | 16 | 3 | 5 |
| 15 14 12 4 13 9 8 10 11 3 1 5 7 6 2 0 | 5 5 3 3 | 16 | 3 | 5 |
| 15 14 12 4 13 9 8 10 11 3 7 5 1 0 2 6 | 5 4 4 3 | 16 | 3 | 5 |
| 15 14 12 4 13 9 11 10 8 0 2 6 7 3 1 5 | 4 5 4 3 | 16 | 3 | 5 |
| 15 14 12 4 13 9 11 10 8 0 1 5 7 3 2 6 | 5 4 4 3 | 16 | 3 | 5 |
| 15 14 12 13 9 8 10 2 0 4 6 7 11 3 1 5 | 4 5 4 3 | 16 | 3 | 5 |
| 15 14 12 13 9 8 10 2 0 4 5 1 11 3 7 6 | 5 4 4 3 | 16 | 3 | 5 |
| 15 14 12 13 9 8 10 2 6 4 0 1 5 7 11 3 | 4 4 5 3 | 16 | 3 | 5 |
| 15 14 12 13 9 8 10 2 6 4 0 1 11 3 7 5 | 4 5 4 3 | 16 | 3 | 5 |
| 15 14 12 13 9 8 10 2 6 4 5 7 11 3 1 0 | 5 5 3 3 | 16 | 3 | 5 |
| 15 14 12 13 9 8 10 2 6 7 11 3 1 5 4 0 | 5 3 5 3 | 16 | 3 | 5 |
| 15 14 12 13 9 8 10 2 11 3 1 5 7 6 4 0 | 5 5 3 3 | 16 | 3 | 5 |
| 15 14 12 13 9 8 10 2 11 3 7 5 1 0 4 6 | 5 4 4 3 | 16 | 3 | 5 |
| 15 14 12 13 9 1 8 10 11 3 7 5 4 0 2 6 | 5 4 4 3 | 16 | 3 | 5 |
| 15 14 12 13 9 1 8 10 11 3 7 5 4 6 2 0 | 5 5 3 3 | 16 | 3 | 5 |
| 15 14 12 13 9 1 5 4 8 10 11 3 7 6 2 0 | 5 3 5 3 | 16 | 3 | 5 |
| 15 14 12 13 9 1 5 7 6 4 8 10 11 3 2 0 | 5 5 3 3 | 16 | 3 | 5 |
| 15 14 12 13 9 1 5 7 11 10 8 0 4 6 2 3 | 4 4 5 3 | 16 | 3 | 5 |
| 15 14 12 13 9 1 11 10 8 0 4 6 2 3 7 5 | 4 5 4 3 | 16 | 3 | 5 |
| 15 14 12 13 9 1 11 10 8 0 4 5 7 3 2 6 | 5 4 4 3 | 16 | 3 | 5 |
| 15 14 12 13 9 11 10 2 8 0 4 6 7 3 1 5 | 4 5 4 3 | 16 | 3 | 5 |
| 15 14 12 13 9 11 10 2 8 0 4 5 1 3 7 6 | 5 4 4 3 | 16 | 3 | 5 |
| 15 14 12 13 9 11 10 2 6 4 8 0 1 5 7 3 | 4 4 5 3 | 16 | 3 | 5 |
| 15 14 12 13 9 11 10 2 6 4 8 0 1 3 7 5 | 4 5 4 3 | 16 | 3 | 5 |
| 15 14 12 13 9 11 10 2 6 4 5 7 3 1 8 0 | 5 5 3 3 | 16 | 3 | 5 |
| 15 14 12 13 9 11 10 2 6 7 3 1 5 4 8 0 | 5 3 5 3 | 16 | 3 | 5 |
| 15 14 12 13 9 11 10 2 3 1 5 7 6 4 8 0 | 5 5 3 3 | 16 | 3 | 5 |
| 15 14 12 13 9 11 10 2 3 7 5 1 8 0 4 6 | 5 4 4 3 | 16 | 3 | 5 |
| 15 14 12 13 9 11 3 1 8 10 2 6 7 5 4 0 | 5 5 3 3 | 16 | 3 | 5 |
| 15 14 12 13 9 11 3 7 6 4 8 10 2 0 1 5 | 4 5 4 3 | 16 | 3 | 5 |
| 15 14 12 13 9 11 3 7 6 4 5 1 8 10 2 0 | 5 5 3 3 | 16 | 3 | 5 |
| 15 14 12 13 9 11 3 7 5 1 8 10 2 6 4 0 | 3 5 5 3 | 16 | 3 | 5 |
| 15 14 12 13 5 4 8 10 11 9 1 3 7 6 2 0 | 5 5 3 3 | 16 | 3 | 5 |
| 15 14 12 13 5 7 11 10 8 9 1 3 2 6 4 0 | 5 5 3 3 | 16 | 3 | 5 |
| 15 14 10 2 6 7 13 12 8 9 11 3 1 5 4 0 | 5 3 5 3 | 16 | 3 | 5 |
| 15 14 10 11 3 7 13 12 8 9 1 5 4 6 2 0 | 5 3 5 3 | 16 | 3 | 5 |
| 15 13 9 1 5 7 14 12 8 10 11 3 2 6 4 0 | 3 5 5 3 | 16 | 3 | 5 |
| 15 13 9 11 3 7 14 12 8 10 2 6 4 5 1 0 | 3 5 5 3 | 16 | 3 | 5 |
| 15 11 3 7 14 12 13 9 8 10 2 0 1 5 4 6 | 5 4 4 3 | 16 | 3 | 5 |
| 15 11 3 7 14 12 13 9 8 10 2 6 4 5 1 0 | 5 3 5 3 | 16 | 3 | 5 |
| 15 7 14 12 13 9 8 10 11 3 1 5 4 0 2 6 | 5 4 4 3 | 16 | 3 | 5 |
| 15 7 14 12 13 9 8 10 11 3 1 5 4 6 2 0 | 5 5 3 3 | 16 | 3 | 5 |
| 15 7 14 12 13 9 11 10 8 0 4 6 2 3 1 5 | 4 5 4 3 | 16 | 3 | 5 |
| 15 7 14 12 13 9 11 10 8 0 4 5 1 3 2 6 | 5 4 4 3 | 16 | 3 | 5 |

Appendix C - 4-bit, 8-comparisons, almost equal spread

| States Order | Dynamic comp | T | Min | Max |
|---|---|---|---|---|
| 15 14 12 8 0 4 6 7 13 9 11 10 2 3 1 5 | 3 3 3 2 | 11 | 2 | 3 |
| 15 14 12 8 0 4 13 9 11 10 2 6 7 5 1 3 | 3 3 3 2 | 11 | 2 | 3 |
| 15 14 12 8 0 4 13 9 11 10 2 3 1 5 7 6 | 3 3 3 2 | 11 | 2 | 3 |
| 15 14 12 8 10 2 6 4 13 9 11 3 7 5 1 0 | 2 3 3 2 | 10 | 2 | 3 |
| 15 14 12 8 10 2 6 7 13 9 11 3 1 0 4 5 | 3 3 3 2 | 11 | 2 | 3 |
| 15 14 12 8 10 2 6 7 13 9 11 3 1 5 4 0 | 2 3 3 2 | 10 | 2 | 3 |
| 15 14 12 8 10 11 3 2 0 4 6 7 13 9 1 5 | 3 3 3 2 | 11 | 2 | 3 |
| 15 14 12 8 10 11 3 2 0 4 13 9 1 5 7 6 | 3 3 3 2 | 11 | 2 | 3 |
| 15 14 12 8 10 11 3 2 6 7 13 9 1 5 4 0 | 3 2 3 2 | 10 | 2 | 3 |
| 15 14 12 8 10 11 3 7 13 9 1 0 2 6 4 5 | 3 3 3 2 | 11 | 2 | 3 |
| 15 14 12 8 10 11 3 7 13 9 1 5 4 6 2 0 | 2 3 3 2 | 10 | 2 | 3 |
| 15 14 12 4 13 9 8 10 11 3 1 5 7 6 2 0 | 3 3 2 2 | 10 | 2 | 3 |
| 15 14 12 4 13 9 8 10 11 3 7 5 1 0 2 6 | 3 3 3 2 | 11 | 2 | 3 |
| 15 14 12 4 13 9 11 10 8 0 2 6 7 3 1 5 | 3 3 3 2 | 11 | 2 | 3 |
| 15 14 12 4 13 9 11 10 8 0 1 5 7 3 2 6 | 3 3 3 2 | 11 | 2 | 3 |
| 15 14 12 13 9 8 10 2 0 4 6 7 11 3 1 5 | 3 3 3 2 | 11 | 2 | 3 |
| 15 14 12 13 9 8 10 2 0 4 5 1 11 3 7 6 | 3 3 3 2 | 11 | 2 | 3 |
| 15 14 12 13 9 8 10 2 6 4 0 1 5 7 11 3 | 3 3 3 2 | 11 | 2 | 3 |
| 15 14 12 13 9 8 10 2 6 4 0 1 11 3 7 5 | 3 3 3 2 | 11 | 2 | 3 |
| 15 14 12 13 9 8 10 2 6 4 5 7 11 3 1 0 | 3 3 2 2 | 10 | 2 | 3 |
| 15 14 12 13 9 8 10 2 6 7 11 3 1 5 4 0 | 3 2 3 2 | 10 | 2 | 3 |
| 15 14 12 13 9 8 10 2 11 3 1 5 7 6 4 0 | 3 3 2 2 | 10 | 2 | 3 |
| 15 14 12 13 9 8 10 2 11 3 7 5 1 0 4 6 | 3 3 3 2 | 11 | 2 | 3 |
| 15 14 12 13 9 1 8 10 11 3 7 5 4 0 2 6 | 3 3 3 2 | 11 | 2 | 3 |
| 15 14 12 13 9 1 8 10 11 3 7 5 4 6 2 0 | 3 3 2 2 | 10 | 2 | 3 |
| 15 14 12 13 9 1 5 4 8 10 11 3 7 6 2 0 | 3 2 3 2 | 10 | 2 | 3 |
| 15 14 12 13 9 1 5 7 6 4 8 10 11 3 2 0 | 3 3 2 2 | 10 | 2 | 3 |
| 15 14 12 13 9 1 5 7 11 10 8 0 4 6 2 3 | 3 3 3 2 | 11 | 2 | 3 |
| 15 14 12 13 9 1 11 10 8 0 4 6 2 3 7 5 | 3 3 3 2 | 11 | 2 | 3 |
| 15 14 12 13 9 1 11 10 8 0 4 5 7 3 2 6 | 3 3 3 2 | 11 | 2 | 3 |
| 15 14 12 13 9 11 10 2 8 0 4 6 7 3 1 5 | 3 3 3 2 | 11 | 2 | 3 |
| 15 14 12 13 9 11 10 2 8 0 4 5 1 3 7 6 | 3 3 3 2 | 11 | 2 | 3 |
| 15 14 12 13 9 11 10 2 8 4 6 0 1 5 7 3 | 3 3 3 2 | 11 | 2 | 3 |
| 15 14 12 13 9 11 10 2 6 4 8 0 1 3 7 5 | 3 3 3 2 | 11 | 2 | 3 |
| 15 14 12 13 9 11 10 2 8 4 5 7 3 1 6 0 | 3 3 2 2 | 10 | 2 | 3 |
| 15 14 12 13 9 11 10 2 6 7 3 1 5 4 8 0 | 3 2 3 2 | 10 | 2 | 3 |
| 15 14 12 13 9 11 10 2 3 1 5 7 6 4 8 0 | 3 3 2 2 | 10 | 2 | 3 |
| 15 14 12 13 9 11 10 2 3 7 5 1 8 0 4 6 | 3 3 3 2 | 11 | 2 | 3 |
| 15 14 12 13 9 11 3 1 8 10 2 6 7 5 4 0 | 3 3 2 2 | 10 | 2 | 3 |
| 15 14 12 13 9 11 3 7 6 4 8 10 2 0 1 5 | 3 3 3 2 | 11 | 2 | 3 |
| 15 14 12 13 9 11 3 7 6 4 5 1 8 10 2 0 | 3 3 2 2 | 10 | 2 | 3 |
| 15 14 12 13 9 11 3 7 5 1 8 10 2 6 4 0 | 2 3 3 2 | 10 | 2 | 3 |
| 15 14 12 13 5 4 8 10 11 9 1 3 7 6 2 0 | 3 3 2 2 | 10 | 2 | 3 |
| 15 14 12 13 5 7 11 10 8 9 1 3 2 6 4 0 | 3 3 2 2 | 10 | 2 | 3 |
| 15 14 10 2 6 7 13 12 8 9 11 3 1 5 4 0 | 3 2 3 2 | 10 | 2 | 3 |
| 15 14 10 11 3 7 13 12 8 9 1 5 4 6 2 0 | 3 2 3 2 | 10 | 2 | 3 |
| 15 13 9 1 5 7 14 12 8 10 11 3 2 6 4 0 | 2 3 3 2 | 10 | 2 | 3 |
| 15 13 9 11 3 7 14 12 8 10 2 6 4 5 1 0 | 2 3 3 2 | 10 | 2 | 3 |
| 15 11 3 7 14 12 13 9 8 10 2 0 1 5 4 6 | 3 3 3 2 | 11 | 2 | 3 |
| 15 11 3 7 14 12 13 9 8 10 2 6 4 5 1 0 | 3 2 3 2 | 10 | 2 | 3 |
| 15 7 14 12 13 9 8 10 11 3 1 5 4 0 2 6 | 3 3 3 2 | 11 | 2 | 3 |
| 15 7 14 12 13 9 8 10 11 3 1 5 4 6 2 0 | 3 3 2 2 | 10 | 2 | 3 |
| 15 7 14 12 13 9 11 10 8 0 4 6 2 3 1 5 | 3 3 3 2 | 11 | 2 | 3 |
| 15 7 14 12 13 9 11 10 8 0 4 5 1 3 2 6 | 3 3 3 2 | 11 | 2 | 3 |

Appendix D - 4-bit, 17 transitions, almost equal spread

| States Order | | | | | | | | | | | | | | | | Static comp | | | | T | Min | Max |
|---|---|---|---|---|---|---|---|---|---|---|---|---|---|---|---|---|---|---|---|---|---|---|
| 15 | 14 | 12 | 8 | 0 | 10 | 11 | 3 | 2 | 6 | 4 | 13 | 9 | 1 | 5 | 7 | 4 | 4 | 4 | 5 | 17 | 4 | 5 |
| 15 | 14 | 12 | 13 | 9 | 8 | 0 | 4 | 6 | 10 | 2 | 11 | 3 | 1 | 5 | 7 | 4 | 4 | 4 | 5 | 17 | 4 | 5 |
| 15 | 14 | 12 | 13 | 9 | 8 | 0 | 10 | 2 | 6 | 4 | 5 | 1 | 11 | 3 | 7 | 4 | 4 | 4 | 5 | 17 | 4 | 5 |
| 15 | 14 | 12 | 13 | 9 | 1 | 5 | 4 | 6 | 10 | 8 | 0 | 2 | 11 | 3 | 7 | 4 | 4 | 4 | 5 | 17 | 4 | 5 |
| 15 | 14 | 12 | 13 | 9 | 11 | 3 | 10 | 2 | 6 | 4 | 8 | 0 | 1 | 5 | 7 | 4 | 4 | 4 | 5 | 17 | 4 | 5 |
| 15 | 14 | 12 | 13 | 9 | 11 | 3 | 1 | 5 | 4 | 8 | 0 | 10 | 2 | 6 | 7 | 4 | 4 | 4 | 5 | 17 | 4 | 5 |
| 15 | 14 | 12 | 13 | 5 | 9 | 8 | 10 | 2 | 6 | 4 | 0 | 1 | 11 | 3 | 7 | 4 | 4 | 4 | 5 | 17 | 4 | 5 |
| 15 | 14 | 12 | 13 | 5 | 9 | 1 | 11 | 10 | 8 | 0 | 4 | 6 | 2 | 3 | 7 | 4 | 4 | 4 | 5 | 17 | 4 | 5 |
| 15 | 14 | 12 | 13 | 5 | 9 | 11 | 10 | 2 | 6 | 4 | 8 | 0 | 1 | 3 | 7 | 4 | 4 | 4 | 5 | 17 | 4 | 5 |
| 15 | 14 | 10 | 2 | 6 | 12 | 13 | 9 | 11 | 3 | 1 | 8 | 0 | 4 | 5 | 7 | 4 | 4 | 4 | 5 | 17 | 4 | 5 |
| 15 | 14 | 6 | 12 | 8 | 0 | 4 | 13 | 9 | 11 | 10 | 2 | 3 | 1 | 5 | 7 | 4 | 4 | 4 | 5 | 17 | 4 | 5 |
| 15 | 14 | 6 | 12 | 8 | 10 | 11 | 3 | 2 | 0 | 4 | 13 | 9 | 1 | 5 | 7 | 4 | 4 | 4 | 5 | 17 | 4 | 5 |
| 15 | 14 | 6 | 12 | 13 | 9 | 8 | 10 | 2 | 0 | 4 | 5 | 1 | 11 | 3 | 7 | 4 | 4 | 4 | 5 | 17 | 4 | 5 |
| 15 | 14 | 6 | 12 | 13 | 9 | 11 | 10 | 2 | 8 | 0 | 4 | 5 | 1 | 3 | 7 | 4 | 4 | 4 | 5 | 17 | 4 | 5 |

Appendix D - 4-bit, 17 transitions, almost equal spread

| States Order | Dynamic comp | T | Min | Max |
|---|---|---|---|---|
| 15 14 12 8 0 10 11 3 2 6 4 13 9 1 5 7 | 3 3 3 3 | 12 | 3 | 3 |
| 15 14 12 13 9 8 0 4 6 10 2 11 3 1 5 7 | 3 3 3 3 | 12 | 3 | 3 |
| 15 14 12 13 9 8 0 10 2 6 4 5 1 11 3 7 | 3 3 3 3 | 12 | 3 | 3 |
| 15 14 12 13 9 1 5 4 6 10 8 0 2 11 3 7 | 3 3 3 3 | 12 | 3 | 3 |
| 15 14 12 13 9 11 3 10 2 6 4 8 0 1 5 7 | 3 3 3 3 | 12 | 3 | 3 |
| 15 14 12 13 9 11 3 1 5 4 8 0 10 2 6 7 | 3 3 3 3 | 12 | 3 | 3 |
| 15 14 12 13 5 9 8 10 2 6 4 0 1 11 3 7 | 3 3 3 3 | 12 | 3 | 3 |
| 15 14 12 13 5 9 1 11 10 8 0 4 6 2 3 7 | 3 3 3 3 | 12 | 3 | 3 |
| 15 14 12 13 5 9 11 10 2 6 4 8 0 1 3 7 | 3 3 3 3 | 12 | 3 | 3 |
| 15 14 10 2 6 12 13 9 11 3 1 8 0 4 5 7 | 3 3 3 3 | 12 | 3 | 3 |
| 15 14 6 12 8 0 4 13 9 11 10 2 3 1 5 7 | 3 3 3 3 | 12 | 3 | 3 |
| 15 14 6 12 8 10 11 3 2 0 4 13 9 1 5 7 | 3 3 3 3 | 12 | 3 | 3 |
| 15 14 6 12 13 9 8 10 2 0 4 5 1 11 3 7 | 3 3 3 3 | 12 | 3 | 3 |
| 15 14 6 12 13 9 11 10 2 8 0 4 5 1 3 7 | 3 3 3 3 | 12 | 3 | 3 |

Appendix C - 4-bit, 6-comparisons, almost equal spread

| States Order | Dynamic comp | T | Min | Max |
|---|---|---|---|---|
| 15 14 12 8  0  4  6  7 13 9 11 10 2  3  1 5 | 3 3 3 2 | 11 | 2 | 3 |
| 15 14 12 8  0  4 13 9 11 10 2  6  7  5  1 3 | 3 3 3 2 | 11 | 2 | 3 |
| 15 14 12 8  0  4 13 9 11 10 2  3  1  5  7 6 | 3 3 3 2 | 11 | 2 | 3 |
| 15 14 12 8 10 2  6  4 13 9 11 3  7  5  1 0 | 2 3 3 2 | 10 | 2 | 3 |
| 15 14 12 8 10 2  6  7 13 9 11 3  1  0  4 5 | 3 3 3 2 | 11 | 2 | 3 |
| 15 14 12 8 10 2  6  7 13 9 11 3  1  5  4 0 | 2 3 3 2 | 10 | 2 | 3 |
| 15 14 12 8 10 11 3  2  0  4  6  7 13 9  1 5 | 3 3 3 2 | 11 | 2 | 3 |
| 15 14 12 8 10 11 3  2  0  4 13 9  1  5  7 6 | 3 3 3 2 | 11 | 2 | 3 |
| 15 14 12 8 10 11 3  2  6  7 13 9  1  5  4 0 | 3 2 3 2 | 10 | 2 | 3 |
| 15 14 12 8 10 11 3  7 13 9  1  0  2  6  4 5 | 3 3 3 2 | 11 | 2 | 3 |
| 15 14 12 8 10 11 3  7 13 9  1  5  4  6  2 0 | 2 3 3 2 | 10 | 2 | 3 |
| 15 14 12 4 13 9  8 10 11 3  1  5  7  6  2 0 | 3 3 2 2 | 10 | 2 | 3 |
| 15 14 12 4 13 9  8 10 11 3  7  5  1  0  2 6 | 3 3 3 2 | 11 | 2 | 3 |
| 15 14 12 4 13 9 11 10 8  0  2  6  7  3  1 5 | 3 3 3 2 | 11 | 2 | 3 |
| 15 14 12 4 13 9 11 10 8  0  1  5  7  3  2 6 | 3 3 3 2 | 11 | 2 | 3 |
| 15 14 12 13 9  8 10 2  0  4  6  7 11 3  1 5 | 3 3 3 2 | 11 | 2 | 3 |
| 15 14 12 13 9  8 10 2  0  4  5  1 11 3  7 6 | 3 3 3 2 | 11 | 2 | 3 |
| 15 14 12 13 9  8 10 2  6  4  0  1  5  7 11 3 | 3 3 3 2 | 11 | 2 | 3 |
| 15 14 12 13 9  8 10 2  6  4  0  1 11 3  7 5 | 3 3 3 2 | 11 | 2 | 3 |
| 15 14 12 13 9  8 10 2  6  4  5  7 11 3  1 0 | 3 3 2 2 | 10 | 2 | 3 |
| 15 14 12 13 9  8 10 2  6  7 11 3  1  5  4 0 | 3 2 3 2 | 10 | 2 | 3 |
| 15 14 12 13 9  8 10 2 11 3  1  5  7  6  4 0 | 3 3 2 2 | 10 | 2 | 3 |
| 15 14 12 13 9  8 10 2 11 3  7  5  1  0  4 6 | 3 3 3 2 | 11 | 2 | 3 |
| 15 14 12 13 9  1  8 10 11 3  7  5  4  0  2 6 | 3 3 3 2 | 11 | 2 | 3 |
| 15 14 12 13 9  1  8 10 11 3  7  5  4  6  2 0 | 3 3 2 2 | 10 | 2 | 3 |
| 15 14 12 13 9  1  5  4  8 10 11 3  7  6  2 0 | 3 2 3 2 | 10 | 2 | 3 |
| 15 14 12 13 9  1  5  7  6  4  8 10 11 3  2 0 | 3 3 2 2 | 10 | 2 | 3 |
| 15 14 12 13 9  1  5  7 11 10 8  0  4  6  2 3 | 3 3 3 2 | 11 | 2 | 3 |
| 15 14 12 13 9  1 11 10 8  0  4  6  2  3  7 5 | 3 3 3 2 | 11 | 2 | 3 |
| 15 14 12 13 9  1 11 10 8  0  4  5  7  3  2 6 | 3 3 3 2 | 11 | 2 | 3 |
| 15 14 12 13 9 11 10 2  8  0  4  6  7  3  1 5 | 3 3 3 2 | 11 | 2 | 3 |
| 15 14 12 13 9 11 10 2  8  0  4  6  1  3  7 6 | 3 3 3 2 | 11 | 2 | 3 |
| 15 14 12 13 9 11 10 2  6  4  8  0  1  5  7 3 | 3 3 3 2 | 11 | 2 | 3 |
| 15 14 12 13 9 11 10 2  6  4  8  0  1  3  7 5 | 3 3 3 2 | 11 | 2 | 3 |
| 15 14 12 13 9 11 10 2  6  4  5  7  3  1  8 0 | 3 3 2 2 | 10 | 2 | 3 |
| 15 14 12 13 9 11 10 2  6  7  3  1  5  4  8 0 | 3 2 3 2 | 10 | 2 | 3 |
| 15 14 12 13 9 11 10 2  3  1  5  7  6  4  8 0 | 3 3 2 2 | 10 | 2 | 3 |
| 15 14 12 13 9 11 10 2  3  7  5  1  8  0  4 6 | 3 3 3 2 | 11 | 2 | 3 |
| 15 14 12 13 9 11 3  1  8 10 2  6  7  5  4 0 | 3 3 2 2 | 10 | 2 | 3 |
| 15 14 12 13 9 11 3  7  6  4  8 10 2  0  1 5 | 3 3 3 2 | 11 | 2 | 3 |
| 15 14 12 13 9 11 3  7  6  4  5  1  8 10 2 0 | 3 3 2 2 | 10 | 2 | 3 |
| 15 14 12 13 9 11 3  7  5  1  8 10 2  6  4 0 | 2 3 3 2 | 10 | 2 | 3 |
| 15 14 12 13 5  4  8 10 11 9  1  3  7  6  2 0 | 3 3 2 2 | 10 | 2 | 3 |
| 15 14 12 13 5  7 11 10 8  9  1  3  2  6  4 0 | 3 3 2 2 | 10 | 2 | 3 |
| 15 14 10 2  6  7 13 12 8  9 11 3  1  5  4 0 | 3 2 3 2 | 10 | 2 | 3 |
| 15 14 10 11 3  7 13 12 8  9  1  5  4  6  2 0 | 3 2 3 2 | 10 | 2 | 3 |
| 15 13 9  1  5  7 14 12 8 10 11 3  2  6  4 0 | 2 3 3 2 | 10 | 2 | 3 |
| 15 13 9 11 3  7 14 12 8 10 2  6  4  5  1 0 | 2 3 3 2 | 10 | 2 | 3 |
| 15 11 3  7 14 12 13 9  8 10 2  0  1  5  4 6 | 3 3 3 2 | 11 | 2 | 3 |
| 15 11 3  7 14 12 13 9  8 10 2  6  4  5  1 0 | 3 2 3 2 | 10 | 2 | 3 |
| 15 7 14 12 13 9  8 10 11 3  1  5  4  0  2 6 | 3 3 3 2 | 11 | 2 | 3 |
| 15 7 14 12 13 9  8 10 11 3  1  5  4  6  2 0 | 3 3 2 2 | 10 | 2 | 3 |
| 15 7 14 12 13 9 11 10 8  0  4  6  2  3  1 5 | 3 3 3 2 | 11 | 2 | 3 |
| 15 7 14 12 13 9 11 10 8  0  4  5  1  3  2 6 | 3 3 3 2 | 11 | 2 | 3 |

Appendix D - 4-bit, 17 transitions, almost equal spread

| States Order | Static comp | T | Min | Max |
|---|---|---|---|---|
| 15 14 12 8 0 10 11 3 2 6 4 13 9 1 5 7 | 4 4 4 5 | 17 | 4 | 5 |
| 15 14 12 13 9 8 0 4 6 10 2 11 3 1 5 7 | 4 4 4 5 | 17 | 4 | 5 |
| 15 14 12 13 9 8 0 10 2 6 4 5 1 11 3 7 | 4 4 4 5 | 17 | 4 | 5 |
| 15 14 12 13 9 1 5 4 6 10 8 0 2 11 3 7 | 4 4 4 5 | 17 | 4 | 5 |
| 15 14 12 13 9 11 3 10 2 6 4 8 0 1 5 7 | 4 4 4 5 | 17 | 4 | 5 |
| 15 14 12 13 9 11 3 1 5 4 8 0 10 2 6 7 | 4 4 4 5 | 17 | 4 | 5 |
| 15 14 12 13 5 9 8 10 2 6 4 0 1 11 3 7 | 4 4 4 5 | 17 | 4 | 5 |
| 15 14 12 13 5 9 1 11 10 8 0 4 6 2 3 7 | 4 4 4 5 | 17 | 4 | 5 |
| 15 14 12 13 5 9 11 10 2 6 4 8 0 1 3 7 | 4 4 4 5 | 17 | 4 | 5 |
| 15 14 10 2 6 12 13 9 11 3 1 8 0 4 5 7 | 4 4 4 5 | 17 | 4 | 5 |
| 15 14 6 12 8 0 4 13 9 11 10 2 3 1 5 7 | 4 4 4 5 | 17 | 4 | 5 |
| 15 14 6 12 8 10 11 3 2 0 4 13 9 1 5 7 | 4 4 4 5 | 17 | 4 | 5 |
| 15 14 6 12 13 9 8 10 2 0 4 5 1 11 3 7 | 4 4 4 5 | 17 | 4 | 5 |
| 15 14 6 12 13 9 11 10 2 8 0 4 5 1 3 7 | 4 4 4 5 | 17 | 4 | 5 |